United States Patent
Degner et al.

(10) Patent No.: US 12,429,920 B2
(45) Date of Patent: Sep. 30, 2025

(54) RECONFIGURABLE STAND ECOSYSTEM

(71) Applicant: Apple Inc., Cupertino, CA (US)

(72) Inventors: Brett W. Degner, Menlo Park, CA (US); Kevin M. Robinson, Sunnyvale, CA (US); Christoph M. Pistor, Santa Cruz, CA (US); Mehrdad Hooshmand, Cupertino, CA (US); Simon J. Trivett, Waterloo (CA); Bradley J. Hamel, Portola Valley, CA (US); Kristopher P. Laurent, Portola Valley, CA (US); David H. Narajowski, San Jose, CA (US); Stephen V Jayanathan, Seattle, WA (US); Laura M. DeForest, San Mateo, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 18/434,719

(22) Filed: Feb. 6, 2024

(65) Prior Publication Data

US 2024/0329691 A1 Oct. 3, 2024

Related U.S. Application Data

(63) Continuation of application No. 17/653,859, filed on Mar. 7, 2022, now Pat. No. 11,934,230.
(Continued)

(51) Int. Cl.
*G06F 1/16* (2006.01)
*F16M 11/10* (2006.01)
(Continued)

(52) U.S. Cl.
CPC ........... *G06F 1/1654* (2013.01); *F16M 11/10* (2013.01); *F16M 11/2021* (2013.01);
(Continued)

(58) Field of Classification Search
None
See application file for complete search history.

(56) References Cited

U.S. PATENT DOCUMENTS

| 6,532,628 B2 | 3/2003 | Kim |
| 7,188,812 B2 | 3/2007 | Wang |

(Continued)

FOREIGN PATENT DOCUMENTS

| CN | 1693957 A | 11/2005 |
| CN | 101047043 A | 10/2007 |

(Continued)

OTHER PUBLICATIONS

European Search Report for EP Application No. 22166861.9, mailed Sep. 19, 2022 (7 pp.).
(Continued)

*Primary Examiner* — Jerry Wu
(74) *Attorney, Agent, or Firm* — Dorsey & Whitney LLP

(57) ABSTRACT

Support systems and stands for electronic devices include tilt hinges, lift arms, and their component parts. Some tilt hinges include assemblies for guiding and retaining bars or protrusions into preferred positioning within receiver openings to unify the parts, particularly as they move, and to reduce wobble or slop in the joints. Lift arms provide simplified and low-cost guidance and counterbalance mechanisms for controlling movement of the electronic device relative to the base of a stand. In some cases, the lift arms have sheaths to help protect or cover mechanisms while allowing additional space for the mechanisms within the lift arm. Other interconnection systems hide and protect a connector interface between the stand and the electronic device within a housing until unlocked and the connector is moved into an exposed position. These systems improve
(Continued)

efficiency, comfort, ergonomics, accessibility, and user satisfaction of the electronic devices and their supports.

9 Claims, 29 Drawing Sheets

Related U.S. Application Data

(60) Provisional application No. 63/172,413, filed on Apr. 8, 2021.

(51) Int. Cl.
*F16M 11/20* (2006.01)
*H05K 5/02* (2006.01)

(52) U.S. Cl.
CPC ........... *G06F 1/166* (2013.01); *H05K 5/0226* (2013.01); *F16M 2200/024* (2013.01); *F16M 2200/041* (2013.01); *G06F 1/1607* (2013.01); *G06F 1/1681* (2013.01); *H05K 5/0221* (2013.01)

(56) References Cited

U.S. PATENT DOCUMENTS

| | | | |
|---|---|---|---|
| 7,380,759 B1 | 6/2008 | Whiteside et al. | |
| 7,766,297 B2 | 8/2010 | Chih | |
| 7,856,695 B2 | 12/2010 | Tang et al. | |
| 8,556,218 B2 | 10/2013 | Giersiepen et al. | |
| 9,357,846 B2 | 6/2016 | Hung | |
| 9,371,955 B2 | 6/2016 | Fu et al. | |
| 9,657,889 B1 | 5/2017 | Chumakov | |
| 9,743,541 B1 | 8/2017 | Chang | |
| 9,933,111 B1 | 4/2018 | Huntley et al. | |
| 10,480,709 B1 | 11/2019 | Chumakov | |
| 10,754,391 B2 | 8/2020 | Park et al. | |
| 10,851,938 B2 * | 12/2020 | Glickstein | F16M 13/02 |
| 11,384,893 B2 | 7/2022 | Trudnak et al. | |
| 11,788,671 B2 * | 10/2023 | Huang | F16M 11/06 |
| | | | 248/161 |
| 2001/0010779 A1 | 8/2001 | Pfister | |
| 2007/0001076 A1 | 1/2007 | Asamarai et al. | |
| 2007/0153459 A1 | 7/2007 | Wohlford et al. | |
| 2007/0278361 A1 | 12/2007 | May et al. | |
| 2009/0184449 A1 | 7/2009 | Drees | |
| 2010/0012812 A1 | 1/2010 | Hu | |
| 2010/0208418 A1 | 8/2010 | Russell et al. | |
| 2010/0299876 A1 | 12/2010 | Kang | |
| 2013/0021723 A1 | 1/2013 | Harper et al. | |
| 2013/0271939 A1 | 10/2013 | Cheline et al. | |
| 2013/0284871 A1 | 10/2013 | Huang | |
| 2015/0362962 A1 | 12/2015 | Lee et al. | |
| 2016/0003270 A1 | 1/2016 | Franklin | |
| 2016/0120720 A1 | 5/2016 | Hirsch | |
| 2017/0299838 A1 | 10/2017 | Yi et al. | |
| 2017/0300083 A1 | 10/2017 | Park et al. | |
| 2018/0356031 A1 | 12/2018 | Zebarjad et al. | |
| 2020/0081483 A1 | 3/2020 | Laurent et al. | |
| 2020/0378481 A1 | 12/2020 | Laurent et al. | |
| 2020/0378781 A1 | 12/2020 | Kantarjiev et al. | |
| 2022/0325845 A1 | 10/2022 | Degner et al. | |
| 2022/0325848 A1 | 10/2022 | Degner et al. | |
| 2022/0326731 A1 | 10/2022 | Degner et al. | |

FOREIGN PATENT DOCUMENTS

| | | |
|---|---|---|
| CN | 101965546 A | 2/2011 |
| CN | 102282408 A | 12/2011 |
| CN | 102656399 A | 9/2012 |
| CN | 103003614 A | 3/2013 |
| CN | 203248956 U | 10/2013 |
| CN | 103470929 A | 12/2013 |
| CN | 105531637 A | 4/2016 |
| CN | 105812626 A | 7/2016 |
| CN | 106170631 A | 11/2016 |
| CN | 206245490 U | 6/2017 |
| CN | 207648424 U | 7/2018 |
| CN | 109074130 A | 12/2018 |
| CN | 110167394 A | 8/2019 |
| CN | 210153448 U | 3/2020 |
| CN | 210165128 U | 3/2020 |
| CN | 210266495 U | 4/2020 |
| CN | 111278372 A | 6/2020 |
| CN | 112013210 A | 12/2020 |
| CN | 112013235 A | 12/2020 |
| CN | 112041608 A | 12/2020 |
| CN | 112088112 A | 12/2020 |
| DE | 4318659 A1 | 12/1994 |
| DE | 102005017487 A1 | 10/2006 |
| EP | 0335206 B1 | 1/1994 |
| EP | 2660502 A2 | 11/2013 |
| GB | 201900397 | 2/2019 |
| JP | S62138993 U | 9/1987 |
| JP | H024314 A | 1/1990 |
| JP | 2012510595 A | 5/2012 |
| KR | 20040065556 A | 7/2004 |
| KR | 20050017247 A | 2/2005 |
| KR | 20110067078 A | 6/2011 |
| WO | 2020167114 A1 | 8/2020 |

OTHER PUBLICATIONS

European Search Report for EP Application No. 22166863.5, mailed Oct. 12, 2022 (8pp.).
European Search Report for EP Application No. 22166865.0, mailed Oct. 19, 2022 (7 pp.).

* cited by examiner

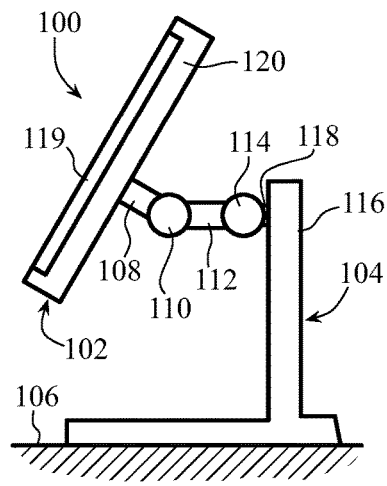
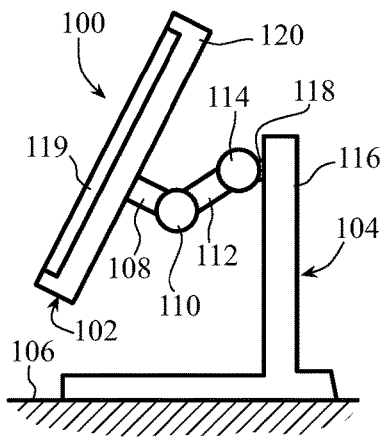
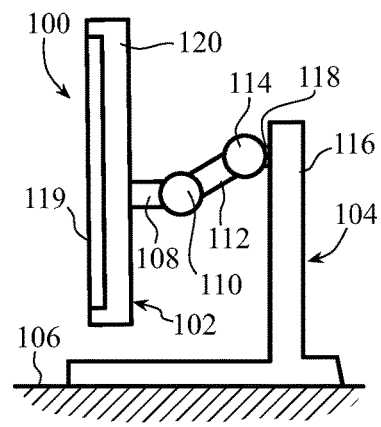
FIG. 1A     FIG. 1B     FIG. 1C
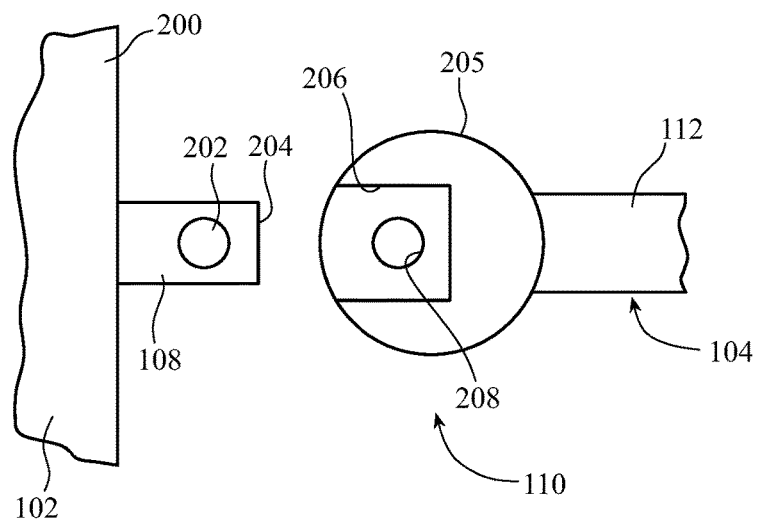
FIG. 2

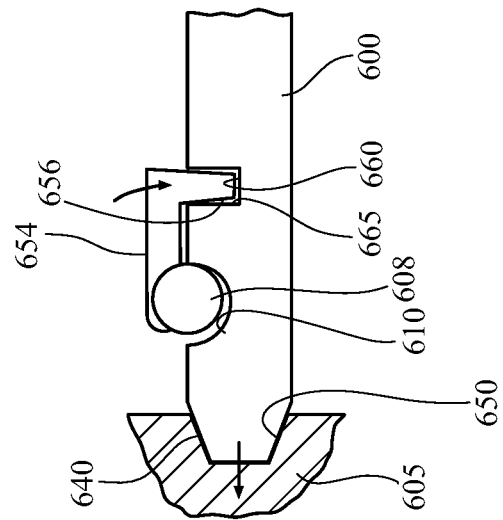
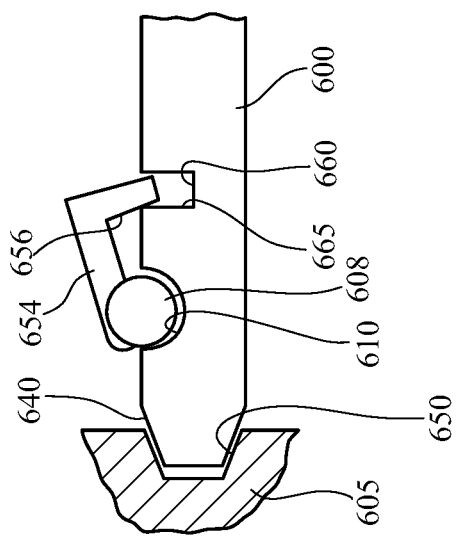
FIG. 6A
FIG. 6B

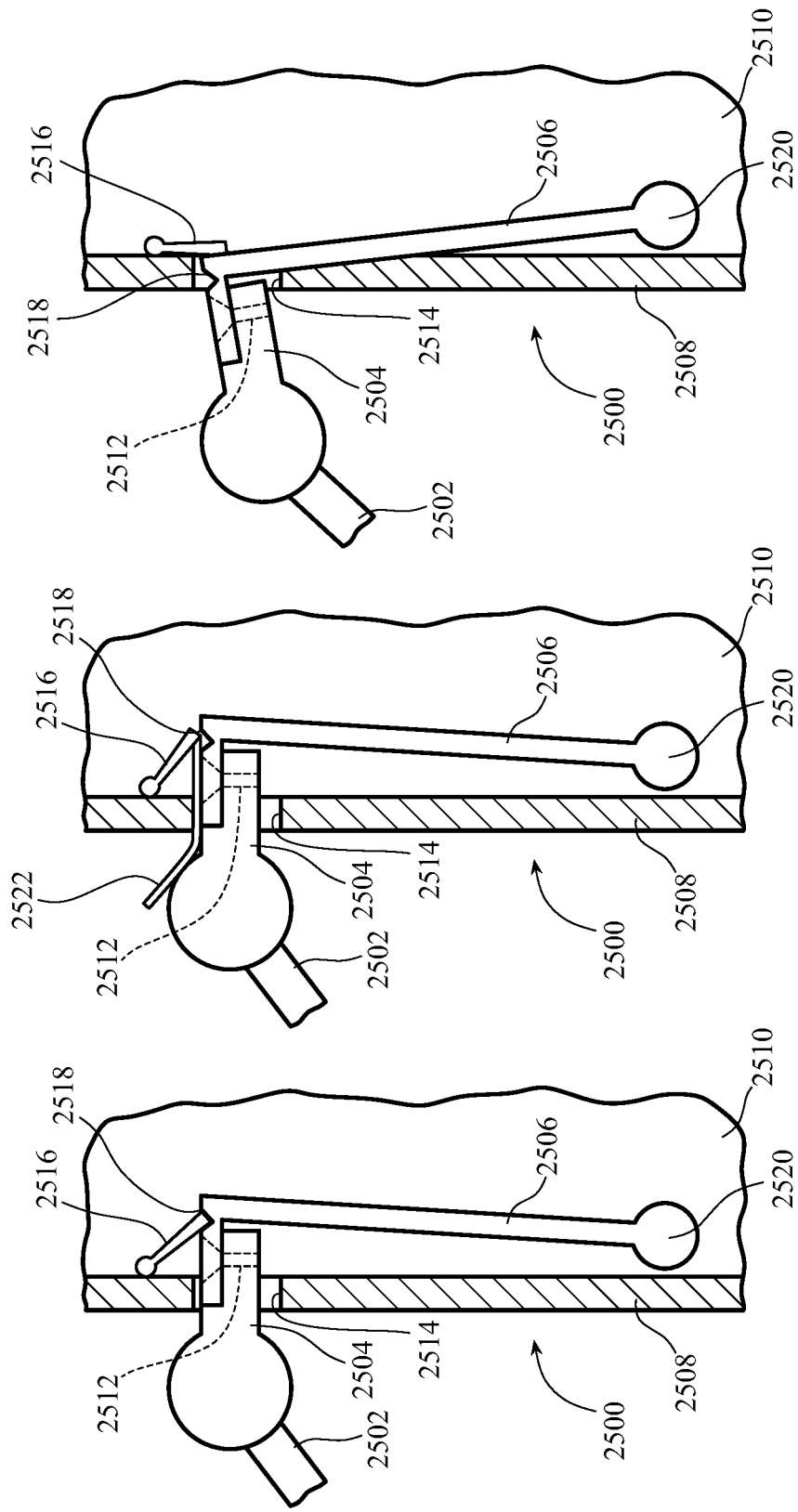

RECONFIGURABLE STAND ECOSYSTEM

CROSS-REFERENCE TO RELATED APPLICATION(S)

The present application is a continuation of U.S. patent application Ser. No. 17/653,859, filed 7 Mar. 2022 and entitled "RECONFIGURABLE STAND ECOSYSTEM," which claims priority to U.S. Provisional Patent Application No. 63/172,413, filed 8 Apr. 2021, entitled "RECONFIGURABLE STAND ECOSYSTEM," the contents of which are incorporated herein by reference in their entireties for all purposes.

FIELD

The described embodiments relate generally to stands, arms, and other supports for electronic devices. More particularly, the present embodiments relate to connection assemblies for adjusting the tilt, height, and attachment status of computing devices and their supports.

BACKGROUND

Computing device makers are constantly seeking out improvements to the user's experience with the assembly, portability, ergonomics, aesthetics, and durability of their devices. For some devices, such as a computer monitor, display screen, touch screen, or "all-in-one" computer (i.e., a computer monitor that also contains a processor and other computing components), the rear-facing side of the housing of the device can be covered with unsightly and distracting cords, hinges, markings, ports, labels, fasteners, and other components. Although a device maker may find ways to reduce or eliminate those undesirable features, the redesigned device usually lacks versatility, such as only being compatible with one stand, and, in many cases, not being able to be removed from the stand at all.

Additionally, users often prefer the stands of their devices to have a quality, solid, and sturdy feel whether the stand is adjusted, tilted, lifted, moved, or replaced. Providing these features frequently comes at a high cost due to high part complexity, difficulty to manufacture or transport, expensive custom parts and materials, and more.

SUMMARY

Aspects of the present disclosure relate to connectors and connector systems for an electronic device stand. In an embodiment of the disclosure, the connector comprises a first shaft attachable to an electronic device, with the first shaft having a first set of guide surfaces, a second shaft attachable to a support bar, with the second shaft having a second set of guide surfaces, and a fastener inserted into an opening formed in at least one of the first and second shafts. The first set of guide surfaces can be driven into the second set of guide surfaces in response to rotation of the fastener in the opening, wherein contact between the first set of guide surfaces and the second set of guide surfaces secures the first shaft to the second shaft in at least five degrees of freedom.

In some embodiments, the fastener comprises a head portion, a shank, and a threaded portion, wherein the shank has an increased diameter portion relative to the threaded portion, wherein the threaded portion engages the first shaft, wherein the increased diameter portion engages the second shaft, wherein guide surfaces of the first set of guide surfaces are non-orthogonally angled relative to each other, and wherein guide surfaces of the second set of guide surfaces are non-orthogonally angled relative to each other and are positioned in an aperture in the second shaft.

In some embodiments, contact between the first set of guide surfaces and the second set of guide surfaces can secure the first shaft to the second shaft in six degrees of freedom. The opening can comprise a first surface positioned at a non-orthogonal angle relative to an axis of rotation of the fastener, wherein movement of the fastener parallel to the axis of rotation moves the first surface in a direction substantially perpendicular to the axis of rotation.

In some embodiments, the first shaft and the second shaft can form a pivotable joint having a pivot axis coaxial with a central longitudinal axis of the fastener. The fastener can comprise a fastener shoulder contacting an opening shoulder in the opening and preventing movement of the first shaft relative to the second shaft.

Another aspect of the disclosure relates to a connection system to link an electronic device to a support device, wherein the system comprises an electronic device including a housing, a display screen positioned in the housing, and a first connector extending from the housing, the first connector having a first pair of tapered surfaces. The system also comprises a support device including an arm structure and a second connector attachable to the first connector of the electronic device, with the second connector having a second pair of tapered surfaces and the first connector and the second connector forming a pivotable arm. The system can also include a fastener contacting the first and second connectors, wherein in response to installation of the fastener to the first and second connectors, the first pair of tapered surfaces can be driven into contact with the second pair of tapered surfaces.

In some embodiments, the first connector can comprise a first connector axis positioned between the first pair of tapered surfaces, and the second connector can comprise a second connector axis positioned between the second pair of tapered surfaces. In response to installation of the fastener to the first and second connectors, the first connector axis can be aligned with the second connector axis. In some embodiments, the first pair of tapered surfaces expands into contact with the second pair of tapered surfaces in response to installation of the fastener or the second pair of tapered surfaces expands into contact with the first pair of tapered surfaces in response to installation of the fastener.

The fastener can further comprise a longitudinal axis and a driving surface, with the driving surface being configured to engage a sloped surface of the first connector or the second connector and with the sloped surface being angled relative to the longitudinal axis of the fastener. In some embodiments, rotation of the fastener about an axis of rotation is configured to drive the first and second pairs of tapered surfaces into contact with each other. The rotation of the fastener about an axis of rotation can drive the first or second connector in a direction perpendicular to the axis of rotation. The fastener can also comprise a cam surface configured to move into contact with the first or second connector as the fastener is installed.

Yet another aspect of the disclosure relates to a support for an electronic device, wherein the support comprises an arm structure, a device attachment structure joined to or connectable to an electronic device and having a threaded opening, a joint including a first structure anchored to the arm structure and a second structure anchored to the device attachment structure, with the first structure being rotatable relative to the second structure about an axis of rotation, and a fastener having a shoulder portion engaging the second structure and a threaded portion engaging the threaded opening of the device attachment structure and holding the second structure in contact with at least two spaced apart surfaces of the device attachment structure.

In some embodiments, a rounded surface of the second structure contacts the at least two spaced apart surfaces of the first structure. The at least two spaced apart surfaces of the first structure can be positioned within an opening in the first structure. The shoulder portion can comprise a first shoulder face contacting an opposing shoulder face of the first structure. The joint can comprise an energy storage device that has a central axis coaxial with the axis of rotation of the joint. The fastener can comprise a central axis coaxial with the axis of rotation of the joint. An outer surface of the second structure can be movable between a contacting position and a separated position relative to an inner surface of the first structure in response to rotation of the device attachment structure about the axis of rotation of the joint.

Yet another aspect of the disclosure relates to a support stand for an electronic device. The support stand can comprise an arm assembly including: a device attachment structure having a first attachment point and a second attachment point; a support structure having a third attachment point and a fourth attachment point; a first arm pivotally connected to the first attachment point and the third attachment point; and a second arm pivotally connected to the second attachment point and the fourth attachment point. The support stand can also include a counterbalance mechanism including: a spring having a first end and a second end; a retainer pivotally connected to the arm assembly at a first pivot point and engaging the first end of the spring; and a rod connecting the second end of the spring to the arm assembly at a second pivot point, with the first pivot point being spaced apart from the second pivot point. Rotation of the arm assembly about the third and fourth attachment points in a first rotational direction can store energy in the spring via movement of the rod relative to the retainer.

In some embodiments, the first, second, third, and fourth attachment points form a parallelogram. The arm assembly can further comprise a retainer bar attached to the first arm and to the second arm, with the first pivot point being positioned on the retainer bar. The retainer can comprise a protrusion or ledge engaging the first end of the spring. The rod can be non-parallel to at least the first arm. The rod can rotate at a different angular velocity than the first arm in response to rotation of the first arm about the third attachment point. An angle between a longitudinal axis of the first arm and a longitudinal axis of the rod can decrease in response to rotation of the first arm about the third attachment point.

Another aspect of the disclosure relates to an arm for a support stand. The arm can comprise a housing having a hollow interior and an end opening aligned with a longitudinal axis of the housing, with the hollow interior having an internal surface; and a device connector assembly including: a sheath positioned at least partially within the hollow interior, covering the end opening, and having an end portion contacting the internal surface; and a device connector extending through the sheath and protruding from the end opening of the housing, with the device connector being rotatable relative to the housing between a first rotated position and a second rotated position. The end portion of the sheath can remain in contact with the internal surface as the device connector rotates between the first and second rotated positions.

The sheath can be configured to apply radially-outward-directed pressure against the internal surface. The end portion of the sheath can slide along the internal surface parallel to the longitudinal axis of the housing as the device connector rotates. The end portion can be concave. The end portion of the sheath can be configured to apply outward pressure to the internal surface. The sheath can be resiliently flexible. The housing can include a second end opening, and the arm can further comprise: a second sheath positioned at least partially within the hollow interior, covering the second end opening, and having a second end portion contacting the internal surface; and a stand connector extending through the second sheath and being rotatable relative to the housing between a first rotated position and a second rotated position.

Yet another aspect of the disclosure relates to a lift system, comprising: a device attachment structure; a support structure; a housing pivotally connected to the device attachment structure at a first pivot point and connected to the support structure at a second pivot point; and a belt engaging the device attachment structure and the support structure, wherein the device attachment structure rotates relative to the housing in response to rotation of the housing relative to the support structure due to tension in the belt.

In some embodiments, a tilt joint can be positioned on the device attachment structure. The housing can include a least one protrusion configured to apply an inward-directed force to the belt. The belt can comprise a first set of engagement features engaging a second set of engagement features on at least one of the device attachment structure and the support structure. Also, with the housing in a first position relative to the device attachment structure, the belt can be under tension at a first point on the device attachment structure, and with the housing in a second position relative to the device attachment structure, the belt can be under tension at a second point on the device attachment structure, with the first point and the second point being offset from each other. The belt can be prevented from sliding against the device attachment structure and the support structure.

Another aspect of the disclosure relates to a connection assembly for joining an electronic device to a support structure, wherein the connection assembly comprises an electronic device including a housing, a latch positioned within the housing, and an adjustment mechanism to move the latch relative to the housing between a first position and a second position, with the housing including an opening, and a support stand including a protrusion, with the protrusion including a longitudinal axis and a lock surface oriented non-orthogonally relative to the longitudinal axis. With the latch in the first position, the protrusion can be insertable into the housing to a depth exceeding a portion of the latch, and with the latch in the second position, the protrusion can be locked in place relative to the housing by engagement of the latch against the lock surface. The protrusion can also be drawn into the opening by engagement between the latch and the lock surface in response to movement of the latch from the first position to the second position.

In some embodiments, the protrusion further comprises a tapered end portion, wherein the tapered end portion is drawn into a tapered opening of the electronic device in response to movement of the latch from the first position to the second position. The latch can translate within the housing between the first and second positions. The adjustment mechanism can be rotatable to translate the latch within the housing. The latch can rotate within the housing between the first and second positions. The adjustment mechanism can include a lever accessible from an exterior of the housing to adjust the position of the latch or a threaded shaft configured to translate the latch between the first and second positions. The latch further can further comprise an engagement surface oriented substantially parallel to the lock surface, wherein the engagement surface engages the lock surface when latch is in the second position. The latch can further comprise an ejection surface oriented non-orthogonally relative to the longitudinal axis of the protrusion, wherein the protrusion is pushed out of the opening by engagement between the ejection surface and the protrusion in response to movement of the latch from the second position toward or beyond the first position relative to the second position. In some embodiments, the protrusion comprises an aperture extending through the protrusion substantially perpendicular to the longitudinal axis, wherein the lock surface is positioned within the aperture.

Still another aspect of the disclosure relates to a connection assembly for joining an electronic device to a support structure. The connection assembly can comprise an electronic device including an enclosure, a bar rotatably connected to the enclosure, and a lock pivotable relative to the enclosure and relative to the bar, with the enclosure having an opening and with the bar having a lock recess. The assembly can also include a support structure having a shaft insertable into the opening and attachable to the bar at an attachment interface, wherein with the lock positioned in the lock recess of the bar, the bar is prevented from pivoting relative to the enclosure and wherein with the lock removed from the lock recess of the bar, the bar is pivotable to a position exposing the attachment interface through the opening of the enclosure.

In some embodiments, the shaft is reversibly removable from the bar when the bar is in the position exposing the attachment interface through the opening of the enclosure. The attachment interface can comprise a fastener joining the shaft to the bar, wherein the fastener is removable in response to exposing the attachment interface through the opening of the enclosure. A gap may be formed between the opening of the enclosure and the shaft or bar, wherein the lock is movable in response to a probe being inserted into the gap. The lock can be configured to automatically lock the bar upon pivoting the attachment interface into the enclosure relative to the opening. A first axis of rotation of the bar and a second axis of rotation of the lock can be parallel to each other.

Another aspect of the disclosure relates to a device interconnection system comprising: a bar connectable to an electronic device; a stand structure including an arm block, wherein the bar is rotatable about an axis of rotation relative to the arm block; a sleeve; and a biasing member having a first end affixed to the sleeve and having a second end affixed to the arm block. The sleeve can be adjustable between a first configuration, wherein the sleeve is rotatable about the axis of rotation relative to the bar, and a second configuration, wherein rotation of the sleeve about the axis of rotation is fixed relative to the bar.

In some embodiments, the sleeve can be adjustable between the first configuration and the second configuration by adjustment of a fastener. The first end can be made incapable of slipping relative to the sleeve, and the second end can be made incapable of slipping relative to the arm block. A block portion can be connected to the bar and can be rotatable into contact with a stop surface of the arm block configured to limit rotation of the block portion about the axis of rotation.

BRIEF DESCRIPTION OF THE DRAWINGS

The disclosure will be readily understood by the following detailed description in conjunction with the accompanying drawings, wherein like reference numerals designate like structural elements, and in which:

FIGS. 1A, 1B, and 1C show side views of an electronic device and support system in three different pivoted configurations.

FIG. 2 shows a partial exploded side view of an interface between the electronic device and the support system.

FIG. 6A shows a partial side view of another interface between an electronic device and a support system.

FIG. 6B shows a partial side view of the interface of FIG. 6A in a second configuration.

FIG. 25A shows a partial side section view of a connection system between a support stand and an electronic device in a locked state.

FIG. 25B shows a partial side section view of the connection system of FIG. 25A in an unlocked state.

FIG. 25C shows a partial side section view of the connection system of FIG. 25A in an unlocked and user-accessible state.

DETAILED DESCRIPTION

Figure 3A:
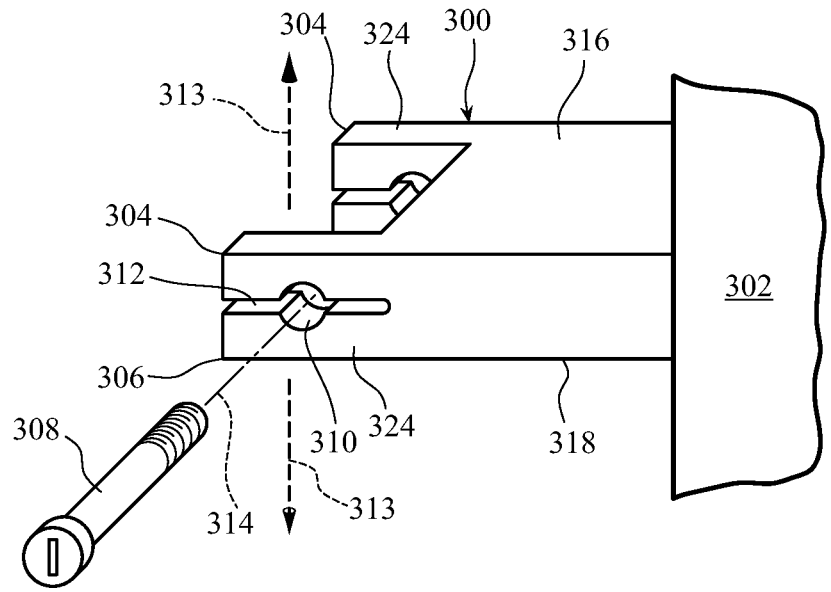
FIG. 3A shows a partial perspective view of a bar configured to connect to an electronic device.

Electronic device stands with poor quality and ergonomics often exhibit "slop," "hysteresis," or "blowback" in their hinges when the vertical or horizontal tilt the device is adjusted relative to the stand. Assemblies, devices, and methods described herein can improve electronic device configurability, provide reliable and high-quality adjustable support, and avoid incorporating unsightly elements, frustrating mechanics, and poor ergonomics.

One aspect of the present disclosure relates to a connector for an electronic device stand that reduces or eliminates this "blowback" by securely retaining a bar (i.e., a tongue, protrusion, or shaft) extending from an electronic device (e.g., computing device or display screen) within an opening in a shaft or receiver unit of the support stand. The connector can include elements for driving at least a pair of guide surfaces of the bar into a corresponding pair of guide surfaces on the support stand, such as by using a shaft or fastener inserted into an opening formed in at least one of the bar or the receiver unit. The contact between the guide surfaces can ensure that the bar and the opening are correctly aligned and in tight contact with each other that eliminates wobble and shifting in the joint.

The joint can comprise a threaded fastener that, when tightened in place, pulls or pushes guide surfaces of the bar (e.g., a pair of sloped or curved surfaces on the end of the tongue) into guide surfaces of the support stand (e.g., a pair of sloped or curved surfaces located in an opening in the support stand into which the bar is inserted). Engaging the guide surfaces against each other can substantially reduce the degrees of freedom of the bar relative to the support stand (e.g., restricting the bar in five degrees of freedom or more) while also reducing the possibility of the bar coming loose due to poor fastener reliability. Accordingly, the joined bar and support stand shaft (i.e., the portion of the joint having the opening) can effectively move as a single, rigid member once they have been joined together, thereby improving the user ergonomics, joint reliability, and perceived quality of the device. The bar and support stand shafts can be pivotally connected to a support bar (e.g., a base of the support stand) so that the electronic device is pivotable relative to the support bar while also being removable from the support bar.

In some embodiments, the joint between the stand and the bar can comprise features for improving the user-adjustability of the joint. For instance, the bar of the joint can comprise a fastener that is user-accessible (e.g., from the exterior of the joint without prior additional disassembly) to adjust the positioning of the guide surfaces within the joint or to move the bar relative to the guide surfaces. Identical fasteners can be positioned on opposite sides of the joint to simplify assembly (e.g., by permitting the user to assemble the joint with either of two fasteners being installed on either side) and to reduce the number of unique parts, thereby reducing the cost of the joint. In some embodiments, the fastener can extend through an axis of rotation of the support stand to keep the joint compact and simple to make and use. The fastener can include a head portion, a shank, and a threaded portion, wherein the shank has an increased diameter portion relative to the diameter of the threaded portion. The shank can therefore define an increased-diameter shoulder that is configured to engage a shoulder in an opening of the receiver unit and, while engaging threads in the bar, can be rotated to pull guide surfaces of the bar into contact with guide surfaces of the receiver unit.

In some configurations, the bar of the electronic device can comprise multiple openings or sets of openings that are configured to receive fasteners in different positions so that a variety of different stands or support adapters can be connected to the tongue. Accordingly, the tongue can be versatile in joining to various types of supports, such as a tilt stand, a combined tilt and lift stand, a display support arm, and/or a display mount adapter (e.g., a VESA mount or other flat display mounting interface (FDMI)).

Another aspect of the present disclosure relates to components of a support stand such as a lift arm portion that is configured to support and provide counterbalance to the electronic device as it is vertically translated relative to a ground surface. The lift arm portion can include a four-bar linkage assembly configured to preserve parallel motion of a device attachment structure at one end of the arm relative to a support structure at the opposite end thereof. The lift arm can also include an energy storage device (e.g., a spring) used to store energy as the electronic device moves downward and to release energy as the device moves upward, thereby making it easier for the user to adjust the height of the electronic device and to help stabilize and preserve the position of the electronic device once it has been adjusted to a desired position. The spring device can be positioned within a retainer that is pivotally connected to the four-bar linkage, and an end of the spring device can be attached to or engaged with a rod that is separately pivotable relative to the four-bar linkage. The pivoting connection points between the retainer and the rod can be properly spaced to ensure that, based on the energy storage properties of the spring device and the weight of the electronic device, rotation of the joints of the four-bar linkage stores a counterbalanced amount of energy in the spring device via rotation and relative movement of the rod and the retainer that compresses or extends the spring device.

In some embodiments, a parallel motion-enabling linkage can be used in the lift arm which does not include a set of four-bar linkages. For example, the lift arm can include a housing to which a device support and a stand support can be pivotally connected. The housing can be used and act similar to a pivotable linkage that is connected to the device and support stands. A belt, chain, or set of pivotable linkages can connect the device support and stand support to synchronize rotation of the electronic device and the stand support as the housing rotates, thereby preserving parallel movement in a manner similar to how another pivotable linkage extending between the supports would operate in a four-bar linkage.

Aspects of the disclosure also relate to ways to protect the interior of the lift arm from ingress while also improving aesthetics and limiting undesirable types of user access to mechanisms within the lift arm. The lift arm can have components positioned within an enclosure or housing with a hollow interior, and a device connector assembly can be at least partially positioned in the hollow interior with a sheath that covers, conceals, and protects components within an end opening of the housing and with a device connector (e.g., tongue) that extends through the sheath to attach to an electronic device. The sheath can be configured with a C-shaped side profile that has ends extending substantially parallel to a longitudinal axis of the housing and that can slide and bend as the device connector rotates relative to the housing to maintain coverage and concealment of the parts of the device connector assembly within the end opening of the housing. Due to the C-shaped profile of the sheath and the way it curls/uncurls as the device connector rotates relative to the housing, the inside of the housing remain more open and therefore able to receive the placement and movement of other internal elements such as a counterbalance spring device or similar structures.

Additional aspects of the disclosure relate to structures for attaching a tongue or other protrusion extending from a device stand to the inside of an electronic device housing. In an example embodiment, the housing can contain a lock mechanism (i.e., latch device) and an adjustment mechanism (e.g., screw or lever) operable to move the latch device within the housing. The protrusion of the stand can be inserted through an opening in the housing and past part of the latch device when the latch device is in an unlocked position. The protrusion can then be locked within the opening by moving the latch device to a locked position while the protrusion remains inserted in the opening. The locking of the protrusion can be caused by engagement of the latch device against a lock surface of the protrusion that is oriented non-orthogonally relative to the longitudinal axis of the protrusion, and the protrusion can be drawn into the opening the protrusion sliding against the lock surface as the latch device moves from the unlocked position to the locked position. Drawing the protrusion into the housing in this fashion can eliminate wobble and slop between the stand and the housing to ensure a solid and tight fit between their parts.

Additionally, the protrusion can have a tapered end portion that is drawn into contact with a tapered opening within the housing as the protrusion is being drawn into the electronic device. In this manner, the contact between the tapered surfaces can even further restrict relative motion between the devices and ensure that the stand and the electronic device are properly aligned and oriented relative to each other for optimal ergonomics, optimal part engagement, and improved joint strength.

Furthermore, in some embodiments a latch system is provided whereby the protrusion/shaft of the stand device is attachable to a bar pivotally positioned within the housing. A lock (e.g., a rotatable locking pin) can keep the protrusion and the bar from moving relative to the housing while the lock remains in a locked position against the bar or protrusion. The lock can be user-accessible to unlock the bar and protrusion and to permit user access to the attachment interface between the bar and protrusion by rotation of the bar and protrusion relative to the housing while the lock is in an unlocked position (e.g., rotated out of contact with the bar or protrusion). The lock can be hidden within the housing to help keep the exterior of the device free from distracting or unsightly features, and the lock can be accessible by a user with a tool (e.g., a flexible card, spudger, or other thin probe) inserted into a small opening or slot in the housing or between the protrusion and the opening in the housing.

The features and improvements described in detail herein can be used and implemented in any combination of the various embodiments of stand and support devices disclosed and described herein. Accordingly, it should be understood that the embodiments described herein and depicted in the figures are merely example embodiments showing features in relative isolation and are showing subsets of characteristics of various different embodiments that could be combined with other embodiments shown or described. The figures therefore do not depict exhaustive or mutually exclusive individual embodiments of the advancements and features of the present disclosure.

These and other embodiments are discussed below with reference to FIGS. 1A-26B. However, those skilled in the art will readily appreciate that the detailed description given herein with respect to these figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or a combination thereof (e.g., two of the first option and one of the second option).

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

FIGS. 1A-1C show diagrammatic side views of an electronic device support system 100. The support system 100 can include an electronic device 102 configured to be supported by a stand 104 which is supported by a ground surface 106. The system 100 can include a bar 108 connecting the electronic device 102 to a tilt joint 110. The tilt joint 110 can be positioned at the end of a lift arm 112 which has a height joint 114 connecting the lift arm 112 to support base 116 via a stand base connector 118. The lift arm 112 can be a lift arm including a mechanism for parallel motion (e.g., a four-bar linkage and counterbalance assembly) described, for example, in U.S. patent application Ser. No. 16/583,222, entitled "Display Lift Arm" and filed 25 Sep. 2019, the entire disclosure of which is hereby incorporated by reference.

The electronic device 102 is shown in a first position in FIG. 1A wherein the lift arm 112 is substantially horizontal and parallel to the ground surface 106, and the electronic device 102 is tilted rearward at an angle at the tilt joint 110. In FIG. 1B, the electronic device 102 remains at the same angle relative to the ground surface 106, but the lift arm 112 has been rotated downward at the height joint 114, thereby moving the electronic device 102 closer to the ground surface 106. In FIG. 1C, the lift arm 112 remains in the same position as in FIG. 1B, but the tilt joint 110 has been operated to pivot the electronic device 102 forward to an orientation that is vertical and with a plane of the front or rear surface of the electronic device being oriented substantially perpendicular to the ground surface 106 and parallel to a vertical longitudinal axis of the support base 116. FIGS. 1A-IC are just a few examples of adjustable positions achieved through device support system 100, and the electronic device 102 may be adjusted to higher (or lower) positions than shown, and may rotate further about the tilt joint 110 than is shown.

The electronic device 102 can comprise a display screen 119 (i.e., monitor or touch screen) for a computing device. In some embodiments, the electronic device 102 can comprise an entire computing device, such as by comprising a tablet computer or "all-in-one" computer including processing components, memory components, networking devices, and other computer parts known in the art. The electronic device 102 can include a housing 120, enclosure, or shell configured to contain the display screen and other electronic components. The housing 120 can therefore have an interior chamber in which other components are positioned. In some embodiments, the housing 120 can also contain a latch or other mechanism for connecting the housing 120 to a bar 108 extending from the tilt joint 110. The display screen 119 can have a front surface plane that is substantially parallel to a rear surface plane of a rear wall of the housing 120 (e.g., the substantially vertical plane from which the bar 108 horizontally extends in FIG. 1C).

The stand 104 can comprise two joints (e.g., 110, 114) as shown in FIGS. 1A-1C, and in some cases, the stand 104 can comprise one joint (e.g., only tilt joint 110) or more than two joints. When only a tilt joint 110 is included, the joint can join the bar 108 directly to the support base 116 at the base connector 118. When more than two joints are included, the additional joint can be positioned between the joints 110, 114 shown in FIG. 1A, and the lift arm 112 can be divided into two segments. In some embodiments, the electronic device 102 is attached directly to the support base 116 without any pivotable joints.

The stand 104 can be configured with a base portion or foot and a vertical post or column as shown in the side views of FIGS. 1A-1C with the base connector 118 extending from the support base 116 in a horizontal direction. In some embodiments, the base connector 118 can extend vertically upward from a top end of the support base 116. The weight of the support base 116 can balance and support the weight of the electronic device 102 and the rest of the stand 104. In some embodiments, the support base 116 can be clamped or fastened to a ground surface 106 to provide stability against tipping. In some embodiments, the support base 116 can be attached to a wall or other non-horizontal surface. The support base 116 can extend at least partially underneath the lift arm 112 (e.g., the foot of the base 116) and, in some cases, under the electronic device 102.

The ground surface 106 can alternatively be vertical or oriented at a different angle. In some embodiments, the ground surface 106 is part of a desk or other office furniture. In some cases, the ground surface 106 can be positioned on a wall, post, counterweight, leg, device housing, or other structure to which the stand 104 needs to be attached. The stand 104 can, therefore, in some cases be attached to the ground surface 106 while in other cases, the stand 104 can simply be placed on or resting on the ground surface 106 without being attached to it.

FIG. 2 illustrates a diagrammatic partial exploded side view of the electronic device 102 and stand 104 components at the interface between the electronic device 102 and the stand 104 comprising the tilt joint 110. The bar 108 is affixed to the electronic device 102 and can extend at a substantially perpendicular angle from the rear surface 200 of the electronic device 102. The bar 108 can include a lateral opening 202 (i.e., a bore or aperture) near an end portion 204 thereof. The stand 104 can include a receiver 205 (i.e., a receiver unit) having a receiver opening 206 configured to receive the bar 108 to a sufficient depth that the lateral opening 202 of the bar 108 is aligned with a lateral opening 208 of the receiver 205. With the openings 202, 208 aligned, a fastener, bar, or shaft can be inserted into both openings 202, 208 to prevent withdrawal of the bar 108 from the opening 206. In some embodiments, the bar 108 (or other bars discussed herein, e.g., bar 800) can extend from a mount adapter that is attachable to an electronic device (e.g., 102 or 802), such as one of the embodiments of mount adapters disclosed in U.S. patent application Ser. No. 16/563,252, entitled "Display Support Arm Mount" and filed 6 Sep. 2019, the entire disclosure of which is hereby incorporated by reference. The bar 108 (and other bars referred to herein) can be referred to as a first shaft or device attachment structure attachable to an electronic device (e.g., 102), and the receiver 205 and/or tilt joint 110 (and other receivers/tilt joints herein) can be referred to as a second shaft attachable to a support bar (e.g., lift arm 112 or base 116). The tilt joint can include a first structure anchored to the lift arm 112 (e.g., arm barrel 842 anchored to lift arm 812) and a second structure anchored to the device attachment structure (e.g., receiver barrel 840 anchored to bar 800).

With the bar 108 positioned in the receiver opening 206, the tilt joint 110 can be operated to rotate the receiver 205 and bar 108 relative to the lift arm 112, as described in further detail in connection with embodiments described below. The rotation of the tilt joint 110 can change the angle of tilt of the electronic device 102 relative to a ground surface or base of the stand 104. Thus, the interface shown in FIG. 2 can be referred to as being a tilt assembly or tilt joint connection between the stand 104 and the electronic device 102. In some embodiments, the positioning of the bar 108 and receiver 205 can be substantially reversed, wherein the electronic device 102 includes an opening into which a bar extends, as discussed, for example, in further detail below in connection with FIGS. 16A-25C.

Figure 11:
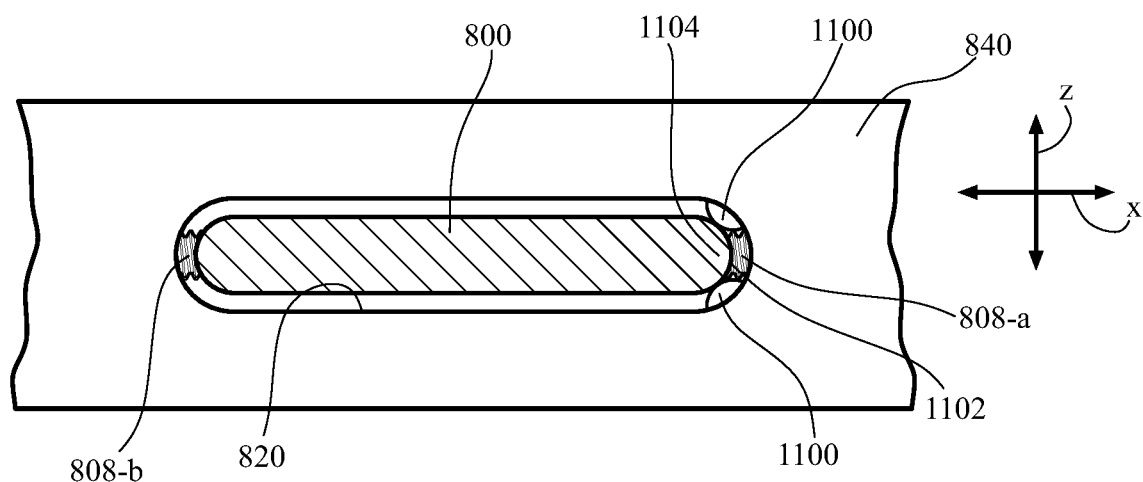
FIG. 11 shows a section view as taken through section lines 11-11 in FIG. 9.

FIG. 3A shows a simplified side perspective view of an example bar 300. The bar 300 can be the bar 108 of FIGS. 1A-2. In this embodiment, the bar 300 is attached to and extends from a rear end surface of an electronic device 302 (e.g., device 102). The bar 300 includes a generally rectangular side profile with squared off corners 304, 306. In some embodiments, the bar 300 (or bar 108) can include corners that are rounded (e.g., as shown in FIG. 11), that are curved or chamfered, or that form a tapered shape (e.g., as shown in FIGS. 5A-6B and 16B).

With the bar 300 inserted into the receiver opening (e.g., 206), a fastener or shaft 308 can be inserted into the lateral opening 310 of the bar 300. The lateral opening 310 can be connected to a longitudinally-oriented slot 312 in the bar 300 that opens at the end between the corners 304, 306, and the shaft 308 can have a diameter that exceeds the vertical diameter of the lateral opening 310. Accordingly, as the shaft 308 moves into the opening 310, the slot 312 can expand, thereby driving the corners 304, 306 apart from each other along a vertical axis 313 (which is in a direction substantially perpendicular to the direction of insertion 314 of the shaft 308/the longitudinal axis of the shaft 308 or the longitudinal axis of the opening 310), as shown in the side section view of FIG. 3B. The expansion caused by the shaft 308 can cause the corners 304, 306 and/or the top and bottom surfaces 316, 318 of the bar 300 to come into contact with nearby bar-facing surfaces of the receiver opening 320 of the receiver, thereby causing a friction fit between the bar 300 and the opening that prevents withdrawal of the bar 300 from the opening while the shaft 308 is located in the lateral opening 310. The friction fit can tightly hold the bar 300 against the receiver opening 320 to prevent removal of the bar 300 from the opening 320 without first removing the shaft 308.

Figure 3B:
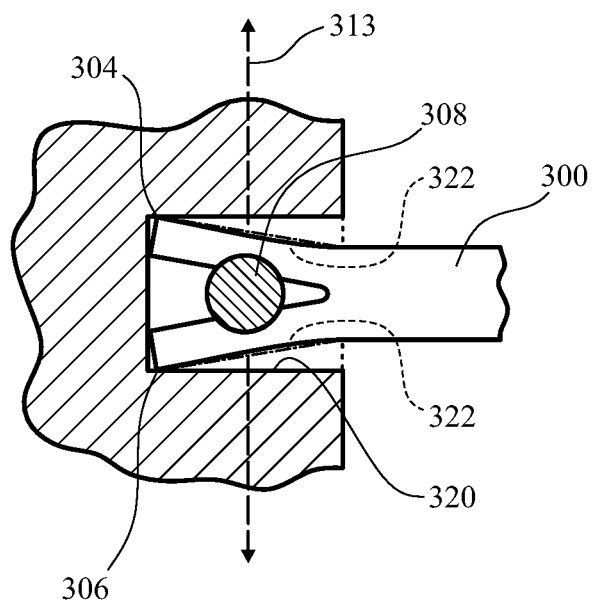
FIG. 3B shows a partial side section view of the bar of FIG. 3A installed in the electronic device.

Furthermore, in some embodiments, the receiver opening 320 can comprise reverse-tapered inner surfaces 322, as shown by broken lines in FIG. 3B, wherein expansion of the bar 300 causes an interference fit between the corners 304, 306 and/or top and bottom surfaces 316, 318 and the reverse-tapered surfaces 322. In other words, the receiver opening can have an entrance opening width/height that is less than the width/height of a further interior portion of the opening, and the entrance opening can have a width substantially equal to the top-to-bottom thickness of the bar 300, as shown in FIG. 3B. The expansion of the bar 300 can help ensure that the bar 300 is prevented from wobbling or shaking within the receiver opening 320. The interference between the expanded corners 304, 306 and the surfaces 322 can provide an extra level of security to the attachment of the bar 300. Removing the shaft 308 can allow the bar 300 to return to its normal thickness, thereby reducing or eliminating the friction and/or interference between the bar 300 and the opening 320.

As shown in FIG. 3A, the bar 300 can have at least two end projections 324 that are spaced apart at the end of the bar 300. Each end projection 324 can have its own lateral opening 310, so two separate shafts 308 can be used to expand the projections 324. Because the end projections 324 are spaced apart, the bar 300 can have improved flexibility in the projections 324 (and thus can expand more easily along the vertical axis 313) as compared to a bar 300 having a single opening 310 and slot 312 that extends across the entire width of the bar 300. However, in some embodiments, the bar 300 can have a single, full-width (or partial-width) opening 310 and slot 312 instead of two projections 324 or through a part of the bar 300 in a proximal direction relative to the open ends of the slots 312 (i.e., nearer to the electronic device). Additionally, in some cases the bar 300 can have separate openings 310 on each side of the bar 300, and projections 324 can be omitted (e.g., bar 800 in FIG. 8).

The shaft 308 can be inserted into a shaft or fastener opening in the receiver (e.g., 208) in addition to being inserted into the opening 310 of the bar 300. In some embodiments, the shaft 308 and opening(s) (i.e., in the receiver and bar) are threaded and have threads engaging each other to ensure a secure fit of the shaft 308 in the openings along the direction of the longitudinal axis 314 of the shaft 308. See, e.g., FIGS. 4 and 9. Thus, an operator can use a driver tool or wrench to install or remove a shaft 308 from an opening 310, and longitudinal-axial rotation of the shaft 308 can induce a vertical expansion/contraction of the bar 300 as the threads direct the shaft 308 into/out of the opening 310.

Figure 4:
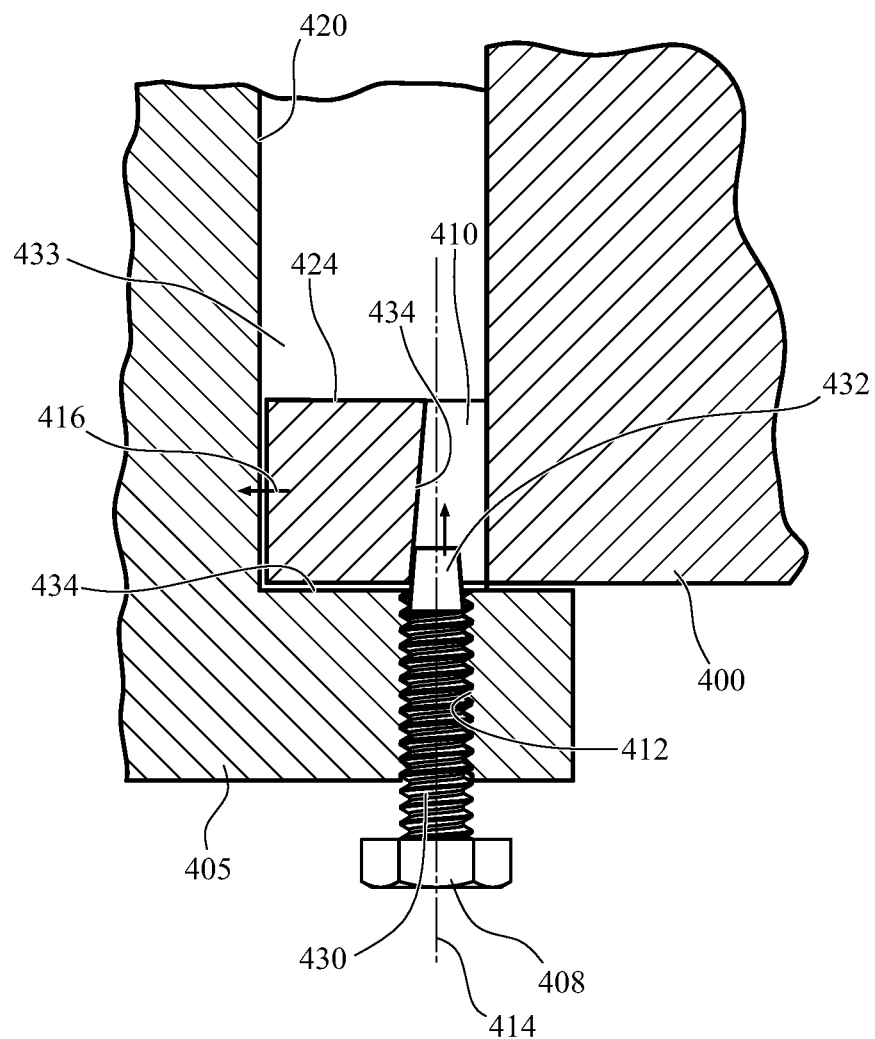
FIG. 4 shows a partial top section view of an interface between an electronic device and a support system.

Another embodiment of a bar-and-receiver support interface is shown in the top section view of FIG. 4. In this view, the bar 400 has a projection 424 inserted into a receiver opening 420 in receiver 405, and a shaft 408 is installed through a lateral opening 412 in the receiver 405 and at least partially extends into a lateral opening 410 in the projection 424. The shaft 408 comprises a threaded portion 430 engaging threads in the lateral opening 412 of the receiver 405 and has an end portion 432 that emerges into the lateral opening 410 of the projection 424.

The end portion 432 has a frusto-conical tapered shape that narrows along the longitudinal axis 414 of the shaft 408 as it extends from the threaded portion 430 to its distal end. The lateral opening 410 can also comprise a sloped (i.e., ramped) inner surface 434 configured to be engaged by the radial outer surface of the end portion 432. The sloped end portion 432 can be referred to as a driving surface of the shaft 408. As a result, advancement of the shaft 408 into the opening 412 along its longitudinal axis 414 causes the end portion 432 to advance into the lateral opening 410 and to slide against the sloped inner surface 434, thereby causing the projection 424 to drive and move in a direction perpendicular to the longitudinal axis 414 (e.g., along perpendicular second axis 416). The installation of the shaft 408 thus not only limits or prevents the bar 400 from being withdrawn from the receiver opening 420 but also urges the bar 400 into the receiver opening 420 in a tight and secure fit (e.g., until the end of the projection 424 contacts the inner surface of the receiver opening 420). In some embodiments, the receiver opening 420 can include ramped or tapered surfaces (e.g., opening bottom surface 433) that guide the projection 424 into a preferred vertical alignment (i.e., along an axis perpendicular to longitudinal axis 414 and second axis 416) with the opening 420. See also FIGS. 5B and 5D. The opening 420 can also have a ramped or tapered surface (not shown) on a side of the opening (e.g., at side surface 434) that contacts a side surface of the projection 424 to guide the projection into a preferred position in the opening 420 as measured along the direction of longitudinal axis 414. See also FIGS. 5B and 5D.

Features and elements from embodiments described herein can be combined with other features and elements described in connection with other embodiments. For example, the ramped surfaces (e.g., on end portion 432 and inner surface 434 of FIG. 4) can be used in the embodiments shown in FIGS. 2, 3A, and 3B. Similarly, the embodiment of FIG. 4 can have an expandable bar end similar to that of FIGS. 3A and 3B. This reciprocal feature relationship between embodiments applies to all embodiments described herein, as will be apparent to those having skill in the art who also have the benefit of hindsight after review of this disclosure.

Figure 5A:
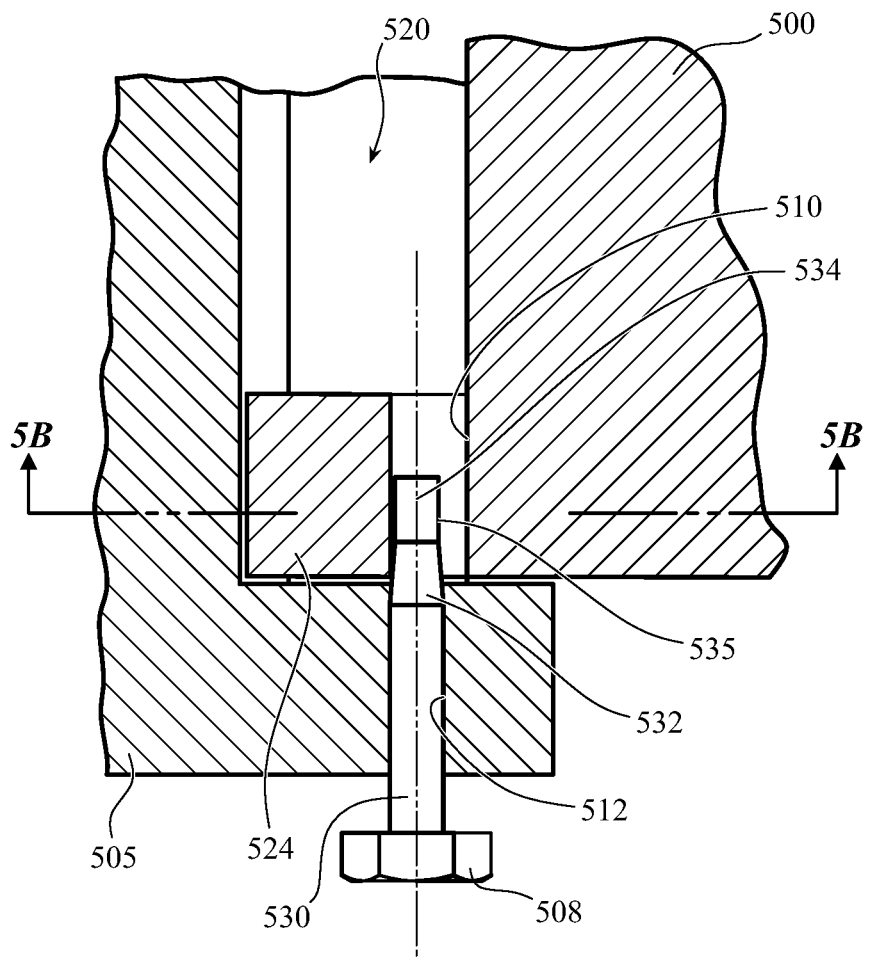
FIG. 5A shows a partial top section view of another interface between an electronic device and a support system.
Figure 5B:
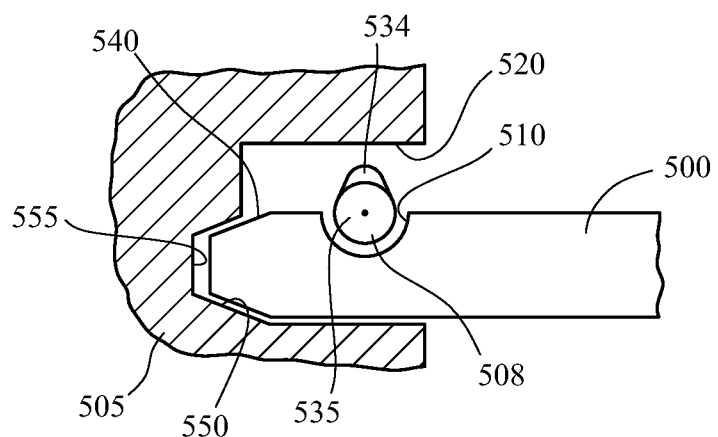
FIG. 5B shows a partial side section view of the interface of FIG. 5A.
Figure 5C:
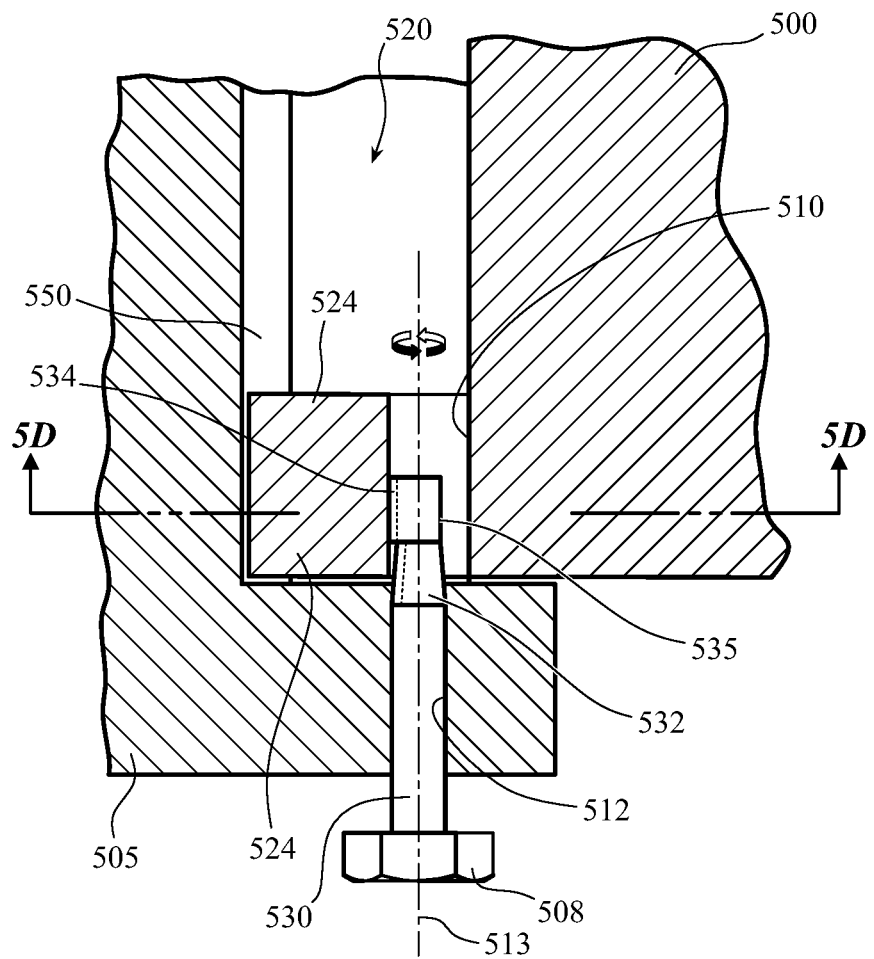
FIG. 5C shows a partial top section view of the interface of FIG. 5A in a second configuration.
Figure 5D:
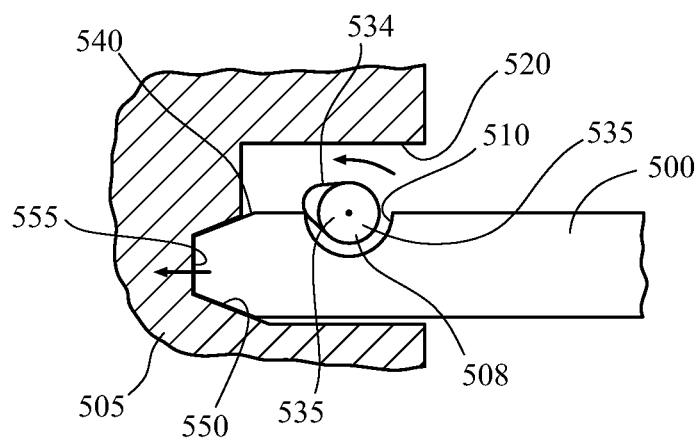
FIG. 5D shows a partial side section view of the interface of FIG. 5C.

FIGS. 5A-5D show another embodiment of a connection assembly wherein a bar 500 is inserted into a receiver opening 520. FIG. 5A shows a top section view with the shaft 508 and bar 500 in a first position, FIG. 5B shows a section view taken through section lines 5B-5B in FIG. 5A, FIG. 5C shows a top view of the assembly with the shaft 508 and bar 500 in a second position, and FIG. 5D shows a section view taken through section lines 5D-5D in FIG. 5C.

The bar 500 is configured to be inserted into opening 520 to a sufficient depth that a bar groove 510 longitudinally aligns with a lateral opening 512 of the receiver 505, and the shaft 508 can be inserted into the position shown in FIGS. 5A and 5B, wherein the shaft 508 has a first portion 530 positioned in the lateral opening 512 and an end portion 532 protruding into the bar groove 510. The end portion 532 comprises a cam portion 535 with a cam protrusion 534 radially extending further from the central longitudinal axis 513 of the shaft 508 than the rest of the cam portion 535. Initially, the cam protrusion 534 is oriented such that it is not contacting the bar groove 510, as shown in FIGS. 5A-5B, but when the shaft 508 is rotated in the opening 512, the cam protrusion 534 is rotated into contact with the groove 510, thereby driving the bar 500 in an inward direction (i.e., into the receiver opening 520 to guide surfaces 550), thereby eliminating any loose horizontal fitment between the parts 500, 505.

Furthermore, in some embodiments, the end portion of the bar 500 can have one or more tapered, sloped, or curved guide surfaces 540 that are driven into contact with the corresponding tapered, sloped, or curved guide surfaces 550 in the receiver opening 520. The angled nature of these guide surfaces 540, 550 helps guide the bar 500 into a desired position relative to the receiver 505 and eliminates vertical loose fitment between the parts 500, 505. Engaging guide surfaces such as surfaces 540 and 550 can therefore be referred to as "guide surfaces" herein because they can be used to guide the bar into the position shown in FIGS. 5C-5D if the end of the bar 500 is inserted somewhat angularly askew or translationally off-centered. Additionally, the bar 500 can comprise a first connector axis and the receiver can comprise a second connector axis. Those two axes can be aligned and can become coaxial (e.g., aligned with axis 513) when a fastener (e.g., 508) is installed and the guide surfaces 540, 550 are brought into face-to-face contact with each other (e.g., when both pairs of guide surfaces are face-to-face contacting each other and the respective abutting surfaces are parallel to each other).

Once an off-positioned bar 500 engages the guide surfaces 550 and is urged inward/toward an end surface 555 between the guide surfaces 550, the bar 500 is drawn into the proper orientation as increased engagement of the guide surfaces (i.e., engagement of guide surfaces 540 with guide surfaces 550) gradually reduces the available space for the bar 500 to fit in the receiver opening 520. This naturally causes the bar 500 to rotate or translate into the position in FIGS. 5C-5D as it slides against the guide surfaces 550 and moves further into the opening 520, effecting the desired fit and orientation of the bar 500 within the receiver opening 520.

The cam protrusion 534 is one mechanism by which the inward force on the bar 500 can be applied. In some embodiments, bar 400 can similarly be urged into guide surfaces of the receiver opening 420 by the insertion of the shaft 408 into the opening 410, as discussed above in connection with FIG. 4. Thus, features and elements from embodiments described herein can be combined with other features and elements described in connection with other embodiments.

FIGS. 6A and 6B show example side section views of another kind of connection assembly. In this case, the shaft 608 extends into a groove 610 in the bar 600, and the bar 600 has a notch 660 into which a rotatable tongue portion 654 of the shaft 608 can rotate. The rotatable tongue portion 654 can have a ramped surface 656 configured to engage an inner surface 665 of the notch 660 as the shaft 608 rotates. Thus, as shown in FIG. 6A, the shaft 608 can be rotatable between a first position in which the tongue portion 654 is positioned out of the notch 660 (or at least out of contact with the notch 660), and FIG. 6B shows that the shaft 608 can be rotated to a second position in which the tongue portion 654 contacts the notch 660. The inner surface 656 and/or inner surface 665 can be sloped, curved, or ramped in a manner that gradually drives the bar 600 inward (i.e., perpendicular to the axis of rotation of the shaft 508/with guide surfaces 640 contacting guide surface(s) 650) as the shaft 608 rotates clockwise about its axis of rotation. FIG. 6B also shows that the groove 610 moves relative to the shaft 608 as the shaft 608 it rotates because of the movement of the bar 600. Accordingly, the groove 610 can have a dimension along the bar 600 that exceeds the diameter of the shaft 608 to accommodate translation of the bar 600 relative to the shaft 608 as the guide surfaces 640/650 move the bar 600.

Figure 7A:
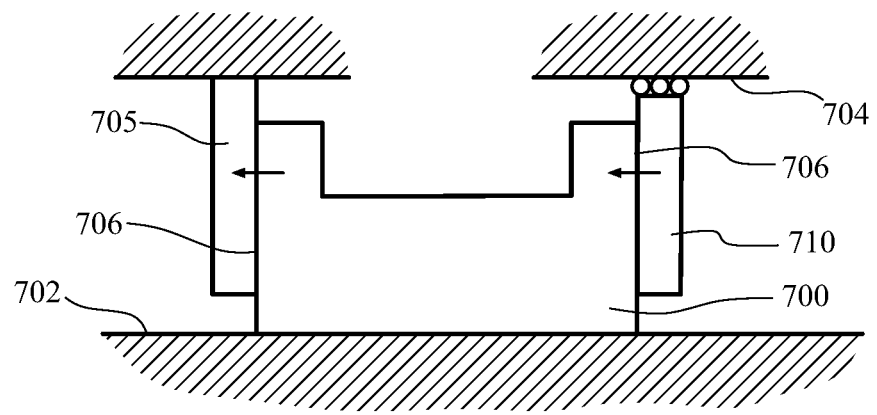
FIG. 7A shows a schematic top view of a bar attaching an electronic device to a support system.
Figure 7B:
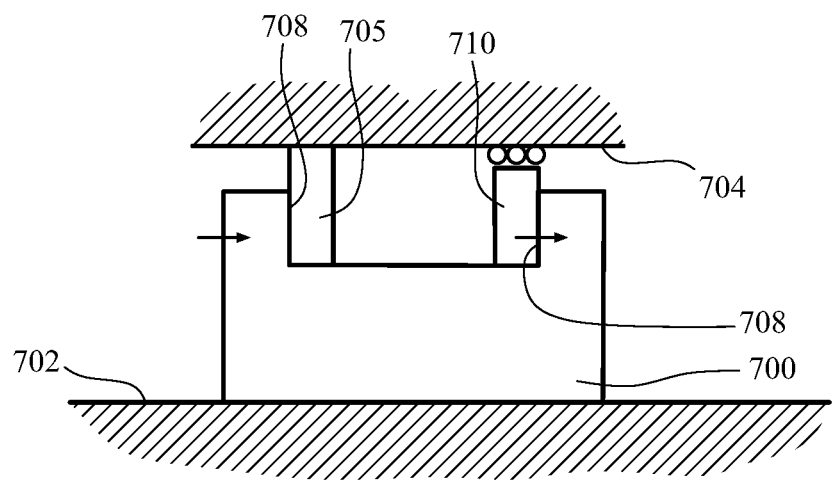
FIG. 7B shows a schematic top view of another bar attaching an electronic device to a support system.

FIGS. 7A-7B show diagrammatic top views of additional connection assemblies that join an electronic device 702 and a stand 704. In some embodiments, the electronic device can be element 704, and the stand can be element 702. A bar 700 extends away from the electronic device 702 and is positioned adjacent to a fixed post 705. A second, translatable post 710 that is anchored to the stand 704 can be used to apply a clamping force to the bar 700. Thus, in the embodiment of FIG. 7A, the bar 700 is clamped by its laterally-outward-facing surfaces 706 coming into contact with, and being frictionally held between, the fixed and translatable posts 705, 710. In the embodiment of FIG. 7B, the bar 700 is clamped by its laterally-inward-facing surfaces 708 coming into contact with the posts 705, 710 and thereby being frictionally held in place against the those surfaces 708. These schematic views illustrate how the bar 700 can be held in place without a fastener or shaft and with friction, rather than interference of parts, being the main force seating the bar 700 in place, wherein the friction is applied to side surfaces of the bar 700 rather than top and bottom surfaces (e.g., as in the embodiment of FIGS. 3A-3B).

Figure 8:
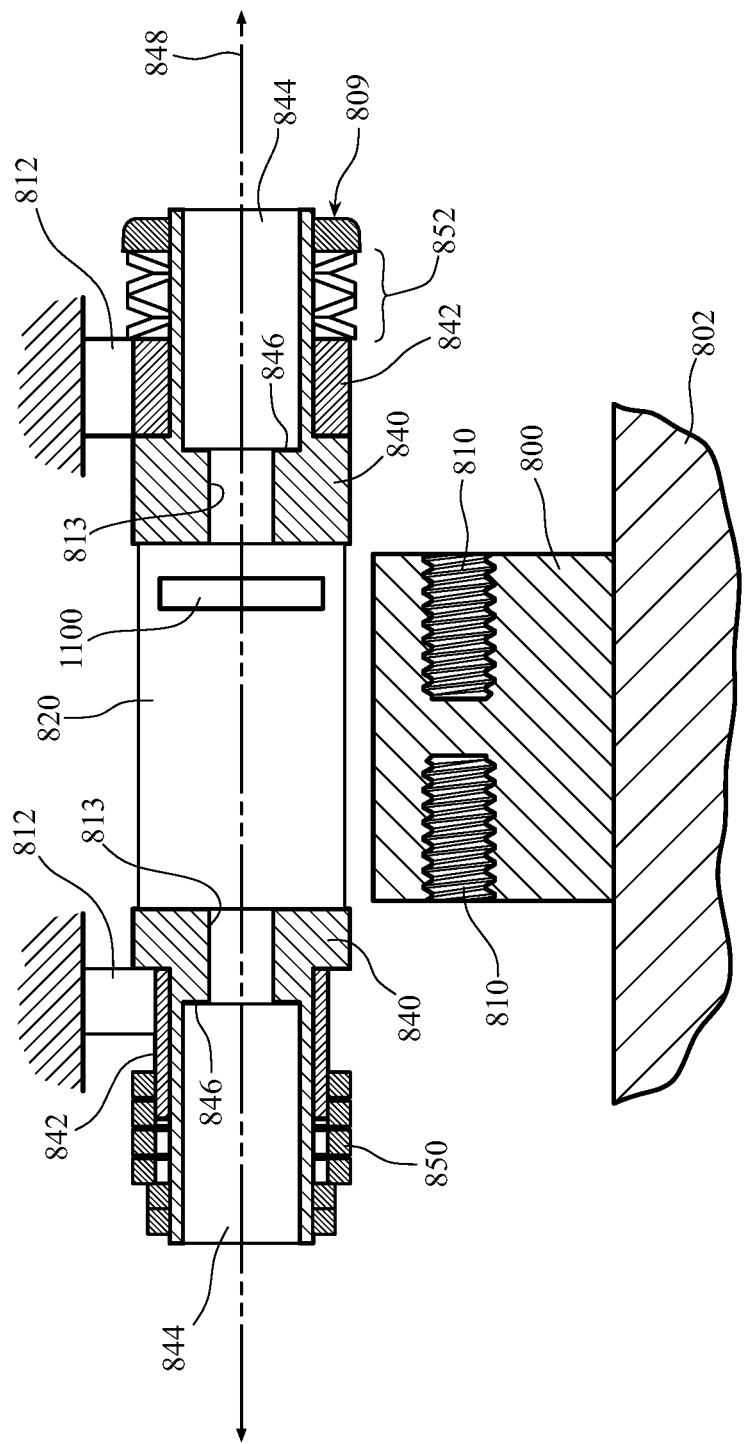
FIG. 8 shows a partial exploded top section view of a connection system between an electronic device and a support stand.
Figure 9:
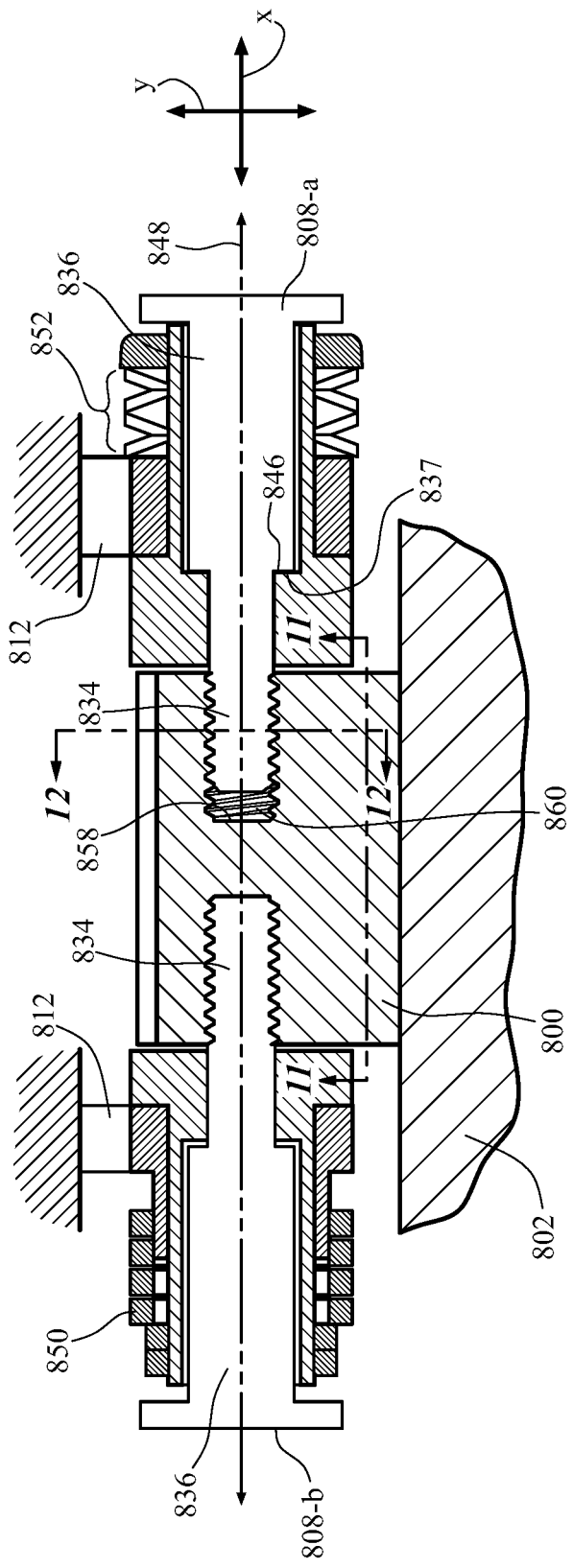
FIG. 9 shows a partial top section view of the connection system of FIG. 8 in an assembled state.

FIG. 8 illustrates a top section view of a connection assembly for a bar 800 that is connected to an electronic device 802 and a tilt hinge 809 that is connected to a lift arm 812. In this embodiment, the bar 800 includes lateral openings 810 on opposite sides of the bar 800, and each lateral opening 810 is threaded. The bar 800 is insertable into a receiver opening 820 in the tilt hinge 809, as shown in the position of FIG. 9. When inserted, the lateral openings 810 can be centrally aligned with lateral openings 813 of the tilt hinge 809, as indicated in FIG. 8. The lateral openings 810, 813 can have substantially equal diameters so that a shaft 808 can be installed on each side of the tilt hinge 809 with an end portion 834 fitting within each opening 810, 813, as shown in FIG. 9. In this manner, contact between the end portion 834 and the openings 810, 813 can keep the bar 800 aligned with receiver barrel 840 in the tilt hinge 809. In some embodiments, the bar 800 can extend from a mount adapter that is attachable to an electronic device (e.g., 802), such as one of the embodiments of mount adapters disclosed in U.S. patent application Ser. No. 16/563,252, entitled "Display Support Arm Mount" and filed 6 Sep. 2019, the entire disclosure of which is hereby incorporated by reference.

The receiver barrel 840 and at least one arm barrel 842 (see FIGS. 8 and 10) can be rotatable relative to each other about an axis of rotation 848. See FIG. 12 and its related description below. The lateral openings 813 and receiver opening 820 can be formed within the receiver barrel 840. The receiver barrel 840 can also comprise a widened bore 844 (see FIGS. 8 and 10) configured to receive each shaft 808, wherein the widened bore 844 forms a shoulder 846 having a shoulder face on each side where the bore 844 transitions to the lateral opening 813. A head portion can be positioned at the end of each shaft 808 and can be wider than the rest of the shaft 808. The head portion can be turned using a tool or wrench to tighten or loosen the shaft 808 in the opening 810. The head portion can include a recess, hex shape, or other manipulation surface configured to be engaged by a tool to rotate the shaft 808.

The shoulder 846 can have an end profile that is circular with an open center (i.e., lateral opening 813). The arm barrel 842 can be rotated about the axis of rotation 848 extending centrally through the receiver barrel 840. Thus, the arm barrel(s) 842 and the attached lift arm 812 can pivot about the axis of rotation 848 relative to the receiver barrel 840. Meanwhile, the bar 800 is affixed to the receiver barrel 840 by the fastener shafts 808 and rotates synchronously with the receiver barrel 840. In other words, the bar 800 can be a first connector having a first connector axis that extends longitudinally and centrally through the lateral openings 810, the receiver barrel 840 can be a second connector having a second connector axis along axis of rotation 848, and the first connector axis and the second connector axis can be aligned with each other when at least one shaft 808 is installed. The bar 800 and the receiver barrel 840 can be joined in this manner to move as a single unit that can be referred to as a pivotable arm since it pivots relative to the arm barrel(s) 842 about axis of rotation 848.

The rotation of the receiver barrel 840 and the arm barrel(s) 842 can be limited or resisted due to an optional spring (e.g., a torsion spring) 850 and/or an optional set of friction disks 852 positioned around opposite ends of the receiver barrel 840. See FIGS. 8 and 10. The spring 850 can have a first end attached to (e.g., friction-fitted, welded, or fastened to) the receiver barrel 840 and a second end attached to (e.g., friction-fitted, welded, or fastened to) an arm barrel 842. In one embodiment, the spring 850 may include one or more coils having a first diameter coupled with an end of the receiver barrel 840, and one or more coils having a second diameter (e.g., a larger diameter) coupled with the arm barrel 842. The attachment between these parts 850, 840, 842 can cause the potential energy of the spring 850 to increase or decrease as there is relative rotation between the barrels 840, 842 about the axis of rotation 848. Accordingly, the spring 850 can be used to bias the rotation of the barrels 840, 842 toward a desired "home" or "default" position where the potential energy of the spring 850 is the lowest. In some embodiments, this position is a horizontal position, as shown in FIG. 1C.

The spring 850 can be configured to assist the user in adjusting the tilt of the electronic device 802 when the bottom of the device is tilted forward (i.e., the movement of the electronic device 102 from the position of FIG. 1B to the position shown in FIG. 1C) by applying a torque to the barrels 840, 842 that helps the device rotate in that direction at the tilt hinge 809. The spring 850 also can resist rotation of the electronic device 802 when the device is rotated in the opposite direction (e.g., the direction shown by the movement of the electronic device from the position of FIG. 1C to the position of FIG. 1B) by storing potential energy and applying a resisting torque to the tilt hinge 809. In this manner, the spring 850 can improve the ergonomics of the stand (e.g., 104) by making the electronic device require substantially similar (e.g., equal) torque to pivot at the tilt hinge 809 whether it is tilted in a forward or backward direction (i.e., in a clockwise or counterclockwise direction as viewed from a lateral side thereof). The resistance and assistance of the spring 850 can be especially beneficial in embodiments where the center of gravity of the electronic device 102 is positioned vertically higher than the tilt hinge 809 (e.g., at the vertical level of joint 114 in FIG. 1C) so that the electronic device 102 does not over-rotate due to the center of gravity passing over the tilt hinge 809.

The friction disks 852 can be used to apply frictional resistance to the relative movement of the barrels 840, 842. The resistance can improve ergonomics by making the rotation of the barrels 840, 842 require more torque in both directions (i.e., tilting forward and backward). The increased torque can help limit inadvertent tilting movements of the electronic device (e.g., when the device is bumped or the stand is shaken and the device's rotated position may drift). The friction disks 852 can have adjustable compression or tension so that the friction applied by the disks is adjustable to a predetermined level. In combination with the spring 850, the friction disks 852 can be tuned so that the user only needs to provide a single, predetermined, substantially equal torque for tilting the device in either direction.

As discussed above, a bar may wobble or have loose fitment with a receiver opening if it is not properly constrained. The connection system of FIGS. 8-11 can be used to constrain movement of the bar relative to the receiver opening 820 in at least five (and potentially six) degrees of freedom. To do so, the receiver opening 820 can comprise a pair of curved protrusions 1100, as shown in FIG. 11 (and also seen in part in FIGS. 8 and 10), that are configured to engage a curved end surface 1102 of an end portion 1104 of the bar 800. In other words, the receiver opening 820 can include two guide surfaces (on protrusions 1100) configured to engage two guide surfaces (i.e., opposite sides of 1102) of the bar 800. In some embodiments, the guide surfaces can be formed as part of the inner walls of the opening 820 rather than being part of protrusions 1100.

Figure 10:
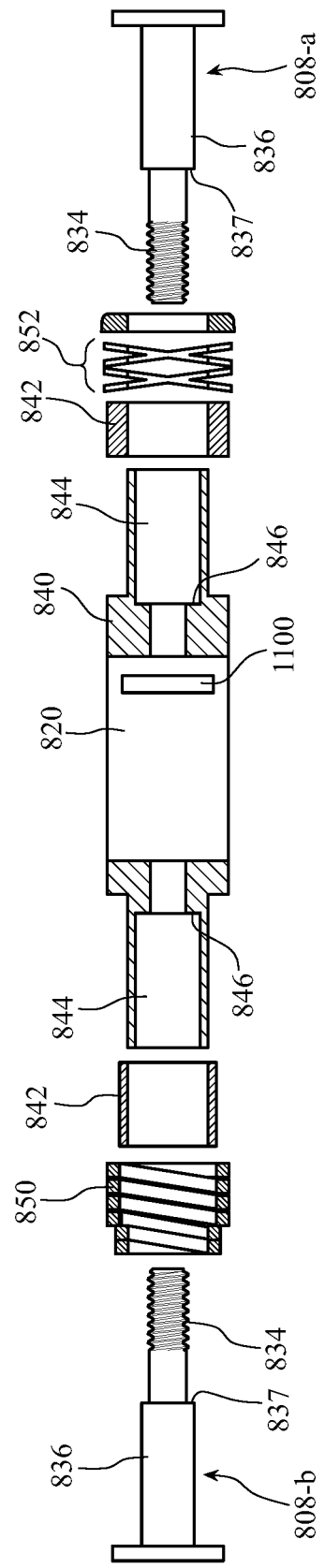
FIG. 10 shows an exploded top section view of portions of a tilt hinge of the connection system of FIG. 8

In order to ensure a tight fit between the pairs of guide surfaces, one shaft 808-a can be installed with its threaded end portion 834 configured to engage the threads of a lateral opening 810 of the bar 800 while being seated in contact with the shoulder 846 of the widened bore 844 of the receiver barrel 840, as shown in FIG. 9. The shaft 808 can comprise its own widened portion 836 (i.e., a shank) to form a shoulder 837 of its own, as shown in FIGS. 9 and 10. In this manner, the shoulders 837, 846 are pulled and held into contact with each other as the threads at portion 834 are tightened. Simultaneously, the end portion 1104 of the bar 800 is pulled between the curved protrusions 1100 and into tight contact with them by the threads. The bar 800 is thereby secured to the receiver barrel 840 and limited from movement relative to the receiver barrel 840 such as translation along the x-, y-, or z-axes in FIGS. 9 and 11. The contact at the curved protrusions 1100 also prevents rotation of the bar 800 relative to the barrel 840 about at least the x- and z-axes. A properly tightened fit and sizing of the shaft end portion 834 diameter and the lateral opening 813 of the receiver barrel 840 can also prevent rotation of the bar 800 relative to the barrel 840 about the y-axis. The outer curved surfaces of the end portion 1104 can be referred to as guide surfaces of the bar 800, and the curved protrusions 1100 can be referred to as guide surfaces of the receiver barrel 840. The outer curved surfaces of the end portion 1104 are curved tapering surfaces that gradually transition the width of the end portion 1104 from a maximum thickness to a narrower thickness that engages the corresponding tapering shape of the curved protrusions 1100.

In some embodiments, the tilt hinge 809 can comprise guide surfaces that are non-orthogonally angled or tapered (similar to a "V"-shape) against which the curved (or, alternatively, similarly non-orthogonal, tapered, "V"-shaped) surfaces of the bar 800 can come into contact. Additionally, although the protrusions 1100 have convex surfaces that come into contact with the bar 800, in some embodiments, protrusions 1100 can be used that have flat tapering surfaces or concave surfaces to receive the bar 800. The movement of the bar 800 in the opening 820 (e.g., along the positive x-axis in FIG. 11), can enable the guide surfaces to abut and slide against each other until they reach a position where the mechanical interference caused by contact between the guide surfaces prevents any further movement of the bar 800 relative to the opening 820. The engagement of the guide surfaces on elements 1100 and 1102 causes clamping of the bar 800 similar to the schematic clamping illustrated in FIGS. 7A and 7B and the guide surface contact of FIGS. 5D and 6B.

In some embodiments, the lateral opening 810 receiving the shaft 808-a is configured to have a length or positioning that allows the shaft 808-a to be tightened in the opening 810 without bottoming out at the innermost end 858 of the opening 810, as shown by gap 860 in FIG. 9. The gap 860 can ensure that the end portion 834 is not prevented from tightening sufficient to cause abutment between the shoulders 837, 846 and the guide surfaces on elements 1100 and 1102. This feature ensures that the innermost end 858 and shaft 808-a do not need to be perfectly sized and manufactured. Otherwise, the shaft 808-a could be too long relative to the opening 810 to tighten the abutting surfaces due to interference contact with the innermost end 858. As a result, the gap 860 reduces manufacturing costs and makes proper hinge assembly simpler.

The opposite side of the tilt hinge 809 can comprise a similar shaft 808-b that is installed into the opposite lateral opening 810 of the bar 800 so that it bottoms out and comes into contact with the inner end wall of the opening 810. This shaft 808-b can effectively act as a cantilever or pin extending from the bar 800 without constraining the movement of the bar 800 relative to the receiver opening 820. However, both shafts 808 can have the same dimensions so as to be interchangeable and therefore easier for a user to install and adjust. In other words, the user does not need to keep track of which fastener fits in each side of the tilt hinge 809. The manufacturer also only needs to make two of one part rather than two unique parts, thereby saving production costs due to economies of scale. In order for one opening 810 to have the gap 860 and the other to lack the gap 860, the openings 810 can have different depths or the receiver barrel 840 can have different thicknesses between the receiver opening 820 and shoulders (e.g., 837) in each side's bore (e.g., 844).

Figure 12:
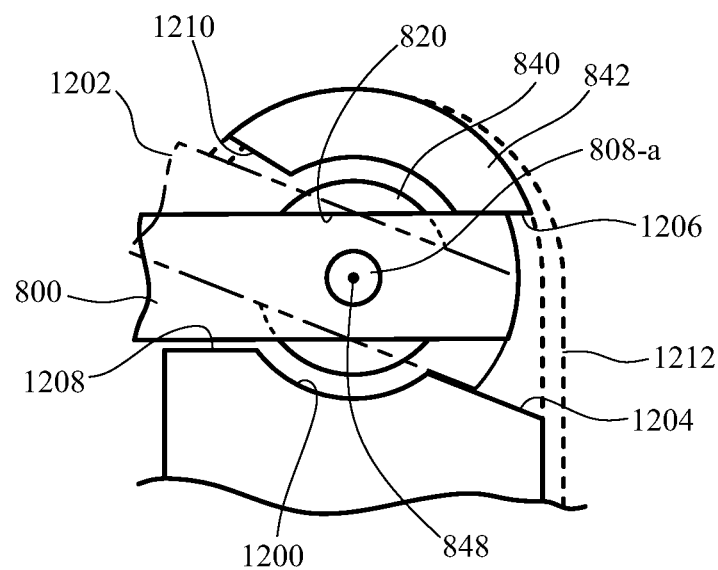
FIG. 12 shows a section view as taken through section lines 12-12 in FIG. 9.

FIG. 12 illustrates a side section view of the tilt hinge 809 as taken through section lines 12-12 shown in FIG. 9. As shown, the bar 800 and receiver barrel 840 can be configured to rotate relative to the arm barrel 842. The arm barrel 842 can comprise an internal opening 1200 within which the bar 800 and receiver barrel 840 rotate about the axis of rotation 848. The bar 800 is shown in broken lines at an upward rotated position 1202. The opening 1200 can have rear surfaces 1204, 1206 into which the top and bottom surfaces of the bar 800 can move into contact to define the limits of the rotation of the bar 800 relative to the arm barrel 842. Front surfaces 1208, 1210 can be arranged so that the bar 800 never comes into contact with them (i.e., there is a gap or clearance between the front surfaces 1208, 1210), even when the bar 800 is at its extreme tilted positions about the axis of rotation 848. Thus, when the top of the bar 800 engages the rear top surface 1206 and therefore cannot rotate any further, the bar 800 may be spaced away from or out of contact with the front bottom surface 1208. Similarly, when the bottom of the bar 800 engages the rear bottom surface 1204, the top of the bar 800 can be out of contact with the front top surface 1210. This configuration can reduce the chance that the bar 800 will pinch and compress objects positioned between the bar 800 and the opening 1200 when accessed from the front side. FIG. 12 also shows an optional configuration of the arm barrel 842 wherein a rear wall 1212 is included on the arm barrel 842. The rear wall 1212 can prevent intrusion of objects into the opening 1200 from the rear side of the hinge 809.

Figure 13A:
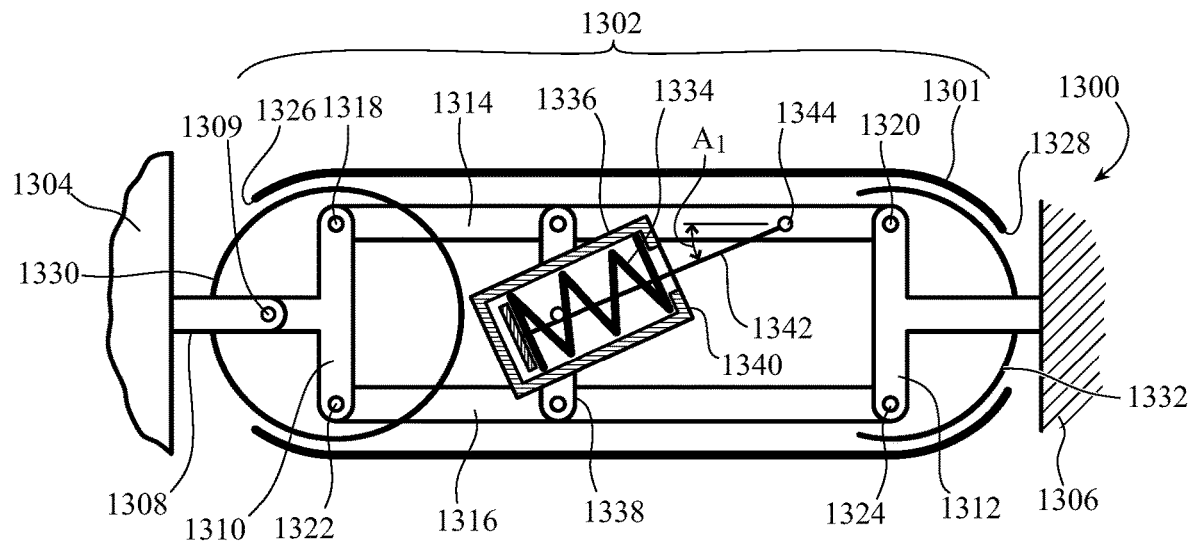
FIG. 13A shows a side section view of a lift arm connecting an electronic device to a support stand.
Figure 13B:
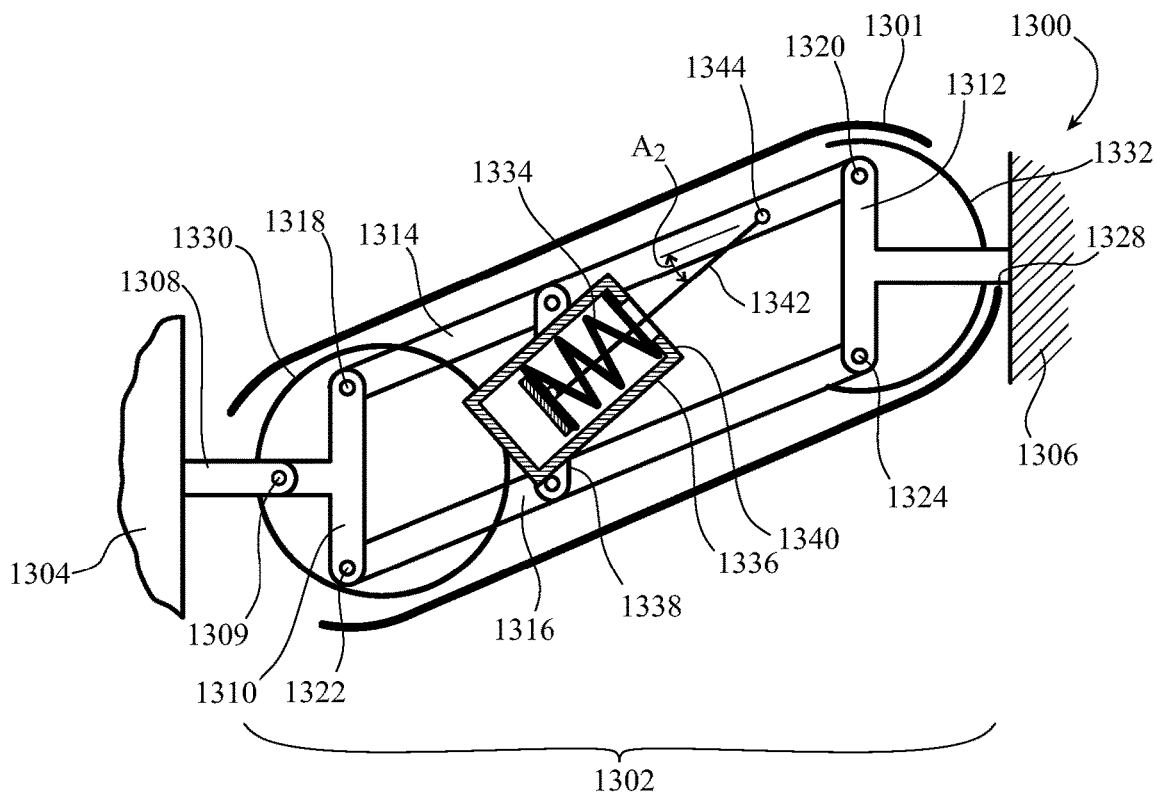
FIG. 13B shows the system of FIG. 13A in a second configuration.

FIGS. 13A-13B illustrate diagrammatic side views of a support system 1300 for an electronic device. The support system 1300 can be implemented as part of support system 100, such as for the lift arm 112 and related joints 110, 114 and connecting devices 108 and 118. The support system 1300 can include an arm assembly 1302 that extends between and joins the electronic device 1304 to a stand 1306 (or other ground surface/support surface). The arm assembly 1302 includes a housing 1301 containing support mechanisms that manage and support the vertical position of the electronic device 1304 relative to the stand 1306.

The arm assembly 1302 comprises a device attachment structure 1308 that is secured to the electronic device 1304 and is pivotable relative to a tilt connector 1310 at a tilt hinge 1309. In some embodiments, the tilt hinge 1309 has its pivot axis coaxial with a center point between attachment points 1318, 1322 on the tilt connector 1310. Tilt hinges can comprise a configuration described in connection with FIGS. 2-12 and are only shown schematically in FIG. 13A and beyond. In some embodiments, the device attachment structure 1308 and the tilt connector 1310 can be formed as a single device attachment structure 1308 (without a tilt hinge 1309) or can be collectively referred to as a device attachment structure.

A support structure 1312 is coupled to the stand 1306. In some embodiments, the support structure 1312 is a single-piece, rigid structure connected to the stand 1306 or is an integral part of the stand. The support structure 1312 can also comprise a tilt hinge (e.g., like those described in FIGS. 2-12) to give additional articulation and range of motion to the system 1300, in which case the support structure 1312 can be pivotable relative to a stand base connector (e.g., 118).

A first arm 1314 and a second arm 1316 are coupled to the tilt connector 1310 and to the support structure 1312. The tilt connector 1310 includes first and second attachment points 1318 and 1322, respectively, and the support structure 1312 includes third and fourth attachment points 1320 and 1324, respectively. The first and second arms 1314, 1316 are pivotally connected to the tilt connector 1310 and support structure 1312 at the attachment points as shown in FIGS. 13A-13B. The lengths of the arms 1314, 1316 are equal, and the distances between the first/second and third/fourth attachment points are equal, so the attachment points form corners of a parallelogram-shaped pivot profile. This configuration of pivot points and connecting parts is referred to as a "four-bar" linkage or mechanism.

As shown in FIG. 13A, the arm assembly 1302 can have a first (e.g., horizontal) position wherein the tilt connector 1310 and support structure 1312 are parallel to each other and vertical, thereby forming a rectangle with the attachment points. FIG. 13B shows that the arm assembly 1302 can be moved to a position where the electronic device 1304 is lowered downward, but the tilt connector 1310 and support structure 1312 remain parallel to each other and vertical. In this manner, the adjustment of the arm assembly 1302 beneficially does not automatically change the tilted orientation of the electronic device 1304, and it only translates up or down (along an arc-shaped path, so there is small horizontal translation as well) as the arm assembly 1302 is adjusted.

The housing 1301 has two end openings 1326, 1328 through which the device attachment structure 1308 (and/or tilt connector 1310) and support structure 1312 respectively extend. In order to prevent ingress of objects and debris into the housing 1301, sheaths 1330, 1332 can be installed at each end of the housing 1301 around the four-bar mechanism. The sheaths 1330, 1332 can have substantially circular or partially-circular shapes with sufficient size to completely cover the inside perimeters of the openings 1326, 1328 at any rotated position of the arm assembly 1302 and/or the tilt hinge 1309. In order to do so, the front sheath 1330 at the tilt hinge 1309 is configured to cover a greater range of angles (e.g., by having a circular, 360-degree side profile) because the full combined range of movement of the arm assembly 1302 and the tilt hinge 1309 can cause exposure of over 180 degrees of the circumference of the sheath 1330. The rear sheath 1332 can have a substantially C-shaped or have a 180-degree-coverage/semicircular side profile due to only needing to cover the opening 1328 during rotation of the four-bar mechanism at the support structure 1312. FIGS. 13A-13B show how the sheaths 1330, 1332 can have portions radially overlapping the housing 1301 (relative to the center points between attachment points 1318, 1320, 1322, 1324) at multiple angles of rotation of the arm assembly 1302.

A counterbalance mechanism can be used in conjunction with the four-bar mechanism to help prevent the weight of the electronic device 1304 from causing downward sagging relative to the stand 1306 and to make the amount of force required to raise the electronic device 1304 by rotating the arm assembly 1302 more equal to the amount of force needed to lower the electronic device 1304 by rotating the arm assembly 1302. The counterbalance mechanism can include at least one spring 1334 positioned within a retainer 1336 at a position between the first and second arms 1314, 1316 and between the tilt connector 1310 and the support structure 1312. In some embodiments, a retainer bar 1338 can extend between the arms 1314, 1316 with pivot points attached to the arms 1314, 1316 along a line parallel to the ends of the four-bar mechanism, as shown in FIGS. 13A-13B. The retainer 1336 can then be pivotally connected to the retainer bar 1338 with the spring 1334 inside. In some configurations, the retainer 1336 does not constrain the sides of the spring 1334 and only constrains one end of the spring 1334 with a spring retention portion 1340.

The retainer 1336 can have a spring retention portion 1340 (e.g., a ledge, ridge, or protrusion) configured to engage and contact an end of the spring 1334. Thus, the spring retention portion 1340 can prevent the spring 1334 from separating from (e.g., pulling out or falling out of) the retainer 1336. In some embodiments, the spring retention portion 1340 can be a part providing mechanical interference to movement of the end of the spring 1334 relative to the retainer 1336. In some embodiments, the spring retention portion 1340 can comprise a fastener, weld, or other attachment feature that joins the end of the spring 1334 to the retainer 1336 and thereby prevents the end of the spring 1334 from moving relative to the retainer 1336.

The counterbalance mechanism can also comprise a rod 1342 that is pivotally connected to the first or second arm 1314, 1316 at a rod pivot point 1344. The opposite end of the rod 1342 can extend through or around the spring 1334 and can be coupled to an end of the spring 1334 positioned on the spring 1334 opposite the rod pivot point 1344. As shown in FIGS. 13A-13B, the rod 1342 can have a flared end that forms a platform against which the end of the spring 1334 can abut and contact. In some embodiments, the end of the rod 1342 can be affixed or attached to the end of the spring 1334, such as by being fastened or welded in a manner that links the movement of the rod to the movement of the end of the spring 1334.

As the four-bar mechanism rotates, the rod 1342 of the counterbalance mechanism also rotates due to movement of the first arm 1314 and movement of the retainer 1336 (via movement of retainer bar 1338). The rod 1342 is not parallel to one of the sides of the four-bar mechanism and does not have its spring-coupled end coupled to the other arm (i.e., 1316), so the rod 1342 therefore does not rotate at the same angular velocity as the arm to which it is connected (i.e., 1314). Accordingly, the angle between the rod 1342 and the arm 1314 decreases as the first arm 1314 pivots about third attachment point 1320, as shown by comparing their relative angles $A_1$ and $A_2$ in FIGS. 13A-13B.

Decreasing angle A (e.g., going from $A_1$ to $A_2$) causes the rod 1342 to compress the spring 1334 within the retainer 1336. This is due to the coupling of the end of the rod 1342 with the spring 1334 that applies a compressive force to the spring 1334 (directed along the length of the rod 1342 toward the rod pivot point 1344) and due to the coupling of the spring retention portion 1340 and the spring 1334 preventing the spring 1334 from being pulled out of the retainer 1336 (i.e., providing a force resisting the compressive force of the rod 1342). If angle A increases (e.g., going from $A_2$ to $A_1$), the spring 1334 releases energy as it presses against the spring retention portion 1340 and the end of the rod 1342. The spring 1334 can therefore store potential energy as the electronic device 1304 moves downward and can release potential energy as the device 1304 moves upward, thereby assisting the user in raising the device and slowing the descent of the device when it moves downward. Friction disks can be added to the attachment points 1318, 1320, 1322, 1324 to add additional frictional resistance to movement of the four-bar mechanism so that the arm assembly 1302 has a firm and predictable feel.

The positioning of the rod pivot point 1344 and the retainer bar 1338 relative to each other and relative the arms 1314, 1316 can therefore define the rate at which the spring 1334 is compressed (or decompressed) by the rotation of the arm assembly 1302. As such, the spring, retainer, and rod can be designed to cause a predetermined amount of potential energy to be stored or released as the arm assembly 1302 is rotated. For example, these components can be designed based on the mass of the electronic device and the mass of the rest of the arm assembly 1302 to make the storage of energy in the spring 1334 closely follow the loss of potential energy in the device 1304 (and arm), and vice versa. A large variety of springs can be used for the spring 1334, including compression springs, leaf springs, multiple springs used in series or in parallel, springs with a linear spring constant, springs with a non-liner spring constant, and combinations thereof.

Figure 14A:
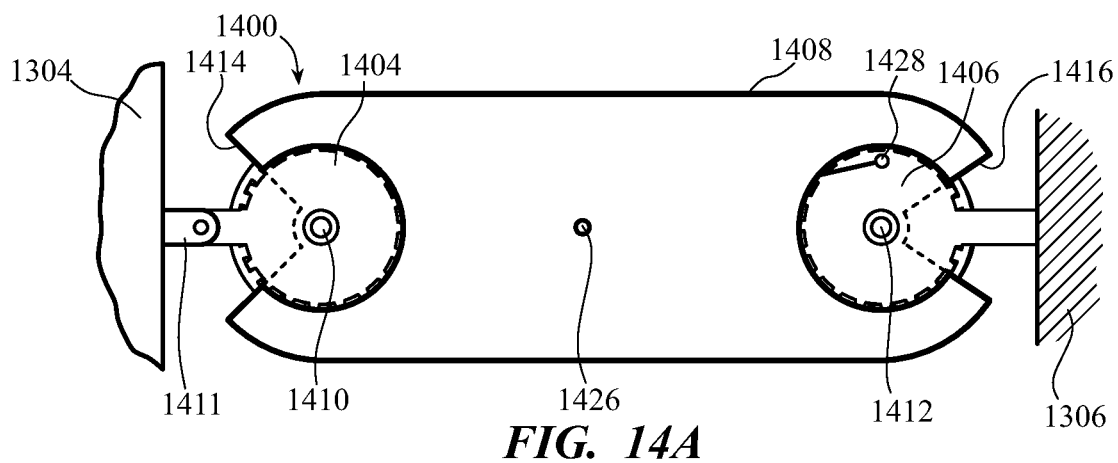
FIG. 14A shows a side view of another lift arm connecting an electronic device to a support stand with some components omitted.
Figure 14B:
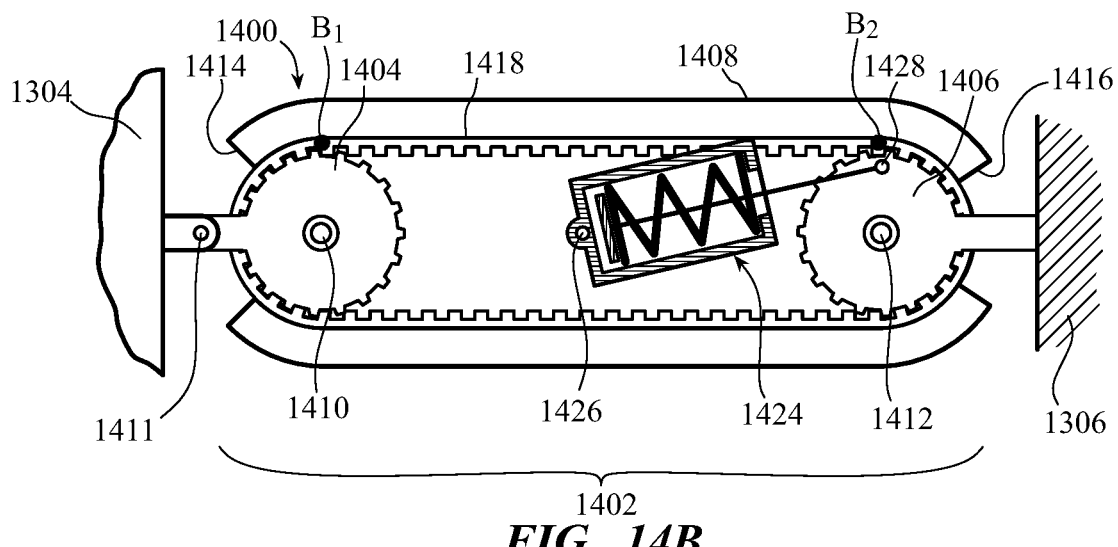
FIG. 14B shows a side section view of the lift arm of FIG. 14A with additional components shown.
Figure 14C:
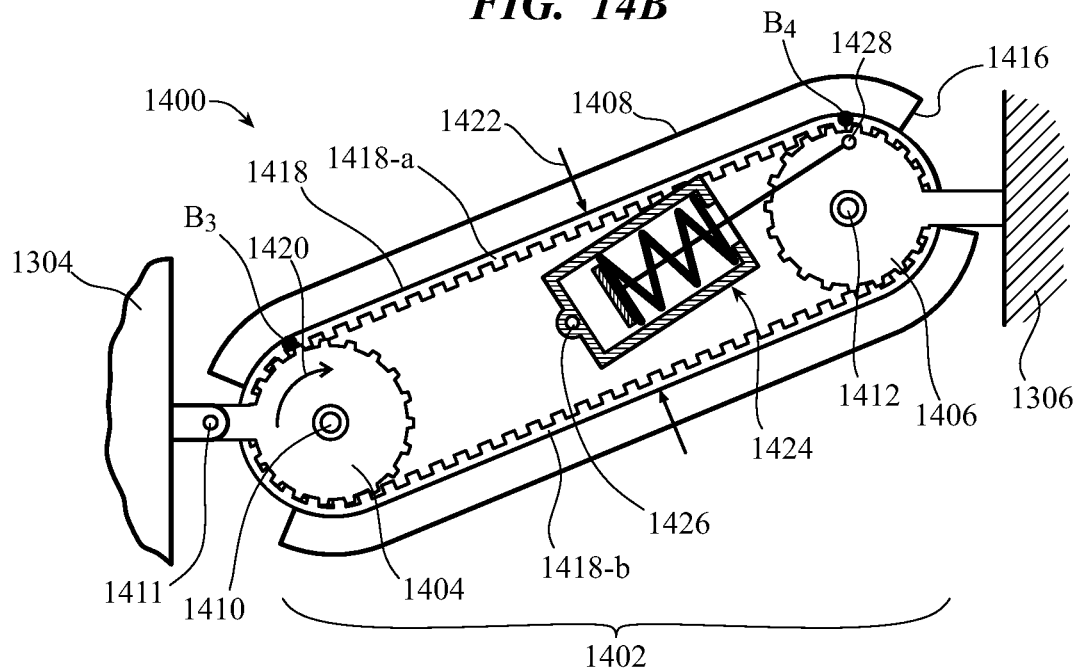
FIG. 14C shows the system of FIG. 14B in a second configuration.

FIGS. 14A-14C show side views of another embodiment of a lift system 1400 with an arm assembly 1402 connectable to an electronic device 1304 and stand 1306. FIG. 14A shows a side view of a device attachment structure 1404, a support structure 1406, and an arm-housing 1408 that is pivotally connected to the device attachment structure 1404 and the support structure 1406 at pivot joints 1410 and 1412, respectively. The device attachment structure 1404 can have a tilt joint 1411 offset from the pivot joint 1410 of the arm-housing 1408 or can have a tilt joint at pivot joint 1410 that allows the electronic device 1304 to pivot relative to the rest of the device attachment structure 1404.

The arm-housing 1408 can function similar to arm 1314 or arm 1316 by providing a rigid link between the pivot joints 1410, 1412. The arm-housing 1408 can also be configured to enclose and cover at least one side of the device attachment structure 1404 and the support structure 1406. In FIG. 14A, the arm-housing 1408 covers their back sides. The arm-housing 1408 can also extend over and around the device attachment structure 1404 and the support structure 1406 and can therefore serve a purpose similar to the housing 1301 by covering the top and bottom surfaces of the device attachment structure 1404 and the support structure 1406. End openings 1414, 1416 can be formed in the arm-housing 1408 to allow the device attachment structure 1404 and the support structure 1406 to protrude from the enclosure.

As shown in FIG. 14B, the system 1400 can further include a belt 1418 extending between and wrapped around the device attachment structure 1404 and the support structure 1406. The belt 1418 can comprise a series of engagement features (e.g., teeth or ridges) that extend radially inward relative to the pivot joints 1410, 1412 and the axis linking the pivot joints 1410, 1412. The engagement features can be configured to engage grooves, gear teeth, or recesses extending around the outer circumferences of the device attachment structure 1404 and the support structure 1406. The engagement features of the belt 1418, device attachment structure 1404, and support structure 1406 can thereby prevent the belt 1418 from sliding and make the belt 1418 incapable of sliding while in contact with the corresponding engagement features on the outer surfaces of the device attachment structure 1404 and the support structure 1406.

The belt 1418 is configured to link the rotation of the device attachment structure 1404 and the support structure 1406 as they respectively rotate about the pivot joints 1410, 1412. Accordingly, as shown in FIGS. 14B and 14C, the device attachment structure 1404 and the support structure 1406 rotate at the same rate as the arm-housing 1408, thereby ensuring that the electronic device 1304 and the stand 1306 maintain their angular positions relative to each other, similar to the operation of the four-bar mechanism. For instance, these figures show that the device 1304 remains vertical and parallel to the vertical surface of the stand 1306 as the system 1400 rotates about pivot joint 1412. The belt 1418 contributes to this behavior by acting in tension between the device attachment structure 1404 and the support structure 1406.

As the device attachment structure 1404 or the support structure 1406 rotates, the other structure also rotates due to being acted upon (e.g., pulled) by the belt 1418. As the system 1400 moves the electronic device 1304 downward, tension in the top portion of the belt 1418-*a* rotates the device attachment structure 1404 clockwise (i.e., in direction 1420 about joint 1410). Tension in the bottom portion 1418-*b* can also rotate the device attachment structure 1404 clockwise. As the system 1400 moves the device upward, tension in the bottom section of the belt 1418-*b* rotates device attachment structure 1404 counterclockwise about joint 1410. Tension in the top portion 1418-*a* can assist as well. As a result, the belt 1418 can flexibly provide a non-sliding link between the device attachment structure 1404 and the support structure 1406, wherein the belt 1418 applies tension between the top side of the device attachment structure 1404 and the support structure 1406 and/or the bottom sides thereof depending on the direction of movement of the lift system 1400.

Additionally, the points between which tension is applied to the belt 1418 can change as the lift system 1400 is operated. In the position of FIG. 14B, the belt 1418 is under tension between points $B_1$ and $B_2$ on the belt, but in the position of FIG. 14C, rotation of the device attachment structure 1404 and the support structure 1406 (and their non-sliding link to the belt 1418) causes the tension to be between points $B_3$ and $B_4$, which are each positioned on the belt 1418 closer to the electronic device 1304 (and positioned counterclockwise around the circumferences of the structures 1404, 1406) than points $B_1$ and $B_2$, respectively. Accordingly, the operation of the lift system 1400 can include a set of moving tension points on the belt 1418. The moving tension points (e.g., points $B_1$ through $B_4$) can move along one direction along the length of the belt 1418, as shown by FIGS. 14B and 14C where points $B_1$ through $B_4$ move along the top portion 1418-*a* of the belt toward the electronic device 1304, as the lift system 1400 moves in one direction (e.g., downward). The tension limits can move in the opposite direction as the lift system 1400 moves in the opposite direction (e.g., upward, as shown in movement from the position of FIG. 14C to the position of FIG. 14B). Similar movement of the tension limits would continue (i.e., even further away from the electronic device 1304 on top of the device attachment structure 1404 and the support structure 1406) if the electronic device 1304 moves to a raised position relative to FIG. 14B.

The belt 1418 can comprise a strap including rubber, fabric, rope, string, fiber, composite, or similar flexible material configured to reshape itself to the surfaces of the device attachment structure 1404 and the support structure 1406 as it wraps and unwraps their outer circumferences. In some embodiments, the belt 1418 can comprise another similar structure, such as a chain that is configured to engage teeth or grooves on the device attachment structure 1404 and the support structure 1406.

In some embodiments, the arm-housing 1408 can further comprise tensioning protrusions, pins, or rollers (not shown)

that are configured to keep the belt 1418 in tension and to reduce blowback and slack between the belt 1418 and the device attachment structure 1404 and the support structure 1406. For instance, the protrusions or rollers can apply inward forces 1422 as shown in FIG. 14C.

Furthermore, as shown in FIGS. 14B and 14C, the lift system 1400 can include a counterbalance mechanism 1424. The counterbalance mechanism 1424 can comprise a retainer, spring, and rod as described above in connection with FIGS. 13A-13B and can thereby store and release potential energy corresponding to the loss or gain of potential energy of the electronic device 1304 and lift system 1400. The counterbalance mechanism 1424 can have connections to pivot point 1426 attached to the arm-housing 1408 and pivot point 1428 attached to the support structure 1406. The system 1400 can also comprise sheaths such as 1330 and 1332 (not shown in FIGS. 14A-14C).

Pivot point 1426 is shown positioned at the opposite end of the retainer as compared to the opening through which the rod of the counterbalance mechanism 1424. In some embodiments, the pivot point 1426 can be positioned at the opening in the retainer or along the length between the ends of the retainer, such as the pivot point shown in FIGS. 13A-13B. Furthermore, in some embodiments, the spring can be an extension spring, wherein the spring is configured to store energy by extension of its length. For instance, the rod can be connected to the end of the extension spring, and the retainer can be connected to the opposite end of the extension spring. Rotation of the link arm can then rotate the rod in a manner extending the spring, depending on the location of the rod pivot point and the pivot point 1426 of the retainer, as will be understood by those having skill in the art and hindsight benefit of the present disclosure.

Figure 15A:
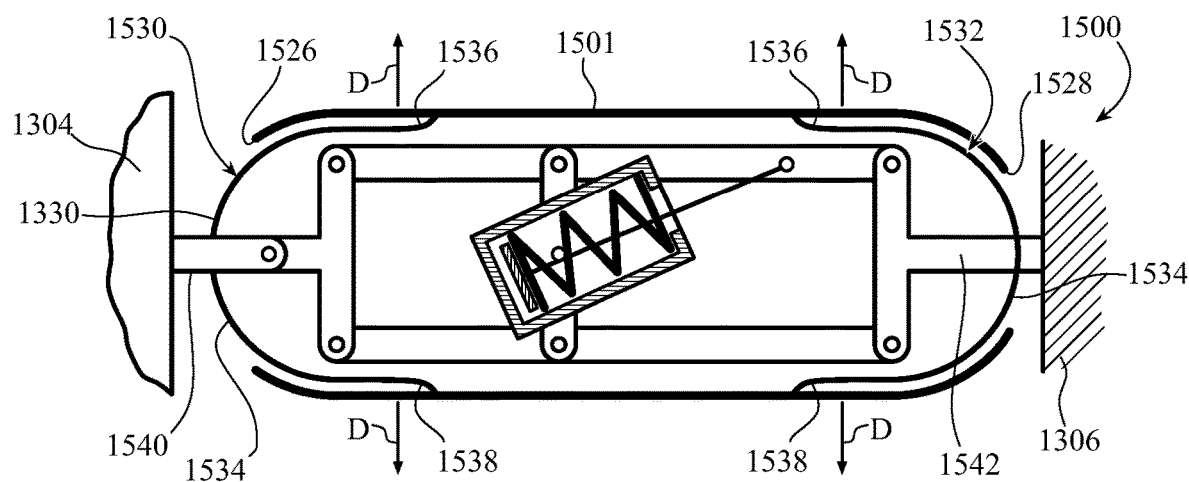
FIG. 15A shows a side section view of another lift arm connecting an electronic device to a support stand.
Figure 15B:
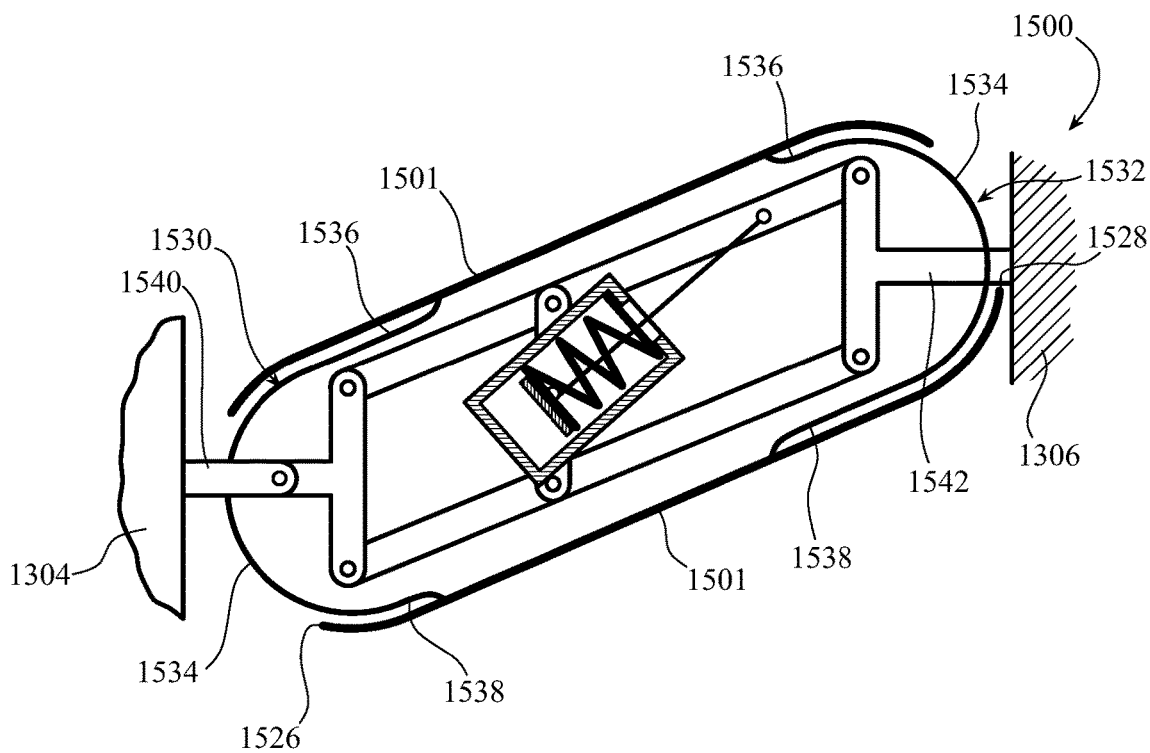
FIG. 15B shows the system of FIG. 15A in a second configuration.

FIGS. 15A and 15B show yet another embodiment of a lift system 1500. This embodiment comprises structures that operate similar to the system of FIGS. 13A-13B. However, rather than having rigid sheaths 1330, 1332, the system 1500 includes flexible sheaths 1530, 1532 that cover the end openings 1526, 1528 of the housing 1501 and conceal internal parts. The flexible sheaths 1530, 1532 can each comprise a convex portion 1534 positioned between two concave portions 1536, 1538. Alternatively, the convex portion 1534 can be referred to as a central portion, and the concave portions 1536, 1538 can be referred to as end portions. A device attachment structure 1540 extends through the center of the front flexible sheath 1530, and a support structure 1542 extends through the center of the rear flexible sheath 1532. In some embodiments, the sheaths 1530, 1532 can be integrally formed with or attached to the device attachment structure 1540 and the support structure 1542, respectively.

In a first position wherein the housing 1501 is horizontal and extends perpendicular to the electronic device 1304 and the stand 1306, as shown in FIG. 15A, the convex portion 1534 and concave portions 1536, 1538 are vertically symmetrical (i.e., mirrored in shape across a horizontal axis), and the concave portions 1536, 1538 extend into the internal cavity of the housing 1501 to equal depths relative to the opening 1526. The convex portion 1534 covers the entire end opening 1526, and the end tips of the concave portions 1536, 1538 contact the inner surface of the housing 1501. In a second position wherein the housing 1501 is rotated and angled relative to the electronic device 1304 and stand 1306, as shown in FIG. 15B, the front and rear flexible sheaths 1530, 1532 deform to accommodate the movement of the housing 1501. Specifically, the front flexible sheath 1530 has its upper concave portion 1536 slide to move deeper into the housing 1501 relative to the opening 1526, and its lower concave portion 1538 slides relative to the housing 1501 to a position closer to the opening 1526. The opposite is true for the rear flexible sheath 1532, as shown in FIG. 15B. Thus, as the housing 1501 (and the support mechanisms within the housing 1501) rotate and move, the flexible sheaths 1530, 1532 can deform to adapt to the movements. The lengths of the front and rear flexible sheaths 1530, 1532 can be designed to ensure that the tips at the ends of the concave portions 1536, 1538 slide along the internal surface parallel to the longitudinal axis of the housing 1501 and do not come out of the openings 1526, 1528 even when the device attachment structure 1540 and support structure 1542 are at their most extreme rotated positions relative to the housing 1501.

In some cases, the flexible sheaths 1530, 1532 can slide along the inner surface of the housing 1501, thereby sweeping debris or other objects out of the space between the housing 1501 and the sheaths 1530, 1532 and preventing material from passing into the housing 1501 internal to the sheaths 1530, 1532. In some embodiments, the flexible sheaths 1530, 1532 can engage the inner lip of their respective opening 1526 or 1528 and can remain in contact with the inner lip to block out intruding objects.

In some embodiments, the flexible sheaths 1530, 1532 apply outward pressure to the housing 1501, as indicated by arrows D that are oriented perpendicular to a longitudinal axis extending across the housing 1501. The flexible sheaths 1530, 1532 can therefore maintain contact with the inner surface of the housing 1501 as they slide along the inner surface of the housing 1501 due to rotation of the housing 1501. The contact with the inner surface can help preserve a seal and barrier that prevents ingress of debris or objects into the housing 1501 between the housing 1501 and the flexible sheaths 1530, 1532.

The flexible sheaths 1530, 1532 can each comprise a single piece of flexible material such as a sheet of metal, plastic, composite, rubber, or similar material configured to resiliently bend and unbend. In some embodiments, the sheaths 1530, 1532 can include a set of bendably linked or hinge-linked segments that can bend or fold to adapt to the movement of the housing 1501 relative to the device attachment structure 1540 and the support structure 1542. Thus, some configurations can be referred to as having a "garage door" arrangement of rigid yet hinged parts. In some embodiments, ends of the sheaths 1530, 1532 can be guided by rails, tracks or other support surfaces that ensure the ends of the sheaths do not undesirably fall or slip into interference or contact with the arm assembly or counterbalance mechanisms within the housing 1501.

Using the flexible sheaths 1530, 1532 can advantageously leave the interior of the housing 1501 substantially open, thereby allowing the arm support assembly and counterbalance mechanisms to use that space. A device maker can use larger, longer parts within the housing 1501 or can reduce the length of the arm due to the parts not needing a sheath (e.g., 1330) that extends radially inward relative to the longitudinal axis of the housing (e.g., 1301). This can save costs, simplify manufacturing and assembly, and reduce weight.

Figure 16A:
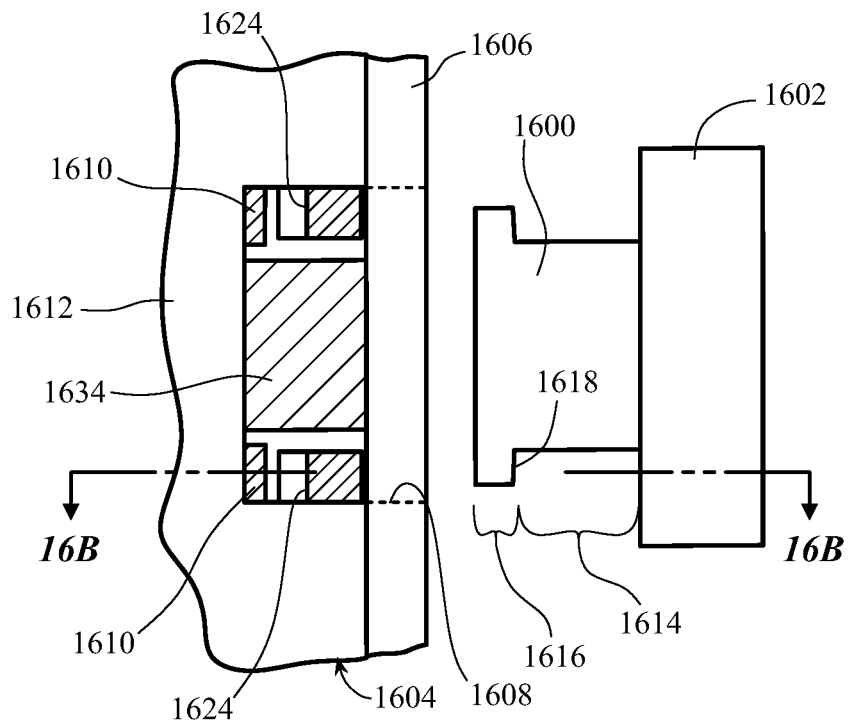
FIG. 16A shows a partial exploded top section view of an interconnection system between an electronic device and a support stand.
Figure 16B:
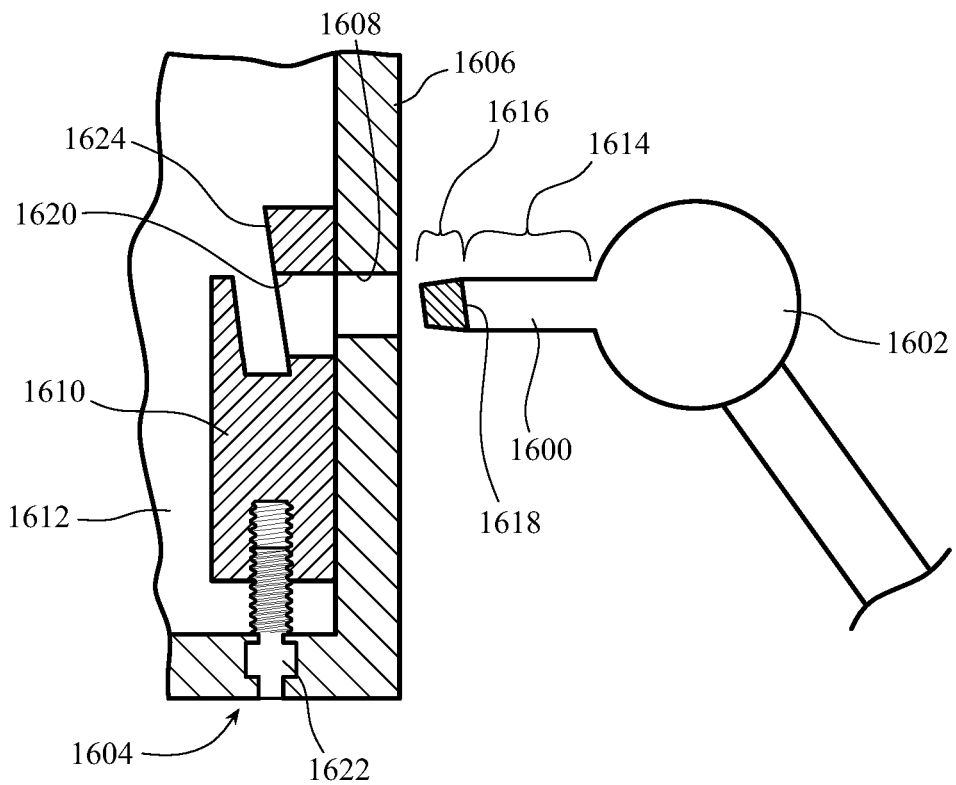
FIG. 16B shows a partial side section view of the system of FIG. 16A as taken through section lines 16B-16B in FIG. 16A.
Figure 17A:
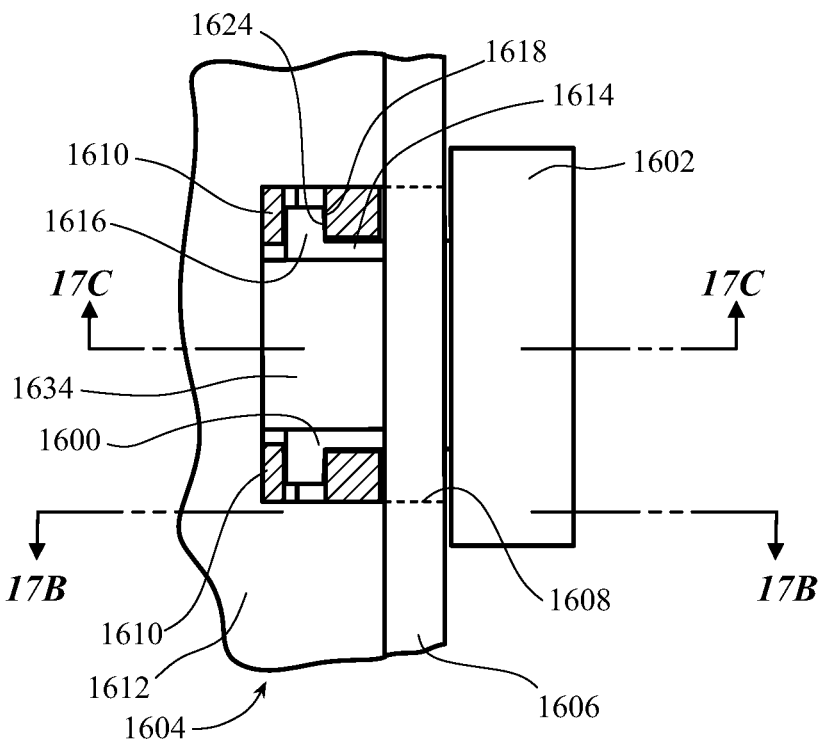
FIG. 17A shows a partial top section view of the interconnection system of FIG. 16A in an assembled configuration.
Figure 17B:
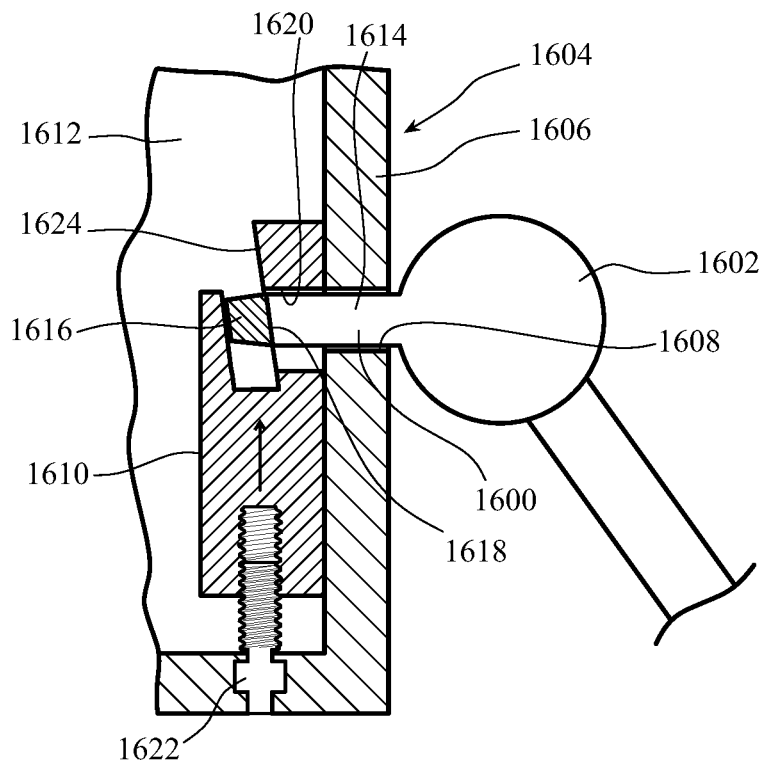
FIG. 17B shows a partial side section view of the system of FIG. 17A as taken through section lines 17B-17B in FIG. 17A.
Figure 17C:
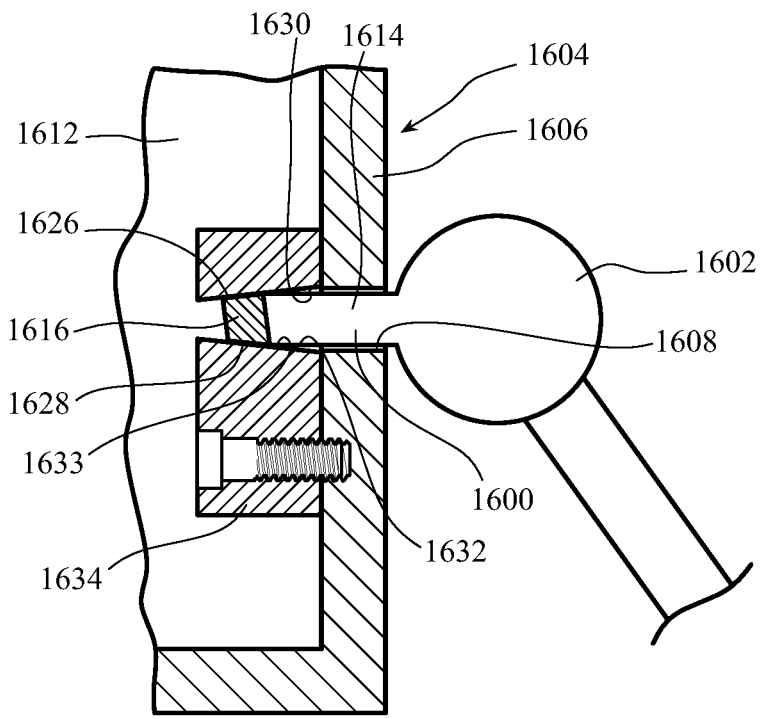
FIG. 17C shows a partial side section view of the system of FIG. 17A as taken through section lines 17C-17C in FIG. 17A.
Figure 18:
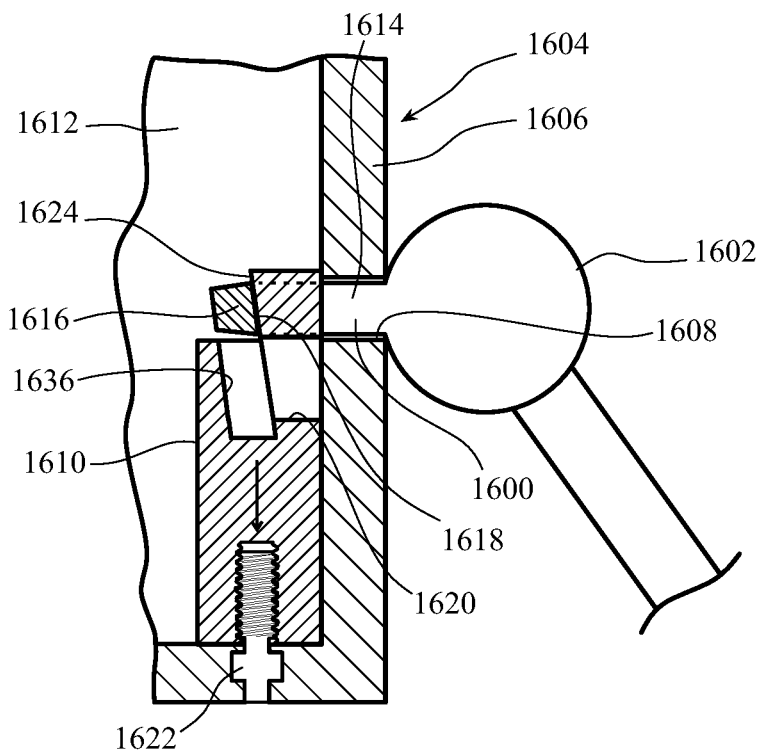
FIG. 18 shows a partial side section view of the interconnection system of FIG. 17A in a different assembled configuration.
Figure 19:
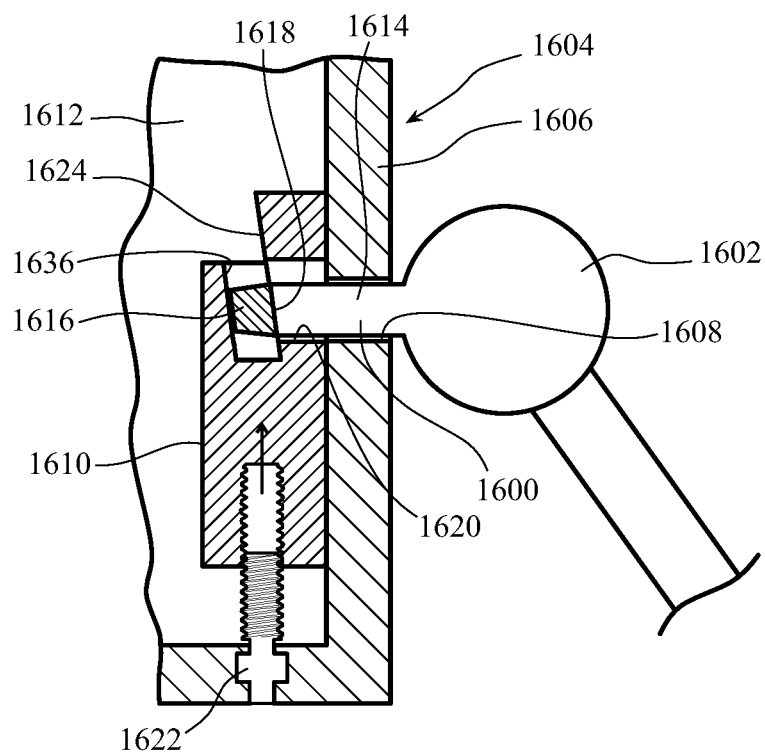
FIG. 19 shows a partial side section view of the interconnection system of FIG. 17A in another different assembled configuration.

Another aspect of the disclosure relates to systems and methods for connecting a support stand to an electronic device, wherein the support stand includes a protrusion or bar that is configured to engage a receiver or lock mechanism of the electronic device. FIGS. 16A-19 illustrate various views of an embodiment of a system wherein a protrusion 1600 of a support stand 1602 is securely connectable to an electronic device 1604. The device 1604 can include a housing 1606 with an opening 1608 for receiving the protrusion 1600 and a lock mechanism 1610 (i.e., a latch) positioned internal to the opening 1608 (i.e., within a cavity 1612 formed within the device 1602). FIG. 16A shows a top view of the interface between the protrusion 1600 and the electronic device 1604 with the protrusion 1600 and stand 1602 positioned spaced away from the opening 1608 (i.e., in an un-connected position). FIG. 16B shows a side section view as taken through section lines 16B-16B in FIG. 16A. FIG. 17A shows a top view with the protrusion 1600 in a second position relative to the housing 1606, wherein the protrusion 1600 is inserted into the opening 1608 but not locked in place by the lock mechanism 1610. FIG. 17B is a side section view as taken through section lines 17B-17B in FIG. 17A. FIG. 17C is a side section view of the interface as taken through section lines 17C-17C in FIG. 17A. FIG. 18 shows a side section view at a position similar to the position of FIG. 17B but with the lock mechanism 1610 locking the protrusion 1600 into position within the housing 1606. FIG. 19 shows a similar side section view with the lock mechanism 1610 in a position configured to eject the protrusion 1600 from the housing 1606.

The protrusion 1600 can comprise a narrow portion 1614 and a wide portion 1616, as shown in FIGS. 16A and 16B. These portions 1614, 1616 can form a shoulder surface 1618 at their convergence that faces substantially outward relative to the electronic device 1604. The lock mechanism 1610 can include a passage 1620 through which at least the wide portion 1616 of the protrusion 1600 is inserted as the protrusion is moved from an external position relative to the lock mechanism 1610 (FIGS. 16A and 16B) and an inserted, internal position (FIGS. 17A and 17B). The protrusion 1600 can be inserted into the lock mechanism 1610 to a sufficient depth that the shoulder surface 1618 is fully positioned through the passage 1620.

With the protrusion 1600 in the position shown in FIG. 17B, the lock mechanism 1610 can be operated (e.g., via adjustment mechanism/screw 1622) to translate downward and to move the passage 1620 to a position where the protrusion is no longer retractable out of the passage 1620 or opening 1608 due to mechanical interference contact between the shoulder surface 1618 and a front-facing surface 1624, as shown in FIG. 18. The lock mechanism 1610 is capable of moving downward in this manner because the rotation of the adjustment mechanism 1622 drives threads on the lock mechanism 1610 to translate the lock mechanism 1610 along the axis of rotation of the adjustment mechanism 1622. The lock mechanism 1610 moves from a position vertically offset from the wide portion 1616 of the protrusion 1600, as shown in FIGS. 16B and 17B, into a position obstructing the wide portion 1616, as shown in FIG. 18. The adjustment mechanism 1622 can be positioned extending through a bottom surface of the housing 1606, a lateral side surface of the housing, or a top surface of the housing.

Additionally, the front-facing surface 1624 of the lock mechanism 1610 can have a ramped or sloped surface that is closer to the housing 1606 at the end nearest to the protrusion 1600 and is farther from the housing 1606 above that end. Thus, as the lock mechanism 1610 moves downward, it can come into contact with the shoulder surface 1618 and can draw the shoulder surface 1618 inward (i.e., through the opening 1608 and deeper into the electronic device, perpendicular to the direction of movement of the lock mechanism 1610), thereby reducing or eliminating slop or wobble between the protrusion and the lock mechanism 1610. Downward movement of the lock mechanism 1610 can proportionally drive additional inward movement of the protrusion 1600 until any gaps are eliminated.

Furthermore, as shown in FIG. 17C, the protrusion 1600 can comprise guide surfaces 1626, 1628 that come into contact with guide surfaces 1630, 1632 in an opening 1633 of a central block 1634 within the cavity 1612. Thus, progressive inward movement of the protrusion 1600 can cause the guide surfaces to slide against each other to orient the protrusion 1600 to a desired position and angle relative to the central block 1634 in the housing 1606, similar to other guide surfaces disclosed herein. The contact between guide surfaces, and their sloped, receding ramp orientation, can prevent movement of the protrusion 1600 in six degrees of freedom relative to the block 1634. The block 1634 can remain stationary relative to the housing 1606 or can be built into or formed as part of the housing 1606.

The adjustment mechanism 1622 can also be operated in the other direction (e.g., rotated about its axis of rotation in an opposite direction as compared to the direction driven in FIG. 18) to move the lock mechanism 1610 upward, as shown in FIG. 19. Moving the lock mechanism upward 1610 moves the front-facing surface 1624 out of the way of the shoulder surface 1618 and thereby permits the protrusion 1600 to move out of the passage 1620 and opening 1608 again.

Additionally, if the lock mechanism 1610 is moved sufficiently far enough upward, such as to the position shown in FIG. 19, a rear-facing surface 1636 (i.e., an ejection surface) of the lock mechanism 1610 can be driven up against the wide portion 1616 of the protrusion 1600 and can thereby apply a force to the protrusion 1600 that pushes it out of the opening 1608 (i.e., in a direction substantially perpendicular to the direction of movement of the lock mechanism 1610). In some embodiments, the front-facing end of the wide portion 1616 can have a sloped or ramped surface configured to engage the rear-facing surface 1636 to facilitate smooth sliding of the protrusion 1600 along the rear-facing surface 1636 as the protrusion 1600 is ejected. The rear-facing surface can also be oriented non-orthogonally relative to a longitudinal axis of the protrusion 1600 so that as it moves, the ejecting force it applies to the protrusion 1600 increases. The passage 1620 can also have a vertical dimension that exceeds the vertical height of the protrusion 1600 so that there is sufficient clearance for the protrusion 1600 to remain in the passage 1620 while the lock mechanism 1610 moves upward to eject the protrusion, as shown in FIG. 17B (showing the passage 1620 having extra space below the protrusion 1600) and FIG. 19 (showing the passage 1620 having extra space above the protrusion 1600).

Thus, the system of FIGS. 16A-19 can be used to provide a rigid, reversible link between a protrusion of a stand and a lock within an electronic device. Additionally, the positioning of the external devices can be reversed. In other words, the stand 1602 can be an electronic device, and the electronic device 1604 can be a stand or other attachment base.

Figure 20:
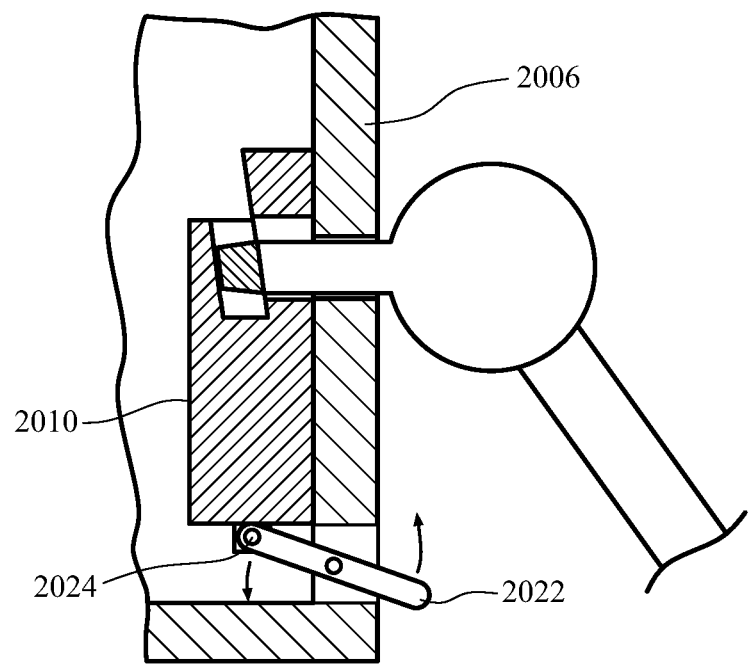
FIG. 20 shows a partial side section view of another interconnection system using a lock mechanism/latch operated by a lever.

Various other kinds of adjustment mechanisms can be used in addition to, or in place of, the screw-type adjustment mechanism 1622. For example, as shown in FIG. 20, the vertical translation of a lock mechanism 2010 can be caused by a pivoting lever 2022 having an end 2024 attached to or abutting the lock mechanism 2010. Downward rotation of the lever 2022 (on the outside of the housing 2006) can drive the lock mechanism 2010 upward, and upward rotation of the lever 2022 (on the outside of the housing 2006) can drive the lock mechanism 2010 downward. Implementation of a lever 2022 can eliminate the need for a tool to operate the adjustment mechanism and can change the amount of force and torque required as compared to another adjustment mechanism (e.g., 1622). It also allows the adjustment to be achieved from a different direction (i.e., through a different surface of the housing 1606)—through the rear side surface rather than through a top or bottom surface.

Figure 21:
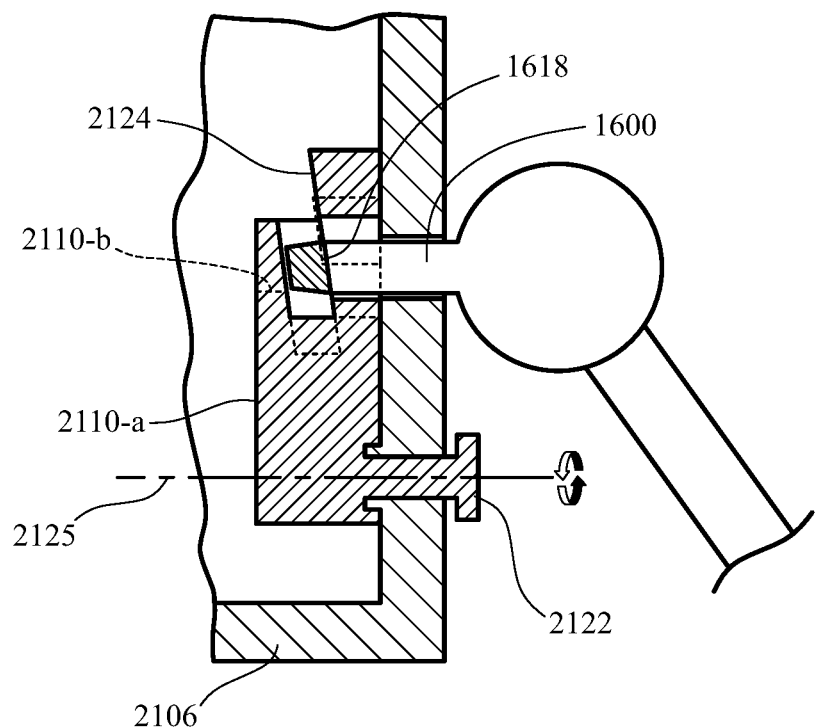
FIG. 21 shows a partial side section view of another interconnection system using a rotatable lock mechanism/latch.

FIG. 21 shows an embodiment wherein the lock mechanism 2110 is rotatable relative to the housing 2106 using an adjustment portion 2122 that is accessible from the outside of the housing 2106. Rotation of the adjustment portion 2122 about rotation axis 2125 can cause the lock mechanism 2110 to rotate from an unlocked position (2110-*a* shown in solid lines in FIG. 21) to a locked position (2110-*b* shown in broken lines in FIG. 21) and vice versa. The front-facing surface 2124 moves downward as it rotates until it reaches engagement with the shoulder surface 1618 and thereby prevents withdrawal of the protrusion 1600 from the housing 2106. Further rotation of the lock mechanism 2110 drives the protrusion 1600 further inward due to protrusion movement along the slope of the front-facing surface 2124. As a result, rotation of the lock mechanism 2110 can be used to secure the protrusion 1600 in place within the housing 2106 instead of linear translation of the lock mechanism 2110. Rotation of the adjustment portion 2122 can be achieved by accessing the adjustment portion 2122 from a rear surface of the housing 2106, which can improve ergonomics and allow other features (or no features at all) to be positioned around the edges of the housing 2106.

Figure 22:
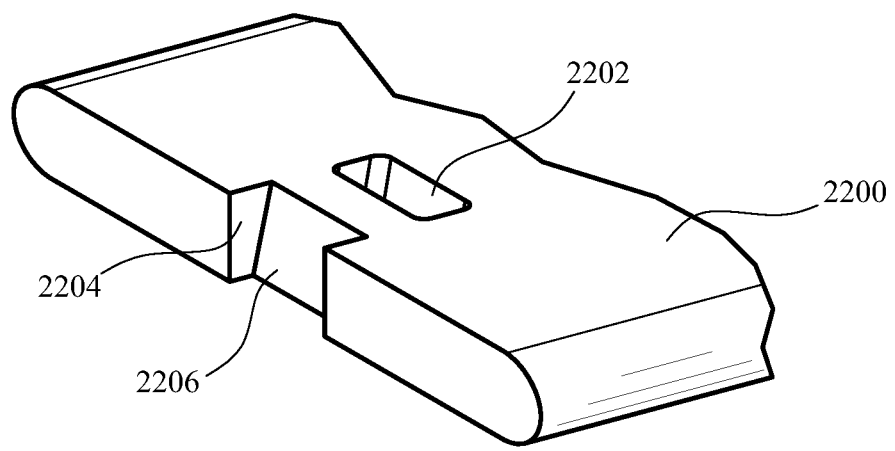
FIG. 22 shows a partial perspective view of an end of a protrusion for an interconnection system of another embodiment of the present disclosure.
Figure 23A:
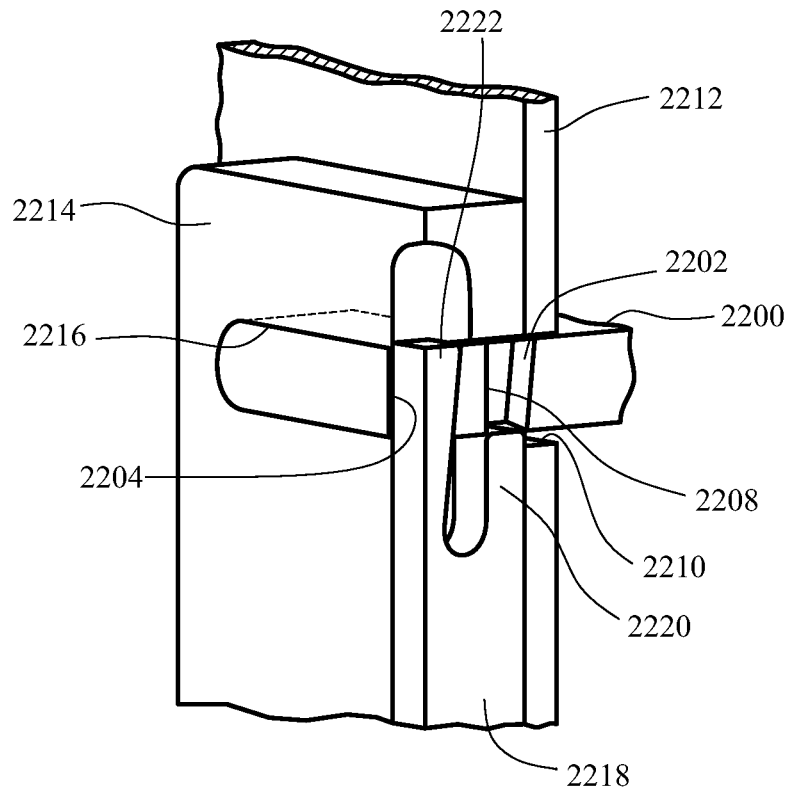
FIG. 23A shows a partial perspective section view of the interconnection system using the protrusion of FIG. 22 as taken through section lines 23A-23A in FIG. 23B.

FIG. 22 shows another embodiment of a terminal end of a protrusion 2200 configured to engage with and connect to an electronic device (e.g., device 1604). Rather than having a narrow portion and a wide portion with a shoulder surface positioned at the transition between those portions, the protrusion 2200 comprises a consistent width along its length and includes an aperture 2202 positioned between the sides of the protrusion 2200, such as at a center thereof. The protrusion 2200 can also have an end recess 2204 aligned with the aperture 2202 (e.g., centered in the protrusion 2200). The aperture 2202 and recess 2204 can have sloped surfaces (e.g., their substantially vertical sides) such as outer surface 2206 positioned in the recess 2204 and, as shown in FIG. 23A, inner surface 2208 positioned in the aperture 2202. The aperture 2202 can extend through the protrusion 2200 substantially perpendicular to a longitudinal axis of the protrusion that intersects the aperture 2202 and the recess 2204.

The protrusion 2200 can be inserted through an opening 2210 in a housing 2212 of an electronic device and into a retainer block 2214 having an opening 2216 with guide surfaces similar to guide surfaces of central block 1634. The end of the protrusion 2200 can therefore be guided into a tight and snug position engaging the opening 2216 similar to the position shown and described with respect to FIG. 17C.

Figure 23B:
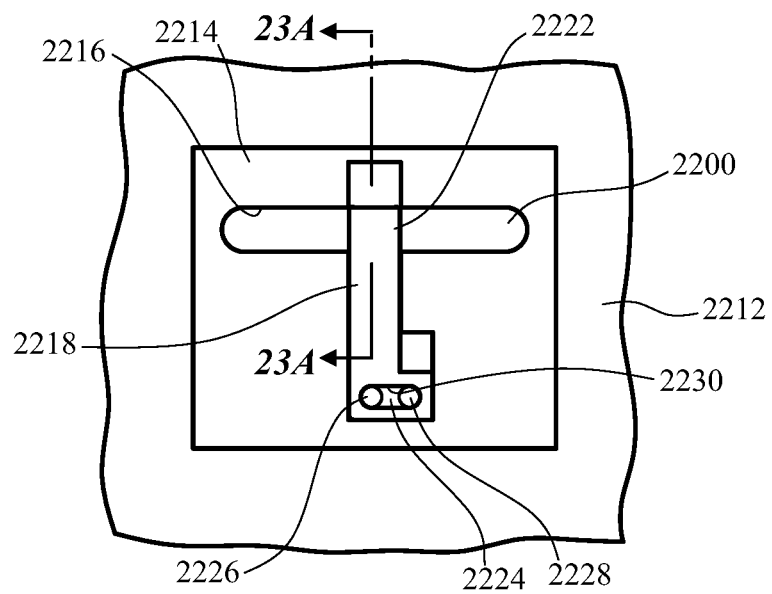
FIG. 23B shows a partial front view of the interconnection system of FIGS. 22 and 23A in an unlocked configuration.
Figure 24A:
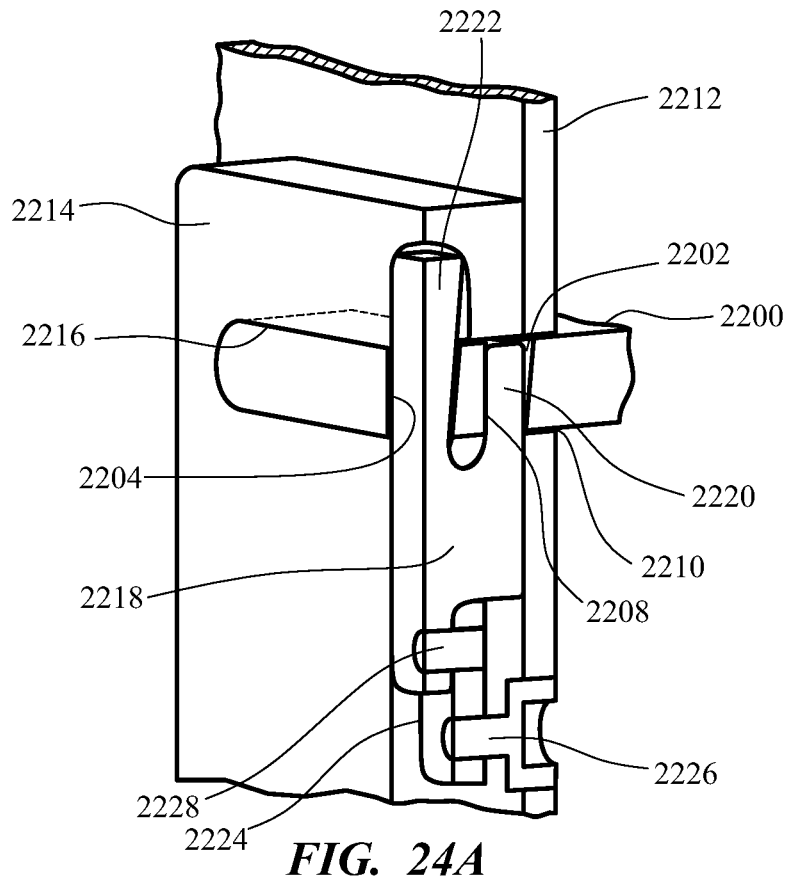
FIG. 24A shows a partial perspective section view of the interconnection system using the protrusion of FIG. 22 as taken through section liens 24A-24A in FIG. 24B.
Figure 24B:
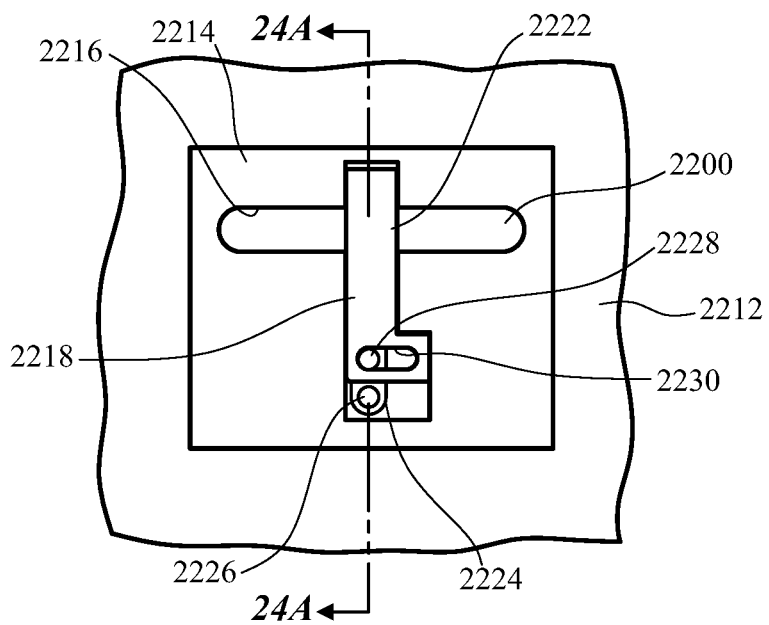
FIG. 24B shows a partial front view of the interconnection system of FIGS. 22 and 23A in a locked configuration.

FIG. 23A shows a perspective section view as taken through section lines 23A-23A in FIG. 23B, and FIG. 24A shows a perspective section view as taken through section lines 24A-24A in FIG. 24B. FIGS. 23B and 24B show front views of the assembly of the protrusion 2200 inserted into the retainer block 2214 and housing 2212 with a latch 2218 in different locking positions.

In the unlocked position of FIGS. 23A-23B, the protrusion 2200 is shown inserted into the retainer block 2214 past a wedge-like (or hook-like) portion 2220 of a latch 2218 with the aperture 2202 positioned over the wedge-like portion 2220 of the latch 2218. The protrusion 2200 is insertable to this position through the opening 2210 because the wedge-like portion 2220 is in a lowered position that leaves the opening 2210 unobstructed from within the housing 2212. In the locked position of FIGS. 24A-24B, the protrusion 2200 is locked in the housing 2212 by the latch 2218 due to the wedge-like portion 2220 being moved upward, into the aperture 2202, and against the inner surface 2208 thereof. The wedge-like portion 2220 can comprise a front-facing surface that engages the inner surface 2208 and that has a ramp, curvature, or slope that moves the protrusion 2200 inward through the opening 2210 as the latch 2218 moves upward, similar to how vertical motion of the front-facing surface 1624 drives the protrusion 1600 inward in a previously described embodiment.

The latch 2218 can also have an ejector portion 2222 which, in the locked position, is out of contact with the recess 2204, but, in the unlocked position, has a rearward-facing surface that engages the outer surface 2206 of the recess 2204 and has a sloped surface angle that urges the protrusion in a direction directed back out of the opening 2210. The force applied by that rearward-facing surface can increase in magnitude the further the latch 2218 moves downward.

A link 2224 and set of pins 2226, 2228 (see FIGS. 24A-24B) can be used to move the latch 2218 between the unlocked and locked positions. The link 2224 can be rotatable about a rotation axis pin 2226, such as via a crank or by using a tool inserted into an externally-accessible recess in the pin 2226. See FIG. 24A. The rest of the link 2224 can therefore be rotated about the rotation axis pin 2226 between the position shown in FIG. 23B and the position shown in FIGS. 24A-24B. A follower pin 2228 can be positioned in and received by a cam opening 2230 at a bottom end of the latch 2218, so when the follower pin 2228 rotates about the rotation axis pin 2226, the latch 2218 is guided and slides upward or downward due to the pin 2228 applying upward or downward pressure to the latch 2218 via the cam opening 2230. Accordingly, FIGS. 23B-24B show an alternative way for a latch 2218 to be driven by a rotational input being converted to a linear translation of a lock within the housing. This rotational drive input can be used with the other latches/lock mechanisms described herein.

With any of the embodiments described in connection with FIGS. 16A-24B, the various types of lock mechanisms, adjustment mechanisms, latches, and pins can be used interchangeably. Thus, a latch 2218 can be configured to move using a lever 2022 or screw-type adjustment mechanism 1622, and the lock mechanism 1610 can use a rotatable link 2224, pins 2226, 2228, and cam opening 2230 to be adjusted. Thus, various combinations and modifications of the embodiments described herein can be made to adapt the interconnection systems and assemblies in ways that are customized to the needs of a designer or user.

FIGS. 25A-25C show another configuration of a stand-to-electronic device interconnection system 2500. These figures show a right side view of a stand 2502 with a shaft 2504 configured to be attached to a bar 2506 within a housing 2508 of an electronic device 2510. A fastener 2512 can join and attach the shaft 2504 to the bar 2506 at an attachment interface. When in the position shown in FIG. 25A, the shaft 2504 is inserted into the housing 2508 through an opening 2514 (rendering the fastener 2512 inaccessible), and a lock 2516 is positioned in a recess 2518 formed in the bar 2506. The bar 2506 has a pivoting connection to the housing 2508 at pivot axis 2520, but with the end of the lock 2516 in the recess 2518, rotation of the bar 2506 out of the opening 2514 is prevented due to mechanical interference with the lock 2516. Accordingly, the shaft 2504 is locked within the housing 2508 and is unable to be withdrawn and removed from the bar 2506 due to the presence of the fastener 2512 and the rotational immobilization of the bar 2506. FIG. 25A can therefore be referred to as being a locked configuration of the system 2500. This configuration can beneficially hide the fastener 2512 from normal view or access from the rear of the housing 2508, thereby giving the system 2500 heightened security and a cleaner, fastener-free appearance that reduces consumer confusion regarding which parts of the device are computing ports and which parts are structural to the electronic device.

When a user wishes to unlock the interconnection system 2500 and remove the shaft 2504 from the bar 2506, the fastener 2512 must be removed. To access the fastener, a user can insert a thin tool 2522 (e.g., a credit card, spudger, flexible rod, probe, or other piece of narrow and/or flexible material) into a gap between the opening 2514 of the housing 2508 and the bar 2506 so that the tool 2522 contacts a rear-facing surface of the lock 2516, as shown in FIG. 25B. In some embodiments, the user also applies an inward-directed force to the shaft 2504 to assist in pivoting rotation of the bottom end of the lock 2516 so that it is removed from the recess 2518. The lock 2516 and bar 2506 can have parallel axes of rotation. As the lock 2516 rotates away from the recess 2518, the tool 2522 can block the end of the lock 2516 from re-entering the recess 2518, and the bar 2506 can rotate at pivot axis 2520 to a position exposing the end of the bar 2506 through the opening 2514 sufficient to expose the fastener 2512, as shown in FIG. 25C. In some embodiments, the bar 2506 may be biased to rotate toward the exposed and unlocked position shown in FIG. 25C. In the exposed and unlocked position of FIG. 25C, the fastener 2512 can be accessed and removed, thereby allowing the shaft 2504 and bar 2506 to be separated from each other.

Applying an inward-directed force to the end of the bar 2506 while it is in the position shown in FIG. 25C can cause it to rotate about the pivot axis 2520 to a position where the end of the lock 2516 is gravitationally drawn back into the recess 2518 to thereby automatically lock the bar 2506 in the position of FIG. 25A again. In some embodiments, the lock 2516 can include a biasing device configured to apply a biasing torque to the lock 2516 that makes it rotate its end downward in a manner that prevents the lock 2516 from being dislodged from the recess 2518 due to a change in the direction of gravity working on the device.

The system 2500 can be used with other embodiments disclosed herein. For instance, the housing 2508 can be part of a support stand for an electronic device, and the stand 2502 can instead be an electronic device. The stand 2502 can comprise a lift arm, such as one of the arm systems described in connection with FIGS. 13A-15B. Accordingly, elements of various embodiments provided herein can be used interchangeably with other embodiments described herein.

Figure 26A:
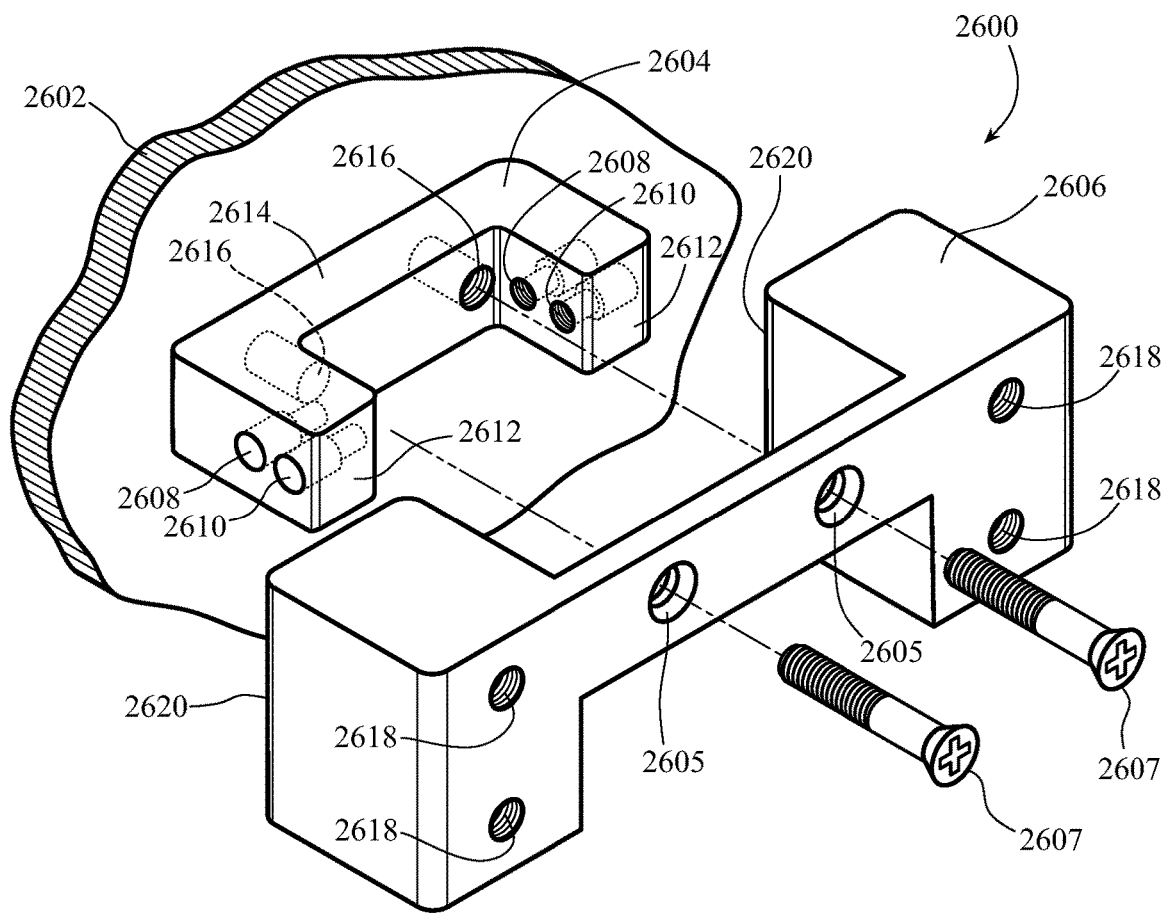
FIG. 26A shows a partial perspective view of another interconnection system.
Figure 26B:
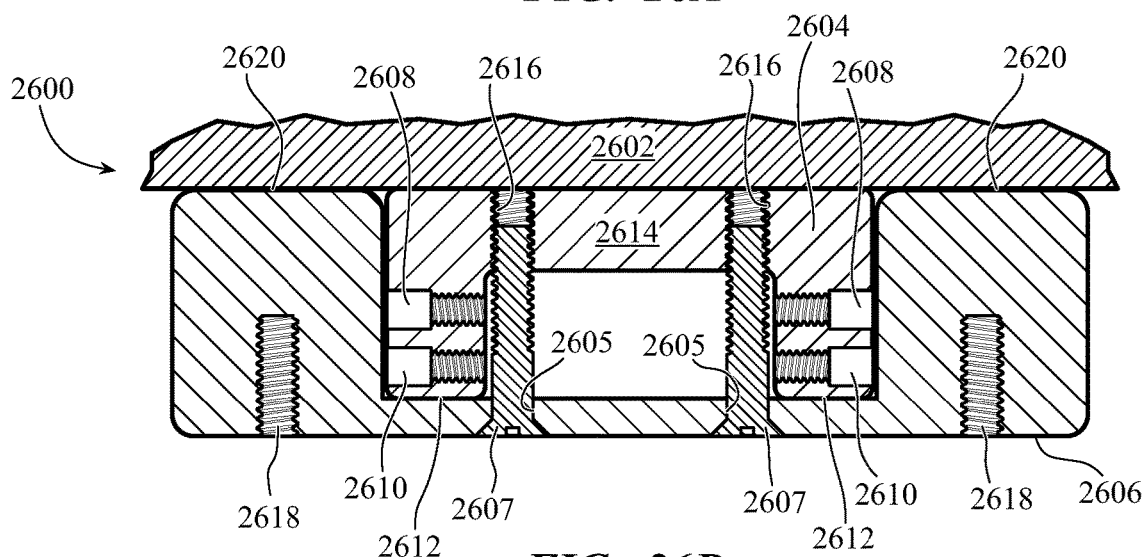
FIG. 26B shows a top section view of the system of FIG. 26A.

FIG. 26A shows a partial perspective view of another interconnection system 2600 of the present disclosure. The system 2600 can connect an electronic device 2602 having a rear protrusion 2604 to a mount adapter 2606. FIG. 26B shows a top section view of the system 2600 with the mount adapter 2606 assembled to the rear protrusion 2604 and with fasteners 2607 securing the mount adapter 2606 to the rear protrusion 2604. The section view of FIG. 26B is taken through the central openings 2605 in the mount adapter 2606.

The rear protrusion 2604 is rigidly anchored and connected to the electronic device 2602 (which may include attachment using any of the embodiments shown and described with respect to FIGS. 16A-25C), thereby preventing the protrusion 2604 from substantially moving relative to the electronic device 2602. The rear protrusion 2604 can be used to connect the electronic device 2602 to various hinge and support devices. In some embodiments, the rear protrusion 2604 can be used as a bar or device attachment structure (e.g., 108, 300, 400, 500, 600, 700, 800, 1308, or 1404) mountable to a tilt hinge using a pair of aligned lateral openings 2608 configured to receive a shaft or fastener (e.g., 408, 808, etc.) used to mount the protrusion 2604 to a receiver barrel (e.g., 840) or receiver opening (e.g., 320). The rear protrusion 2604 can comprise additional aligned lateral openings 2610 configured to connect to laterally-inserted fasteners or shafts of other tilt hinges (e.g., hinges having lateral openings or bores at a different depth relative to bores that would align with openings 2608). The lateral openings 2608, 2610 can be positioned on rearward-extending projections 2612 of the rear protrusion 2604. The rear protrusion 2604 can also comprise a middle portion 2614 having a set of rearward-facing openings 2616. Other embodiments disclosed herein can also implement the sets of lateral openings 2608, 2610 and rearward-facing openings 2616, such as the bar and device attachment structures described above. In one example, one set of lateral openings 2608 may be used in connection to a tilt mechanism, while the other set of lateral openings 2610 may be used for connection with a lift mechanism (or vice versa). Thus, in some embodiments, the rear protrusion 2604 may be configured to be used in multiple applications, including coupling to a tilt mechanism, coupling to a lift mechanism, coupling to a rigid or fixed mount, coupling to a mount adapter, or to some other mount or connection system, including coupling with any of the systems or embodiments described herein without the need to modify the rear protrusion 2604.

The mount adapter 2606 can be positioned to align the central openings 2605 with the rearward-facing openings 2616 so that the fasteners 2607 can securely join the adapter 2606 to the rear protrusion 2604. The mount adapter 2606 can also comprise a set of rear-accessible openings 2618. The rear-accessible openings 2618 can be used to attach the mount adapter 2606 (and the electronic device 2602, via the protrusion 2604) to a support stand using fasteners attachable to the rear-accessible openings 2618. In some embodiments, the size and spacing of the rear-accessible openings 2618 can be configured to follow standardized size and spacing metrics, such as by arranging the rear-accessible openings 2618 to be VESA-compatible or to comply with another type of monitor/computing device support standard. Alternatively, the rear-accessible openings 2618 can be arranged and configured to connect to a unique stand design.

In some embodiments, the mount adapter 2606 can comprise at least one front facing surface 2620 configured to engage a rear facing surface 2622 of the electronic device 2602 when the mount adapter 2606 is in use. The front facing surface 2620 can help stabilize the adapter 2606 and ensure a rigid, non-wobbling connection between the mount adapter 2606 and the electronic device 2602 (via the fasteners 2607).

Figure 27:
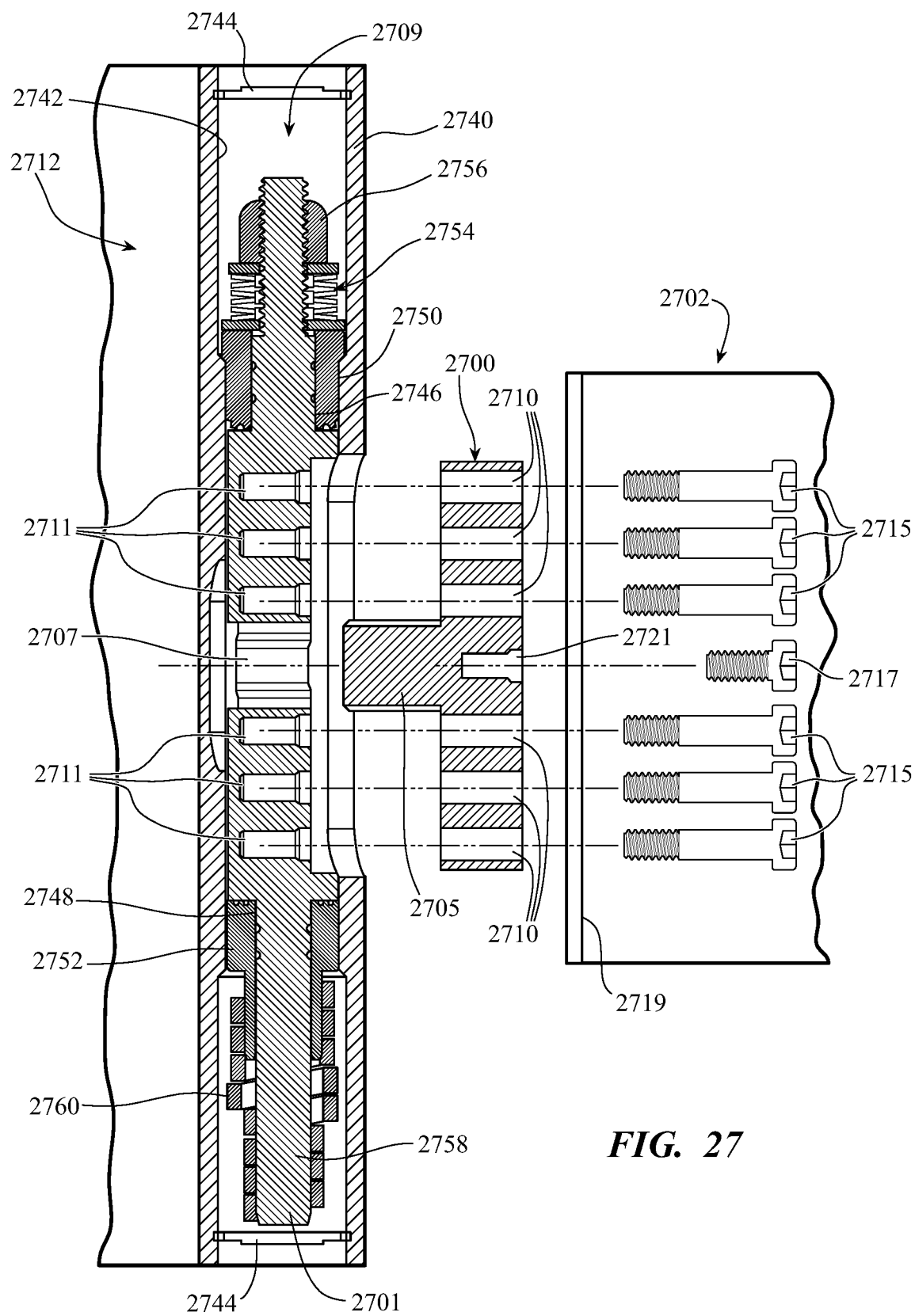
FIG. 27 shows a partially exploded top section view of a tilt hinge assembly.
Figure 28:
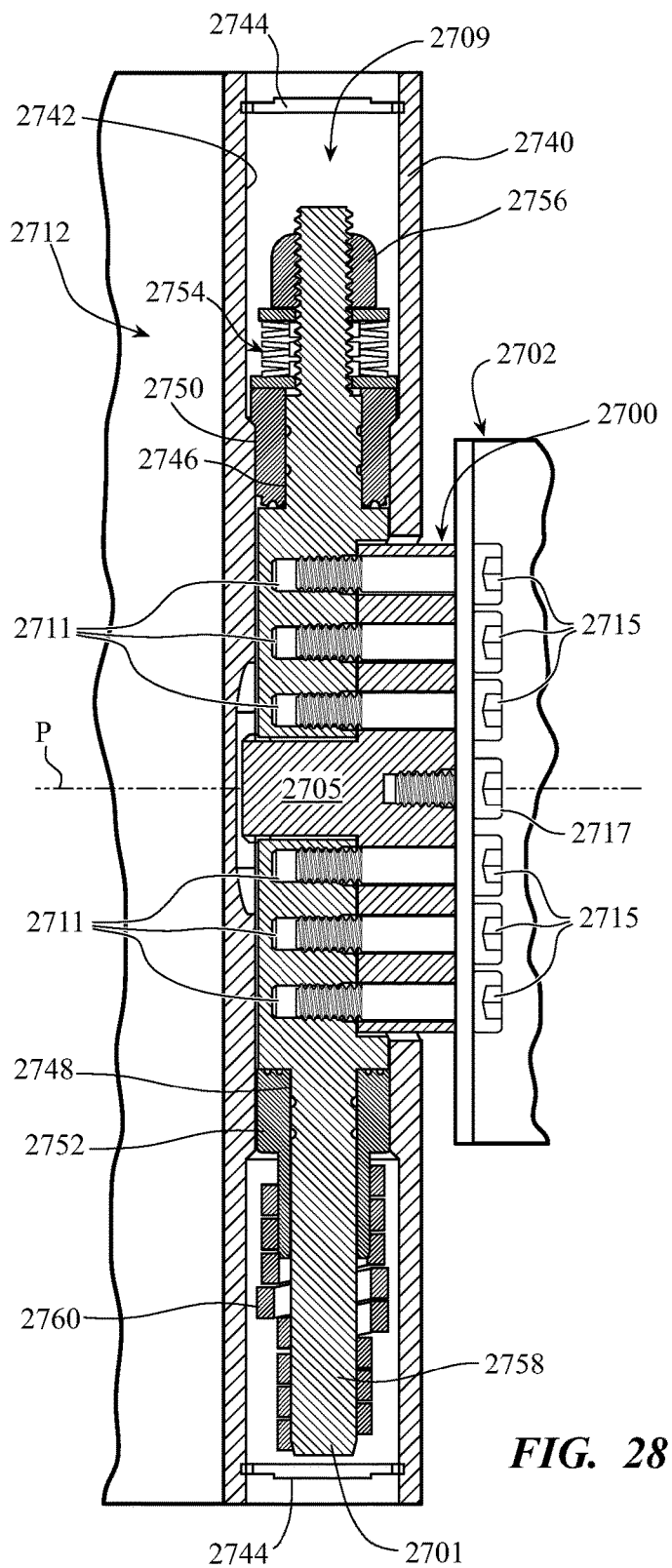
FIG. 28 shows an assembled top section view of the tilt hinge assembly of FIG. 27.
Figure 29:
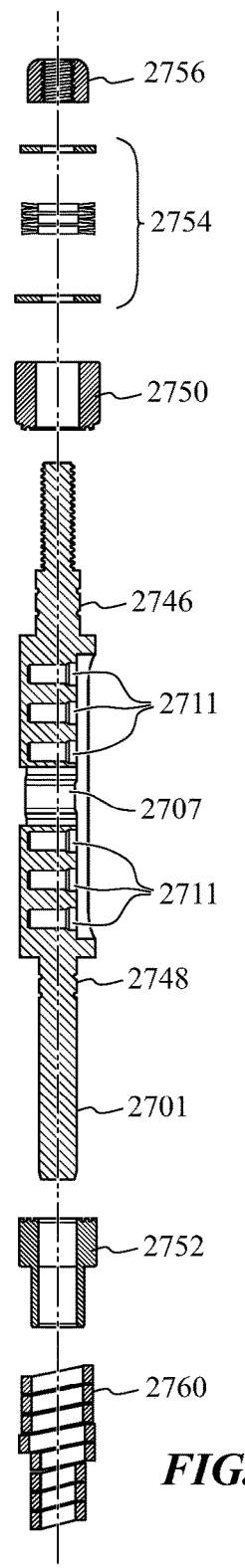
FIG. 29 shows an exploded top section view of internal components of the tilt hinge assembly of FIG. 27.

FIG. 27 illustrates a partially exploded top section view of a connection assembly for a bar 2700 connectable to an electronic device 2702 and a tilt hinge 2709 that is connected to a support stand 2712. FIG. 28 shows an assembled top section view with the bar 2700 incorporated into the tilt hinge 2709. FIG. 29 shows an exploded top section view of the inner parts of the tilt hinge 2709. The bar 2700 includes a set of axially-parallel openings 2710 configured to align with corresponding axial openings 2711 on a pin 2701 that is rotatably mounted to the lift arm 2712 within an outer barrel 2740. The sets of openings 2710, 2711 can receive a set of corresponding fasteners 2715. The fasteners 2715 can be used to fixedly mount the bar 2700 to the pin 2701 and to effectively join their structures to act as a single piece. In this manner, the pin 2701 and bar 2700 can collectively perform the functions of the bar 800, shafts 808-*a*, 808-*b*, and receiver barrel 840 of the related embodiment of FIGS. 8-12.

The bar 2700, pin 2701, and electronic device 2702 can form a display portion of the assembly that tilts at the tilt hinge 2709 relative to the lift arm 2712. Using the fasteners 2715 can enable the tilt hinge 2709 to be assembled without externally-accessible fasteners (e.g., shafts 808) being exposed from the sides of the outer barrel 1240. In other words, the fasteners 2715 can only be seen and accessed or adjusted if the user has access to the inside of the housing of the electronic device 2702, i.e., an area that is hidden from view when the device 2702 and lift arm 2712 are in an assembled condition.

The outer barrel 1240 can define an interior cavity 2742 in which the inner moving parts of the tilt hinge 2709 are positioned, and the interior cavity 2742 can be closed off on its terminal ends by caps 2744 that prevent access to the tilt hinge 2709, such as by end users or contaminants. The bar 2700 and the electronic device 2702 can be installed to the tilt hinge 2709 along an axis perpendicular to the longitudinal axis of the pin 2701 (i.e., along the dotted lines in FIG. 27). The fasteners 2715 can be hidden from the end user or observer of the electronic device 2702 and stand, thereby giving the overall assembly a clean appearance and a construction that resists unwanted removal of the electronic device 2702 from the lift arm 2712 (e.g., theft) or collection of dust and debris on the fasteners.

The pin 2701 can be installed in the interior cavity 2742 by locating a pair of outer surfaces 2746, 2748 of the pin 2701 within bearings or bushings 2750, 2752 that are secured in place (e.g., affixed, welded in place, press-fit, attached using fasteners, etc.) to the outer barrel 2740 in the interior cavity 2742. Thus, the bearings or bushings 2750, 2752 can be stationary relative to the outer barrel 2740 while the pin 2701 rotates about its longitudinal axis, and the bearings or bushings 2750, 2752 can prevent the longitudinal axis of the pin 2701 aligned with the centers of the bushings 2750, 2752 from moving relative to the outer barrel 2740. The combination of the bar 2700 and the pin 2701 can beneficially keep the bar 2700 properly constrained and prevented from wobbling due to the tight fitment between the bearings or bushings 2750, 2752 and the pin 2701 and the secure fitment of the bar 2700 to the pin 2701 by the fasteners 2715.

An additional fastener 2717 can be installed between a rear wall 2719 of the electronic device 2712 and an assembly opening 2721 of the bar 2700. This fastener 2717 can be referred to as an assembly fastener or guide fastener because it can be used to assemble the bar 2700 to the rear wall 2719 before the other pin-attaching fasteners 2715 are installed. Thus, the guide fastener 2717 can be installed to help ease the assembly of the pin-attaching fasteners 2715 by holding the bar 2700 in place relative to the rear wall 2719 while the openings 2710, 2711 are being aligned and filled by the pin-attaching fasteners 2715 during assembly.

A set of friction disk components 2754 can be held in place between a bushing 2750 and an end nut 2756 mounted to threads at an end of the pin 2701. FIG. 29 shows these components in an exploded state, and FIG. 28 shows them in an assembled state. The friction disk components 2754 can operate as friction disks 852, such as to apply frictional resistance to the relative movement of the barrels 840, 842. See also the descriptions of the embodiment of FIGS. 8-12, which apply to the friction disk components 2754 as well. The amount of friction applied by the friction disk components 2754 can be adjusted by adjusting the compression of those components 2754 by the end nut 2756, thereby permitting adjustment of the amount of force required to change the tilt angle of the tilt hinge 2709.

The opposite end of the pin 2701 can include an end portion 2758 on which an optional spring 2760 (e.g., a torsion spring or other elastically resilient member, such as other resilient structures described or disclosed herein) is mounted. The spring 2760 can have features and functions in common with spring 850 of the embodiment of FIGS. 8-12, including, at least in part, a first end attached to (e.g., friction-fitted, welded, or fastened to) the pin 2701 and a second end attached to (e.g., friction-fitted, welded, or fastened to) the bearing or bushing 2752. Thus, the descriptions of the spring 850 can apply to spring 2760.

In some embodiments, the spring 2760 can include one or more coils or loops having a first diameter coupled with an end of the pin 2701 and one or more coils having a second diameter (e.g., a larger diameter) coupled with the bearing or bushing 2752. The attachment between these parts 2701, 2760, 2752 can cause the potential energy of the spring 2760 to increase or decrease as there is relative rotation between the pin 2701 and the outer barrel 2740. Accordingly, the spring 2760 can be used to bias the rotation of the pin 2701 toward a desired "home" or "default" position where the potential energy of the spring 2760 is the lowest. In some embodiments, this position is a horizontal position, as shown in FIG. 1C. The number of coils or loops on the ends of the spring 2760 can correspond to the amount of friction needed to securely hold the spring 2760 to the pin 2701 and to the bearing or bushing 2752 without sliding, particularly when the spring 2760 is held in place by a press-fit or friction-fit. In some embodiments, the coils or loops of the spring 2760 have a length of at least three circumferences of their corresponding pin 2701 outer circumference or bushing 2752 outer circumference against which they engage and contact so that the spring 2760 does not slip relative to the pin 2701 or bushing 2752 as the tilt hinge 2709 rotates. In some embodiments, one circumference length or less is provided for each coil or loop, and the ends of the spring 2760 are fastened or welded to the outer surfaces of the pin 2701 and bushing 2752, thereby minimizing the overall longitudinal length of the spring 2760. See also the embodiment of FIGS. 31-35 herein.

The spring 2760 can be configured to assist the user in adjusting the tilt of the electronic device 2702 when the bottom of the device is tilted forward (i.e., the movement of the electronic device 102 from the position of FIG. 1B to the position shown in FIG. 1C) by applying a torque to the pin 2701 and outer barrel 2740 that helps the device rotate in that direction at the tilt hinge 2709. The spring 2760 also can resist rotation of the electronic device 2702 when the device is rotated in the opposite direction (e.g., the direction shown by the movement of the electronic device from the position of FIG. 1C to the position of FIG. 1B) by storing potential energy and applying a resisting torque to the tilt hinge 2709. In this manner, the spring 2760 can improve the ergonomics of the stand (e.g., 104) by making the electronic device require substantially similar (e.g., equal) torque to pivot at the tilt hinge 2709 whether it is tilted in a forward or backward direction (i.e., in a clockwise or counterclockwise direction as viewed from a lateral side thereof/parallel to the axis of rotation). The resistance and assistance of the spring 2760 can be especially beneficial in embodiments where the center of gravity of the electronic device 2702 is positioned vertically higher than the tilt hinge 2709 (e.g., at the vertical level of joint 114 in FIG. 1C) so that the electronic device 2702 does not over-rotate due to the center of gravity passing over the tilt hinge 2709.

Figure 30:
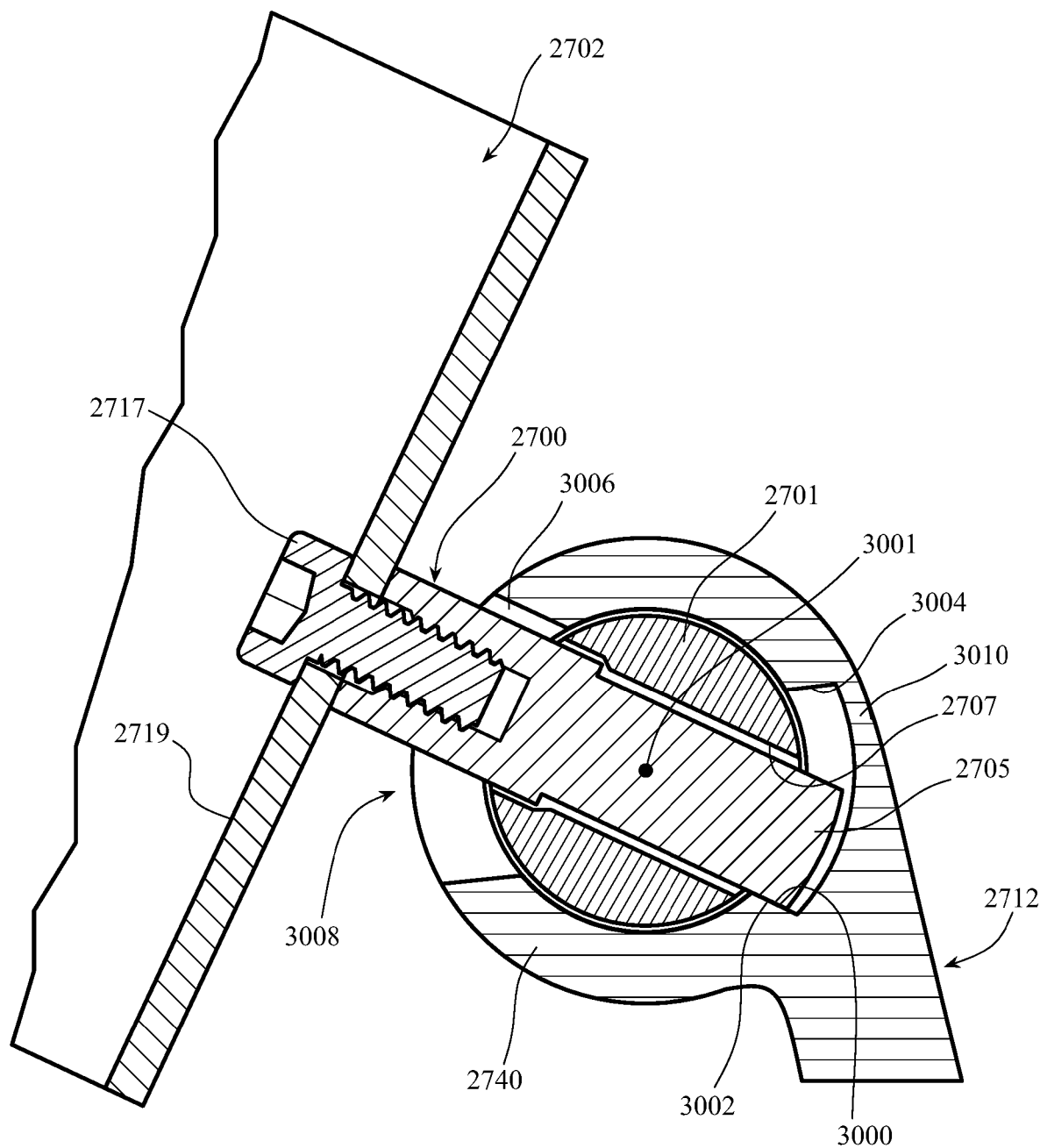
FIG. 30 shows a side section view of the tilt hinge assembly of FIG. 28 as taken through plane P and with the bar and pin rotated upward about the axis of rotation of the pin.

FIG. 30 illustrates a side section view as taken through plane P shown in FIG. 28 when the bar 2700 is fully inserted through the pin 2701 and the electronic device 2702 has its top end tilted rearward (similar to the position shown in FIG. 1B). The bar 2700 can include a protrusion 2705 insertable into an aperture 2707 in the pin 2709. The protrusion 2705 can have a length sufficient to extend through the axis of rotation 3001, to extend through the aperture 2707, and to protrude from the opposite side of the aperture 2702 relative to the flange(s) of the bar 2700 that bear(s) the set of openings 2710. This corresponds to the position of bar 800 shown in upward rotated position 1202 in FIG. 12. The view of FIG. 30 illustrates how the protrusion 2705 of the bar 2700 from the rear side of the pin 2701 can allow the bar 2700 to engage an abutment stop surface 3000 at a side surface 3002 of the bar 2700. The electronic device 2702 can rotate about the axis of rotation 3001 to make the protrusion 2705 come into contact with a second abutment stop surface 3004 above the first stop surface 3000 and on an opposite side relative to side surface 3002. Thus, the stop surfaces 3000, 3004 can define the limits of rotation of the tilt hinge 2709.

Additionally, in one or both of the extreme rotated positions, a gap 3006 or small amount of clearance can be formed between a side wall of a front opening 3008 of the outer barrel 2740 and the bar 2700. The gap 3006 can help limit wear or deformation of the surface of the bar 2700 that is visible to an end user and can help limit the amount of possible pinching of items caught between the outer barrel 2740 and the bar 2700. The outer barrel 2740 can, in some embodiments, have a rear wall 3010 that prevents intrusion of objects into the opening 3008 from the rear side of the tilt hinge 2709. In some embodiments, the rear wall 3010 can be omitted, and an opening can be formed in the rear side of the outer barrel 2740 between stop surfaces 3000, 3004, as shown representatively in FIG. 12.

It is noted that the embodiments discussed in connection with FIGS. 27-30 include features and elements that are cross-compatible and adaptable to be used in other embodiments discussed in connection with the present disclosure. For example, the tilt hinge 2709 can be used to control and support tilt in tilt joint 110, height joint 114, tilt hinge 1309, tilt hinge 1411, lift system 1500, stand 1602, stand 2502, etc. Accordingly, features discussed in connection with one embodiment can be applied and used in connection with other embodiments disclosed herein.

FIGS. 31-34 illustrate aspects of a compact tilt hinge 3100 that can beneficially be used in stand and lift structures, especially where the hinge has constrained width along its axis of rotation F. For example, a compact tilt hinge 3100 can be used in an end of a lift arm (e.g., at tilt joint 110, height joint 114, tilt hinge 1309, tilt hinge 1411, lift system 1500, stand 1602, stand 2502, etc.). The tilt hinge 3100 is shown at the front end of a lift arm 3101 in FIG. 31 connecting an electronic device 3103 to a stand 3107. The tilt hinge 3100 can be configured to fit laterally between two end blocks 3102, 3104 intersecting the axis of rotation F. A central pin 3105 (see the perspective section view of FIG. 34, taken through section lines 34-34 in FIG. 32A) can extend between the end blocks 3102, 3104 and can rotate relative to the end blocks 3102, 3104 about the axis of rotation F. In some embodiments, the central pin 3105 can be configured to remain fixed and stationary relative to the end blocks 3102, 3104. The end blocks 3102, 3104 can be portions of a four-bar linkage, such as, for example, a ends of tilt connector 1310 or a similar linkage component to which two parallel linkage arms (e.g., 1314, 1316) are pivotally connected.

A bar 3106 can be mounted/mountable to the electronic device 3103, similar to other bars described herein. The bar 3106 can also be mounted to a pair of movable blocks 3108, 3110 that are rotatable about the axis of rotation F relative to the end blocks 3102, 3104. In some embodiments, the bar 3106 and at least one of the blocks 3108, 3110 can be formed as a single piece or as a bar assembly that operates as a single piece while assembled. Thus, the bar 3106, when comprising one or more of the blocks 3108, 3110, can include a block portion that performs the functions of the one or more blocks. The end blocks 3102, 3104 can include one or more stop surfaces (e.g., 3112 in FIGS. 32A, 32B, 34) against which at least one of the movable blocks 3108, 3110 can abut to provide at least one rotation limit to the hinge 3100. FIG. 32A shows the bar 3106 in a first rotated position (aligned with a longitudinal axis of the lift arm 3101, i.e., in the position shown in FIG. 31), and FIG. 32B shows the bar 3106 at a second rotated position angularly displaced about the axis of rotation F relative to the first rotated position by about 15-25 degrees. In the second position, the stop surface 3112 engages the first block 3108.

Figure 33:
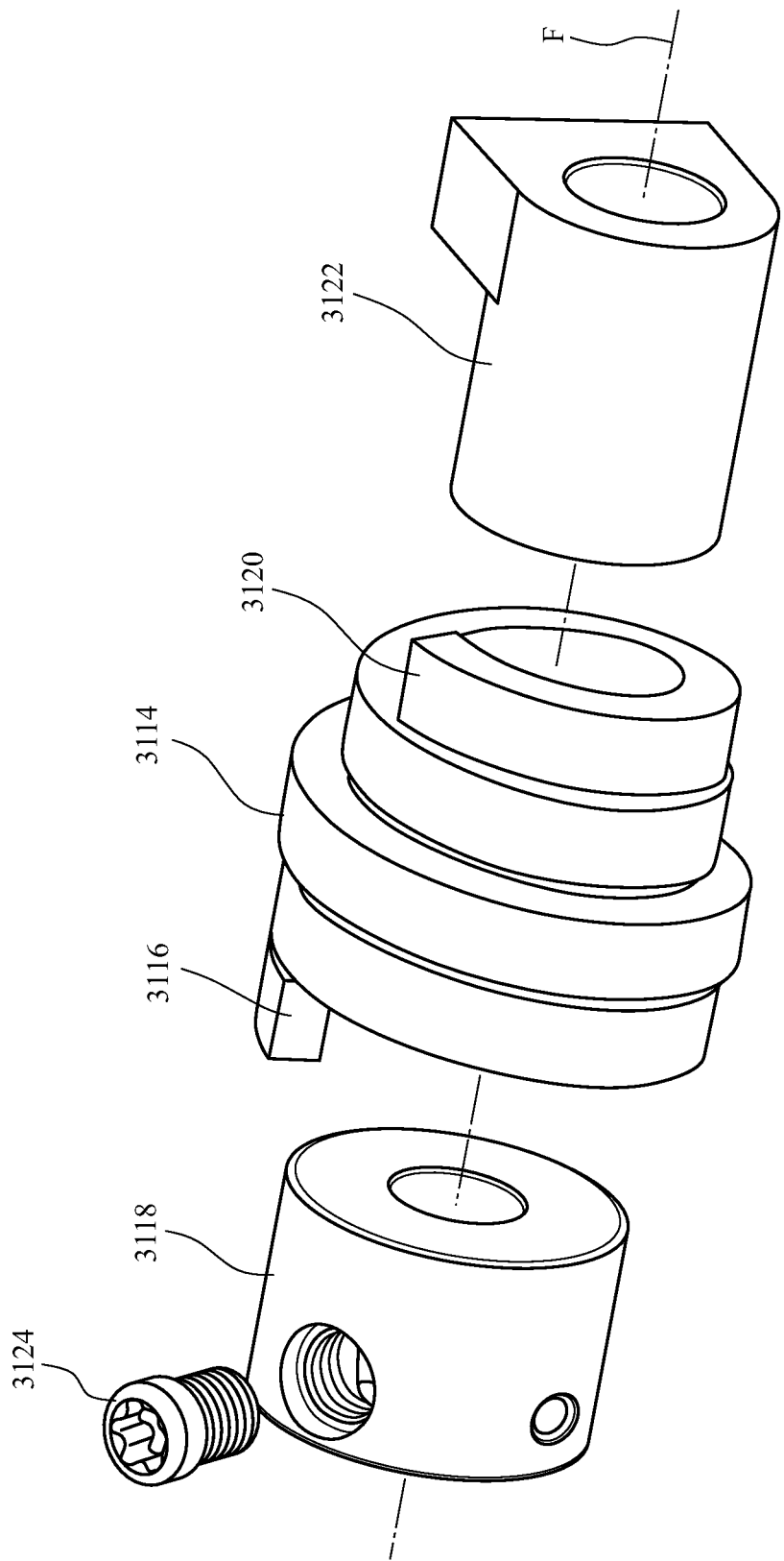
FIG. 33 shows an exploded perspective view of counterbalance assembly components of the tilt hinge of FIG. 32A.
Figure 34:
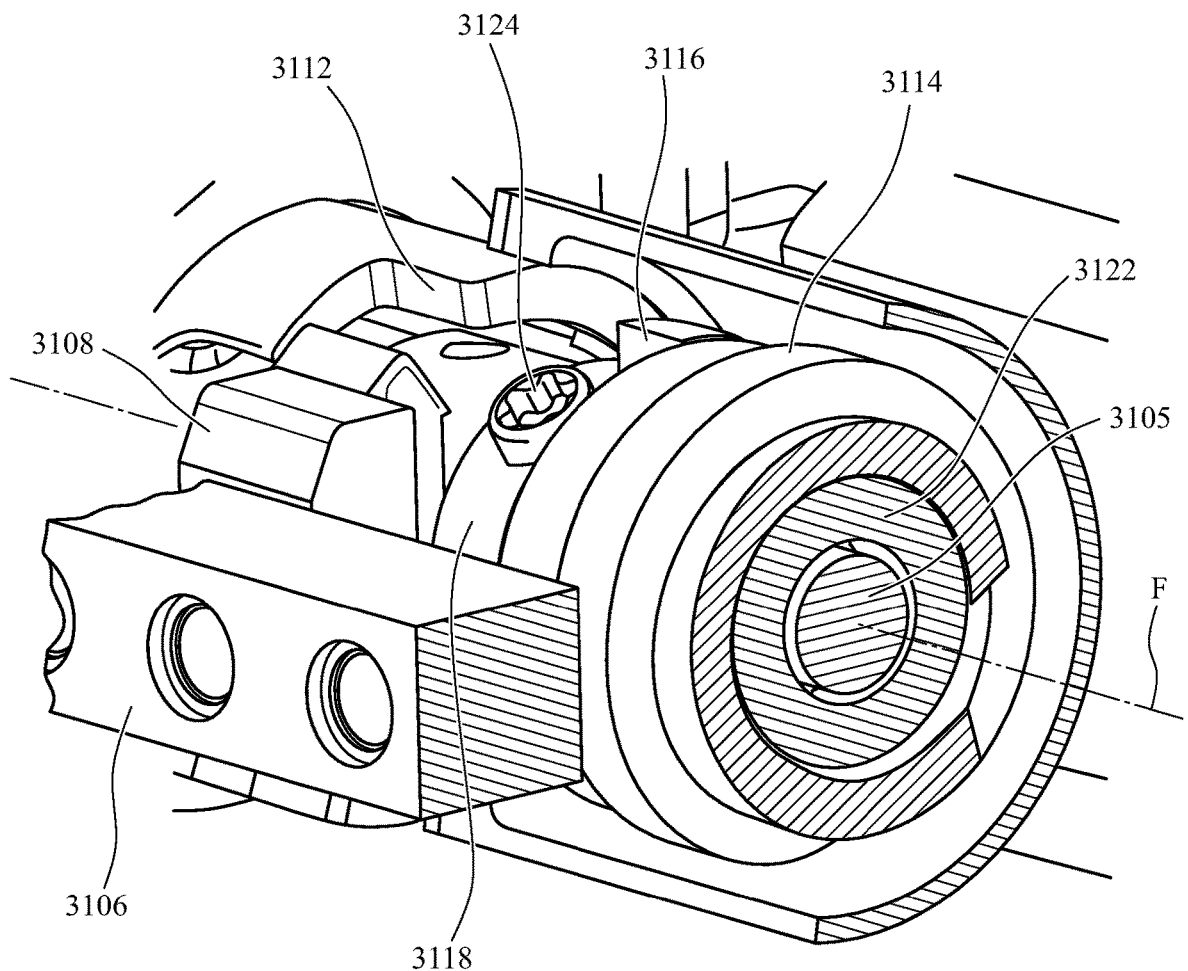
FIG. 34 shows a perspective section view of the tilt hinge as taken through section lines 34-34 in FIG. 32A.

The tilt hinge 3100 can be used to provide counterbalance forces between the electronic device 3103 and the lift arm 3101 using an energy storage device 3114 (e.g., a spring/torsion spring, set of coils, or other elastically resilient biasing member) that is coiled around the axis of rotation F and central pin 3105. The energy storage device 3114 can be configured similar to other energy storage devices discussed herein, wherein it can store and release energy to help smooth and ease rotation of the electronic device 3103 about the axis of rotation F while also helping to hold the electronic device 3103 in place once a user has moved the device to a chosen tilted position. To do so, the energy storage device 3114 includes a first end 3116 mounted to a first sleeve 3118 and a second end 3120 mounted to a second sleeve 3122. The first end 3116 can include one or more coils affixed to the first sleeve 3118 (e.g., by friction-fit, welding, adhesive, etc.), and the second end 3120 can include one or more coils affixed to the second sleeve 3122 (e.g., by friction-fit, welding, adhesive, etc.). One or both of the first and second sleeves 3118, 3120 can have an axial opening configured to receive the central pin 3105, as shown in FIGS. 33-34. In some embodiments, the first sleeve 3118 is mountable to the central pin 3105 and is rotated with the central pin 3105 about the longitudinal/tilt axis of rotation F, and in some embodiments, the first sleeve 3118 is mountable to the first block 3108 and does not necessarily have its rotation synchronized with central pin 3105 about axis F. The second sleeve 3122 can be an arm block which may not have a central opening, such as by being an integral part of (or permanently mounted to) an end block (e.g., 3102, 3104) or otherwise having its motion synchronized and static relative to the end block(s) as the joint is operated. The second sleeve 3122 can be integrally formed as part of an arm block or arm block assembly that is or acts as a single piece with one or more of the end blocks 3102, 3104 and any intervening blocks that connect them to each other.

The counterbalance assembly components are shown in the exploded view of FIG. 33. The first end 3116 and second end 3120 can have different inner diameters to accommodate engaging different-sized outer diameters of the first sleeve 3118 and second sleeve 3122. The second sleeve 3122 can be attached to the lift arm in a manner that remains stationary relative to the end blocks 3102, 3104. Thus, rotation of the bar 3106 rotates first block 3108, the central pin 3105, and the first sleeve 3118 about the axis of rotation F relative to the second sleeve 3122 and the two end blocks 3102, 3104. This relative rotation of the sleeves 3118, 3120 stores or releases energy from the energy storage device 3114 to counterbalance the movement of the electronic device 3103 relative to the lift arm 3101. FIGS. 32A-32B show how the parts move relative to each other and relative to the axis of rotation F.

The first sleeve 3118 can include set screw 3124, other fastener, or similar removable or adjustable clamping device to adjustably affix the first sleeve 3118 to the first block 3108 and/or the central pin 3105. The set screw 3124 can be used to tune and adjust the neutral position for the energy storage device 3114, which can be particularly beneficial in embodiments where the center of gravity of the electronic device 3103 moves from one side (e.g., the front side) to an opposite side (e.g., the rear side) of the axis of rotation F of the tilt hinge 3100.

Figure 31:
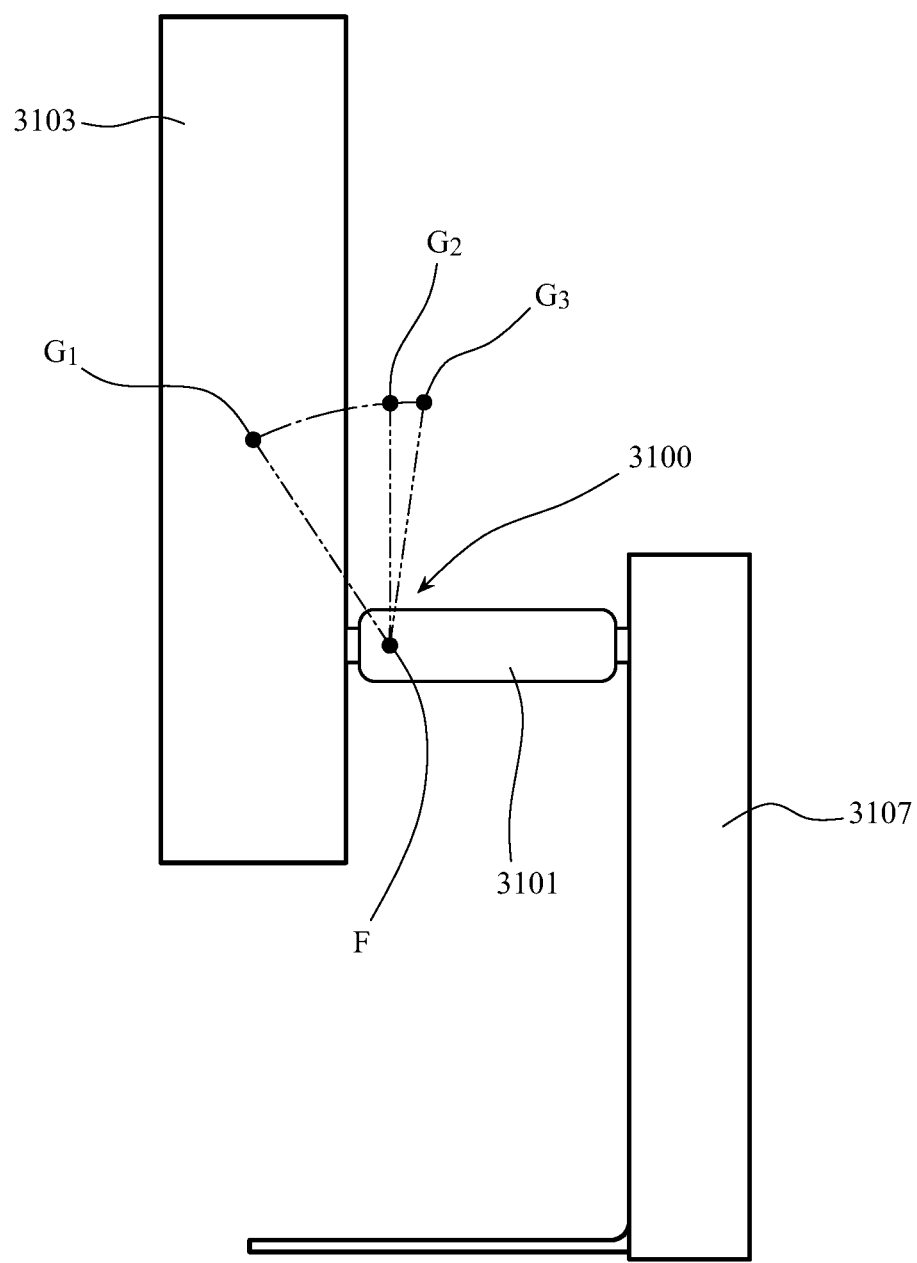
FIG. 31 is a schematic side view of an electronic device, lift arm, and stand.
Figure 32A:
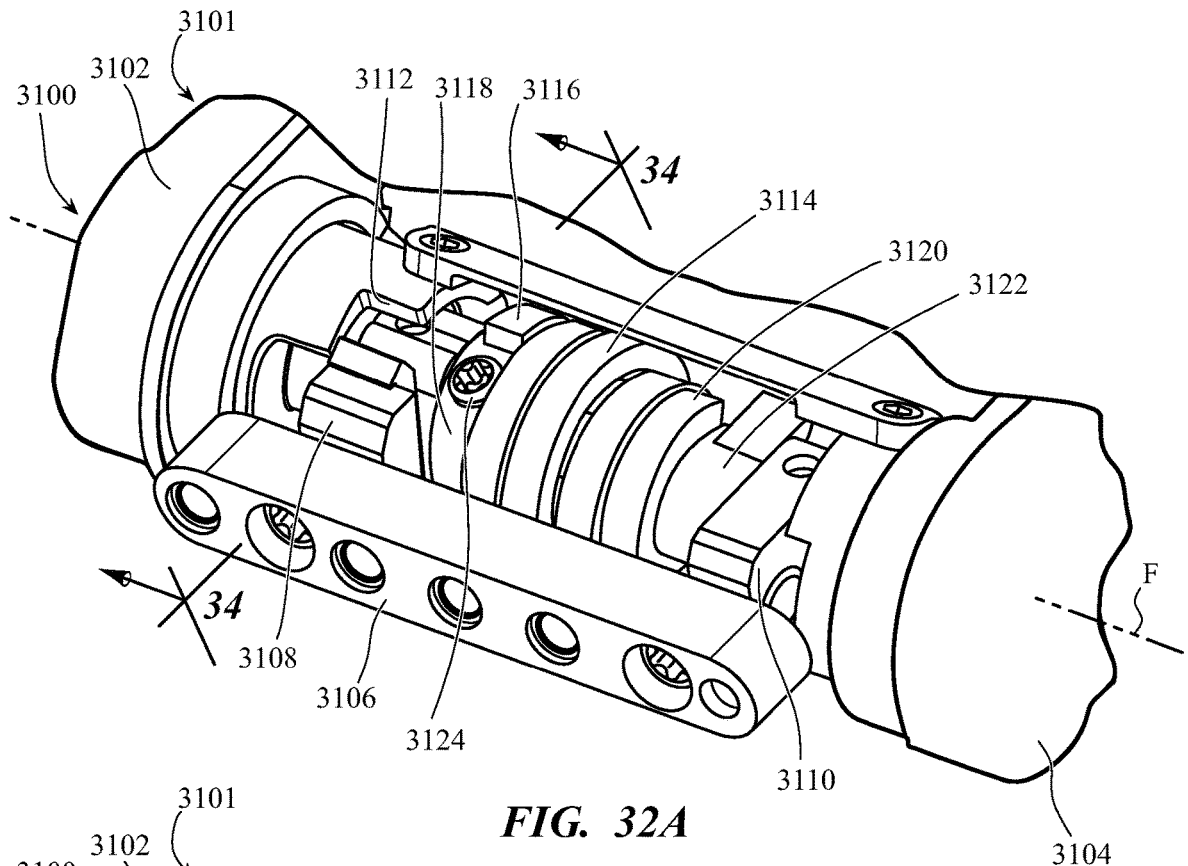
FIG. 32A shows a perspective view of an end of a lift arm at a tilt hinge with the bar in a first rotated position.
Figure 32B:
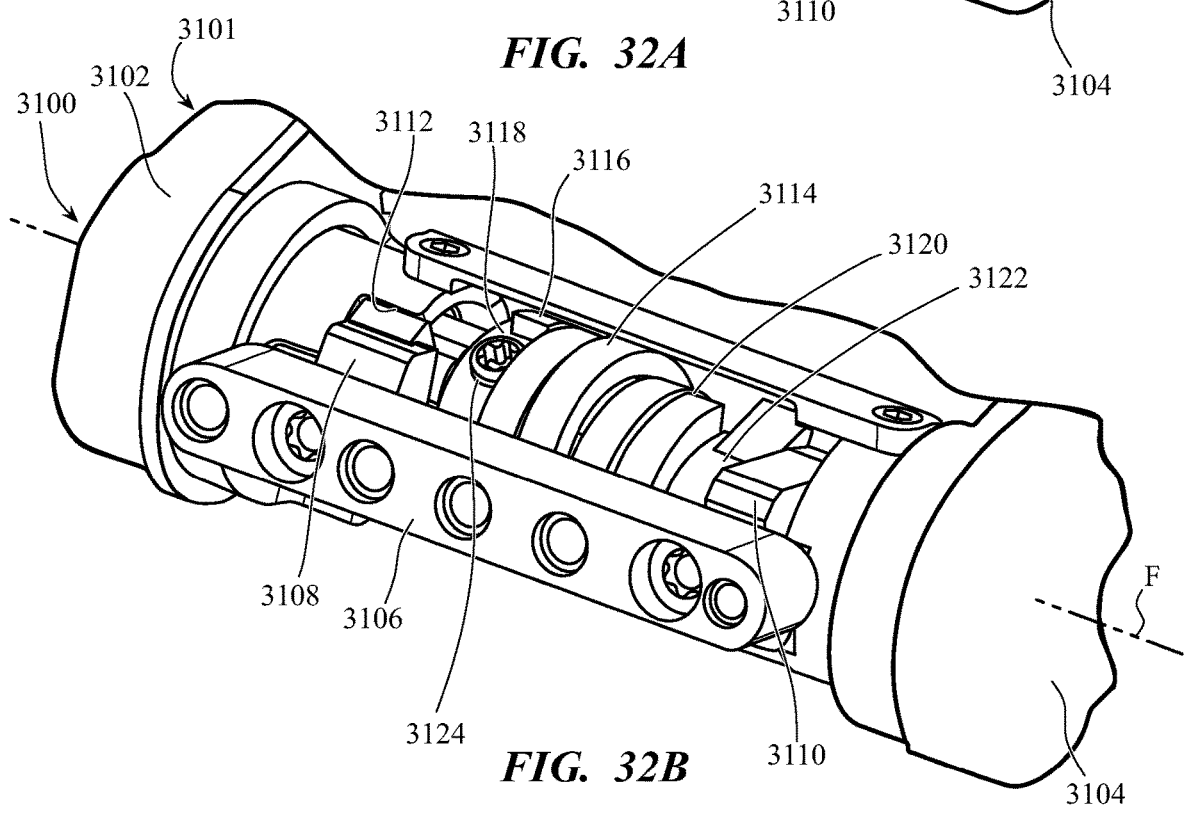
FIG. 32B shows a perspective view of the end of the lift arm of FIG. 32A with the bar in a second rotated position.

For example, as shown in FIG. 31, the electronic device 3103 can have a center of gravity $G_1$ on a front side of the axis of rotation F when the device 3103 is in a first position. The electronic device 3103 can be tilted rearward about the axis F so that the center of gravity moves to point $G_2$ (directly over axis F) or to point $G_3$ (to the rear of axis F). While the electronic device 3103 is on the front side of the axis F and with the center of gravity at $G_1$, the counterbalance energy storage device 3114 needs to provide a moment in a first direction that supports the weight of the electronic device (e.g., a clockwise moment as viewed from the angle of FIG. 31). When the center of gravity moves to point $G_2$, the counterbalance assembly does not need to apply any moment since the weight of the electronic device 3103 is centered over the axis F. When the center of gravity moves to point $G_3$, the counterbalance assembly needs to apply a moment in a second direction (e.g., a counterclockwise moment as viewed from the angle of FIG. 31) to prevent the electronic device 3103 from automatically continuing to rotate into contact with the stand 3107. Accordingly, the energy storage device 3114 needs to provide a first counterbalance moment in a first direction when the electronic device 3103 is in a first position (corresponding to $G_1$), needs to provide no moment when the electronic device 3103 is in a second position (corresponding to $G_2$), and a second counterbalance moment in a second direction when the electronic device 3103 is in a third position (corresponding to $G_3$).

Due to manufacturing tolerances, assembly variations, and similar variance in the construction and assembly of the electronic device 3103, stand 3107, lift arm 3101, and tilt hinge 3100, the neutral angle for the tilt hinge 3100 (based on the neutral position of the energy storage device 3114) can undesirably vary. Thus, the first sleeve 3118 and set screw 3124 can enable the adjustment of the neutral position of the energy storage device 3114 during or after assembly of the tilt hinge 3100, and the finished product can have an exactly tuned (or, if needed, an adjustably tunable) neutral angle that does not cause the electronic device 3103 to be biased to drift away from user-selected positioning.

Accordingly, one aspect of the disclosure relates to a method for constructing or assembling a tilt hinge, wherein the tilt hinge 3100 is assembled with the set screw 3124 loose, then the electronic device 3103 is moved to a position with its center of gravity $G_2$ over the axis of rotation F (or wherever the neutral angle of the energy storage device 3114 needs to be positioned), then the set screw 3124 is secured in place to fix the neutral angle of the energy storage device 3114 from then onward to the position tuned to the correct moment-transition position of the electronic device 3103 that accounts for any variance in weight, size, shape, etc. of the electronic device 3103 or the parts of the tilt hinge 3100.

Furthermore, precisely configuring the position of $G_2$ with the neutral angle of the energy storage device 3114 can eliminate wobbles, shudders, or jumps caused by the energy storage device 3114 irregularly transitioning through its zero-moment neutral position, thereby improving the smoothness of the tilt hinge 3100 and the movement of the electronic device 3103. Additionally, wobble and irregular movement of the electronic device at the tilt hinge can be caused by loosening of the coils of an energy storage device when it approaches or reaches its neutral position. The grip of the coils on the shaft of the hinge components (e.g., grip of the ends of energy storage device 2760 on the pin 2701 and bushing 2752) can at least partially loosen and unsteadily change the amount of torque applied to the hinge by the energy storage device or can provide a dead zone of lower than desired torque for a portion of the range of motion of the tilt hinge. Thus, in some embodiments, the ends of the coils of the energy storage device (e.g., ends 3116 and 3120 of device 3114) can be welded or otherwise permanently affixed to the structures to which the energy storage device is configured to apply torque. For that reason, the energy storage device can have a torque profile that steadily, continuously, and predictably transitions between one direction (e.g., clockwise), through zero torque (momentarily), to a second, opposite direction (e.g., counterclockwise). The smoothness and continuity of the torque profile transition can prevent jerking or dead zones in the motion of the tilt hinge 3100.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A connection assembly for joining an electronic device to a support structure, the connection assembly comprising:
    an electronic device including an enclosure, a bar rotatably connected to the enclosure, and a lock pivotable relative to the enclosure and relative to the bar, the enclosure having an opening, the bar having a lock recess; and
    a support structure having a shaft insertable into the opening and attachable to the bar at an attachment interface;
    wherein with the lock positioned in the lock recess of the bar, the bar is prevented from pivoting relative to the enclosure; and
    wherein, in response to insertion of a probe into a gap between the opening of the enclosure and the shaft or bar, the support structure is disassembleable from the electronic device, with the lock being removed from the lock recess of the bar and the bar being pivotable relative to the enclosure to a position exposing the attachment interface through the opening of the enclosure.

2. The connection assembly of claim 1, wherein the shaft is selectively removable from the bar when the bar is in the position exposing the attachment interface through the opening of the enclosure.

3. The connection assembly of claim 1, wherein the attachment interface comprises a fastener joining the shaft to the bar, wherein the fastener is removable in response to exposing the attachment interface through the opening of the enclosure.

4. The connection assembly of claim 1, wherein the lock is configured to automatically lock the bar upon pivoting the attachment interface into the enclosure relative to the opening.

5. The connection assembly of claim 1, wherein a first axis of rotation of the bar and a second axis of rotation of the lock are parallel to each other.

6. A connection assembly for joining an electronic device to a support structure, the connection assembly comprising:
    an electronic device including an enclosure, a bar movably connected to the enclosure, and a lock, the bar defining a lock recess and configured to receive the lock at a lock recess, the enclosure including an opening; and a support structure having a protrusion, the protrusion insertable into the opening and attachable to the bar at an attachment interface;

wherein with the lock positioned in the lock recess, the attachment interface is disposed within the enclosure; and wherein, in response to a probe being inserted into a gap between the opening of the enclosure and the protrusion or bar, the lock is removed from the lock recess, and the attachment interface is disassembleable from the enclosure.

7. The connection assembly of claim 6, wherein lock is prevented from entering the lock recess in response to a probe being inserted into the opening in the shell.

8. The connection assembly of claim 6, wherein the bar is biased to rotate toward a position exposing the attachment interface through the opening of the shell.

9. The connection assembly of claim 6, wherein the lock includes a biasing device configured to bias the lock toward the lock recess of the bar.

\* \* \* \* \*